US012568704B2

(12) United States Patent
Machida

(10) Patent No.: US 12,568,704 B2
(45) Date of Patent: Mar. 3, 2026

(54) IMAGING DEVICE AND ELECTRONIC APPARATUS INCLUDING LIGHT CONDENSING OPTICAL SYSTEM FOR REDUCING PARASITIC LIGHT SENSITIVITY

(71) Applicant: SONY SEMICONDUCTOR SOLUTIONS CORPORATION, Kanagawa (JP)

(72) Inventor: Takashi Machida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 358 days.

(21) Appl. No.: 17/756,811

(22) PCT Filed: Dec. 5, 2020

(86) PCT No.: PCT/JP2020/045356
§ 371 (c)(1),
(2) Date: Jun. 2, 2022

(87) PCT Pub. No.: WO2021/117648
PCT Pub. Date: Jun. 17, 2021

(65) Prior Publication Data
US 2022/0415948 A1 Dec. 29, 2022

(30) Foreign Application Priority Data

Dec. 13, 2019 (JP) ................................ 2019-225188

(51) Int. Cl.
*H10F 39/00* (2025.01)
*H04N 25/70* (2023.01)
(Continued)

(52) U.S. Cl.
CPC ......... *H10F 39/8057* (2025.01); *H04N 25/70* (2023.01); *H04N 25/77* (2023.01);
(Continued)

(58) Field of Classification Search
CPC ......... H01L 27/14627; H01L 27/14623; H01L 27/14603; H01L 27/14649;
(Continued)

(56) References Cited

U.S. PATENT DOCUMENTS 7,522,341 B2 * 4/2009 Mouli .................. H04N 25/134
359/619
10,432,883 B1 * 10/2019 Chapman ............ H10F 39/8057
(Continued)

FOREIGN PATENT DOCUMENTS

CN 109309103 A 2/2019
CN 110313067 A 10/2019
(Continued)

OTHER PUBLICATIONS

International Search Report and Written Opinion of PCT Application No. PCT/JP2020/045356, issued on Mar. 9, 2021, 09 pages of ISRWO.

*Primary Examiner* — Georgia Y Epps
*Assistant Examiner* — Erin R Garber
(74) *Attorney, Agent, or Firm* — CHIP LAW GROUP

(57) ABSTRACT

Provided is an imaging device that includes, in an effective pixel region extending along a first surface, a condensing optical system that condenses incident light, a photoelectric conversion unit that generates electric charge through photoelectric conversion, an electric charge holding unit that holds the electric charge transferred from the photoelectric conversion unit, and a first light shielding film that is provided between the photoelectric conversion unit and the electric charge holding unit in a thickness direction orthogo-
(Continued)

nal to the first surface. The electric charge corresponds to an amount of the incident light passing through the condensing optical system. The first light shielding film blocks the incident light. Here, the condensing optical system condenses the incident light at a position in the effective pixel region. The position overlaps with the first light shielding film in the thickness direction.

14 Claims, 73 Drawing Sheets

(51) Int. Cl.
*H04N 25/77* (2023.01)
*H10F 39/12* (2025.01)
*H10F 39/18* (2025.01)
(52) U.S. Cl.
CPC ....... *H10F 39/806* (2025.01); *H10F 39/8063* (2025.01); *H10F 39/184* (2025.01); *H10F 39/199* (2025.01); *H10F 39/802* (2025.01); *H10F 39/811* (2025.01)
(58) Field of Classification Search
CPC ......... H01L 27/14605; H01L 27/14607; H01L 27/14636; H01L 27/1463; H01L 27/14634; H01L 27/1464; H01L 27/14625; H04N 25/79; H04N 25/70; H04N 25/77; H10F 39/8063; H10F 39/8057; H10F 39/184; H10F 39/802; H10F 39/811; H10F 39/199; H10F 39/8023; H10F 39/8027; H10F 39/807; H10F 39/809; H10F 39/806
See application file for complete search history.

(56) References Cited

U.S. PATENT DOCUMENTS

| | | | |
|---|---|---|---|
| 10,741,593 B1 * | 8/2020 | Mabuchi .............. | H04N 25/771 |
| 2006/0033131 A1 | 2/2006 | Kim | |
| 2014/0091378 A1 * | 4/2014 | Hashimoto ........... | H10F 39/803 |
| | | | 257/294 |
| 2018/0033809 A1 * | 2/2018 | Tayanaka ............ | H01L 27/0248 |
| 2019/0006403 A1 * | 1/2019 | Ikeda ...................... | H04N 25/76 |
| 2019/0088701 A1 * | 3/2019 | Mizuta ................. | H10F 39/807 |
| 2019/0148434 A1 * | 5/2019 | Hsu ................... | H01L 27/14629 |
| | | | 257/432 |
| 2019/0157330 A1 * | 5/2019 | Sato ........................ | H10F 39/18 |
| 2019/0222786 A1 | 7/2019 | Kobayashi | |
| 2019/0296070 A1 * | 9/2019 | Jin .................... | H01L 27/14643 |
| 2020/0105816 A1 * | 4/2020 | Chung .................. | H04N 25/59 |

FOREIGN PATENT DOCUMENTS

| | | | |
|---|---|---|---|
| CN | 114731380 A | | 7/2022 |
| EP | 4075793 A1 | | 10/2022 |
| JP | 2006-054414 A | | 2/2006 |
| JP | 2007158109 A | * | 6/2007 |
| JP | 2013098446 A | | 5/2013 |
| JP | 2014229810 A | | 12/2014 |
| JP | 2019097058 A | | 6/2019 |
| TW | 201946261 A | | 12/2019 |
| WO | 2016/136486 A1 | | 9/2016 |

* cited by examiner

[FIG. 1]
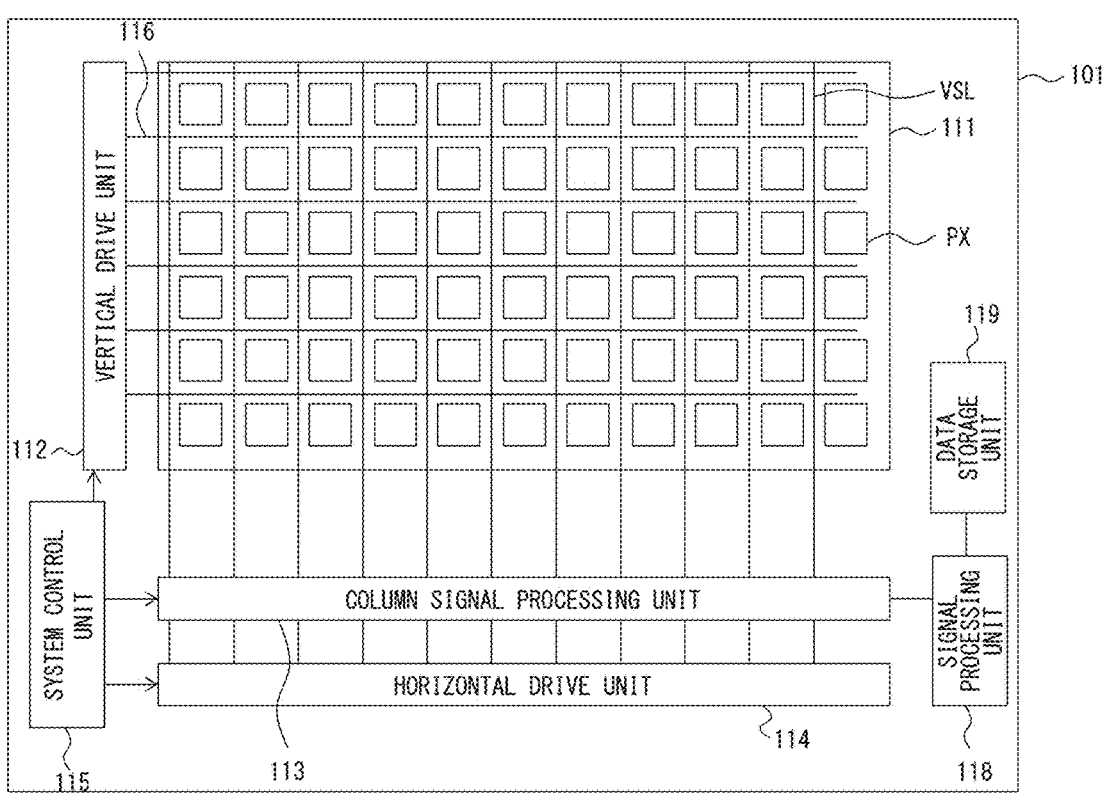

[FIG. 2]
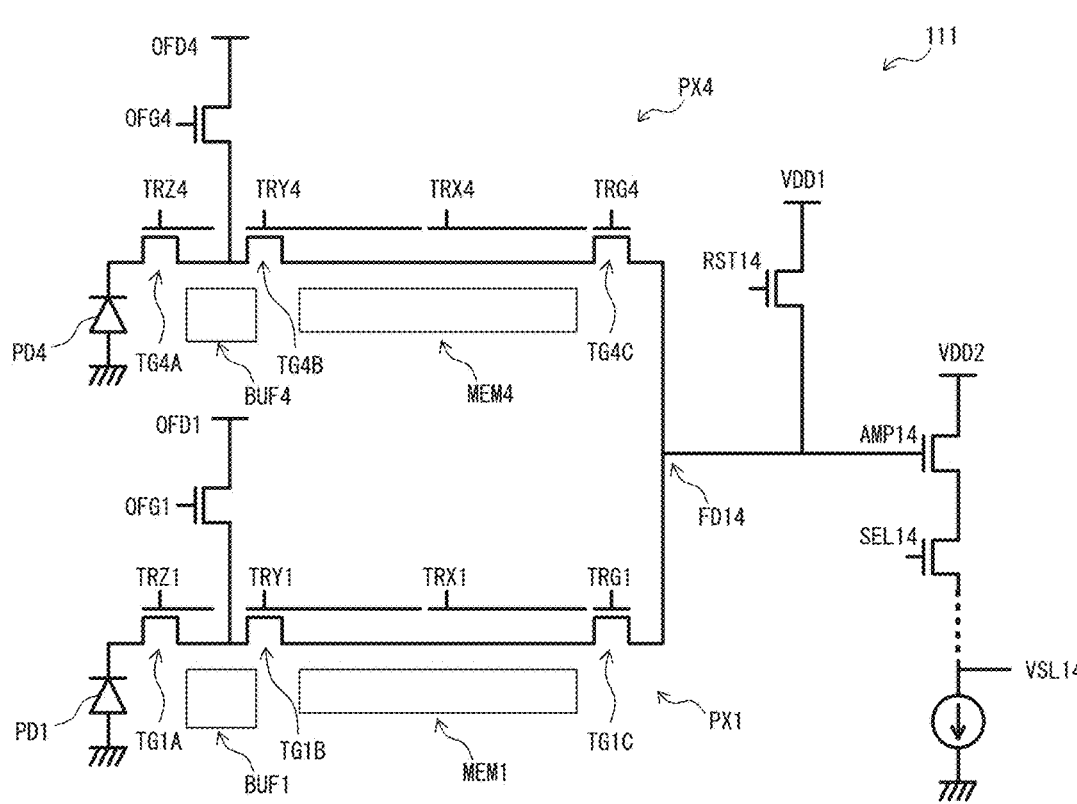

[FIG. 3A]
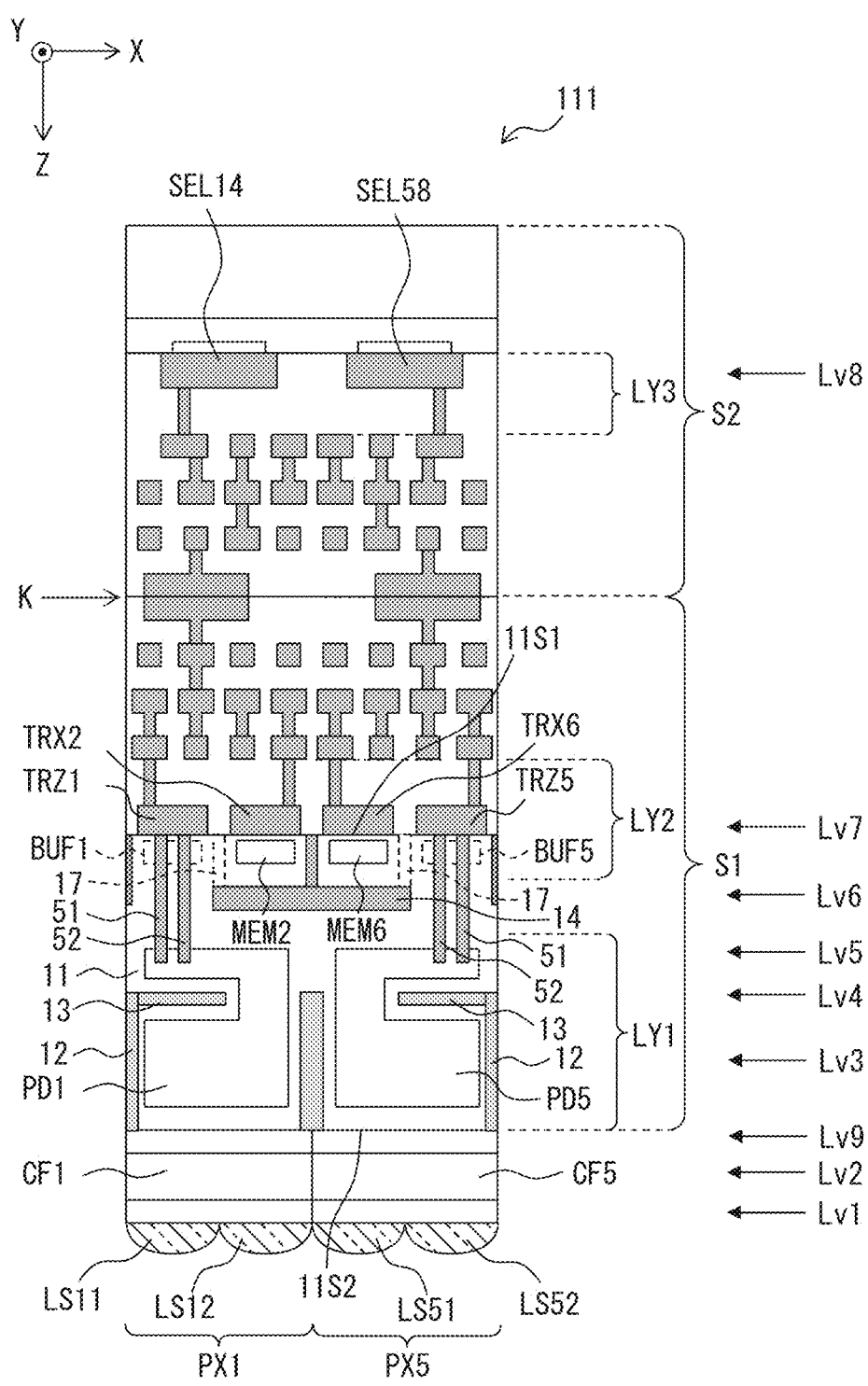

[FIG. 3B]
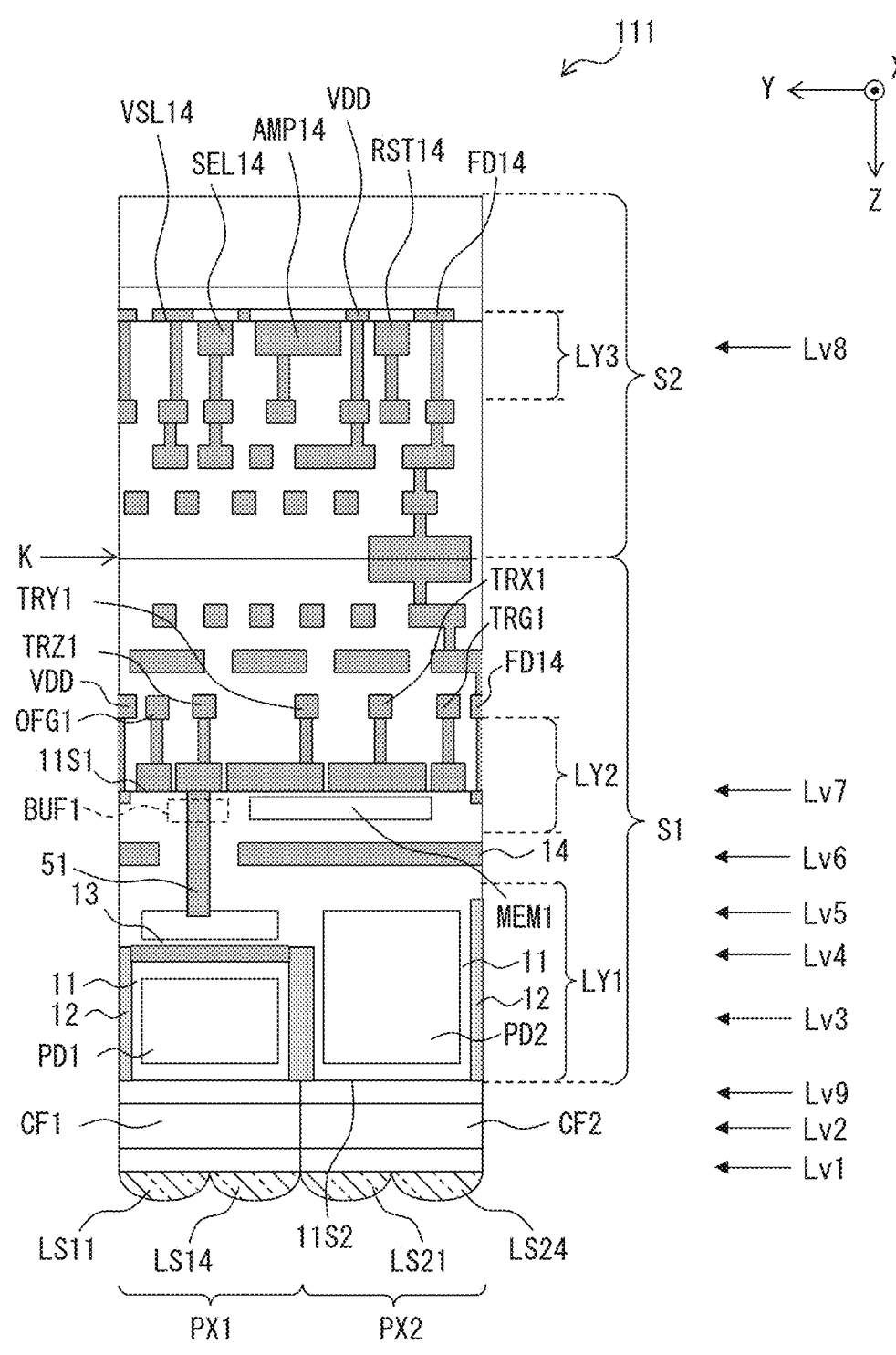

[FIG. 4A]
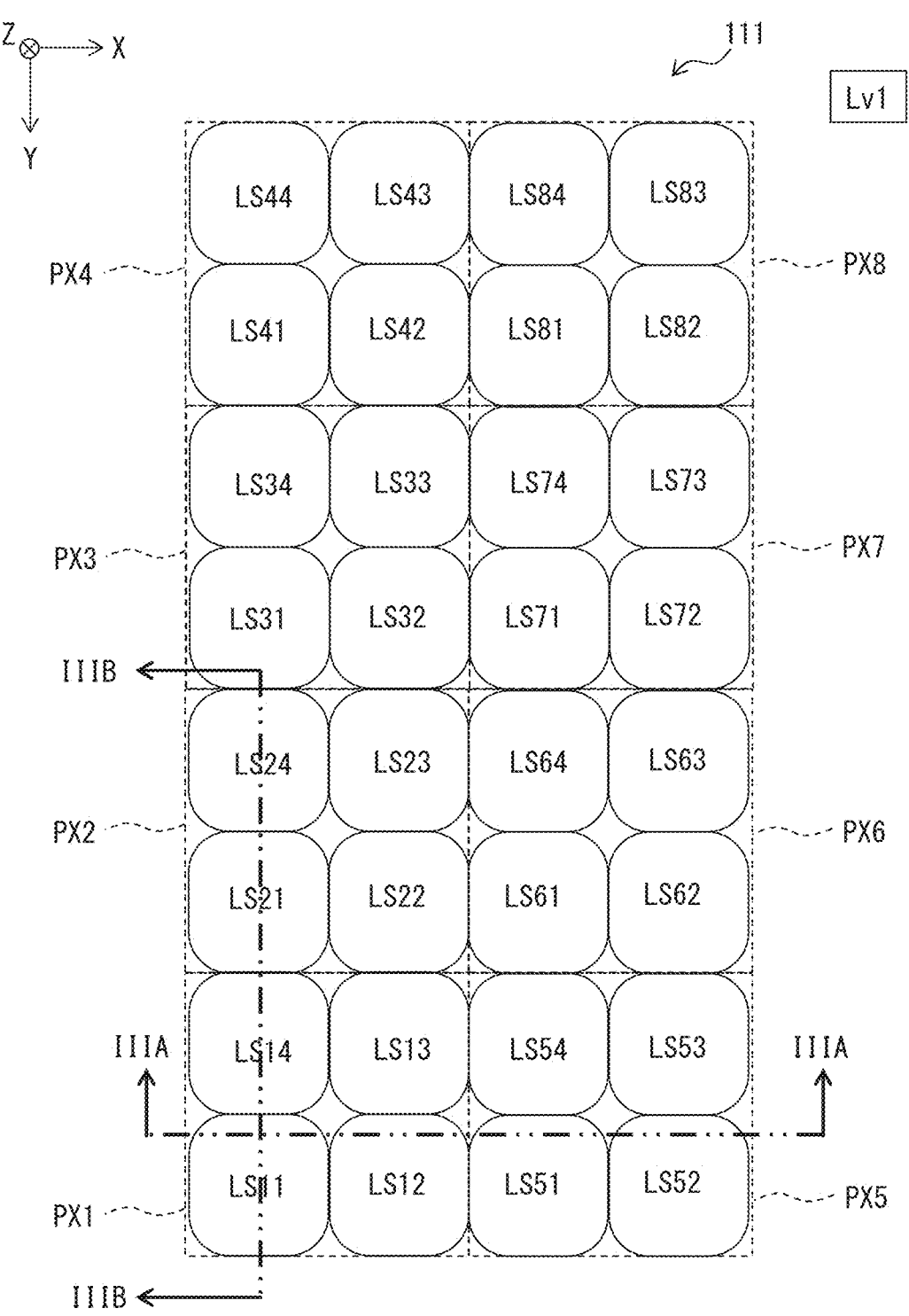

[FIG. 4B]
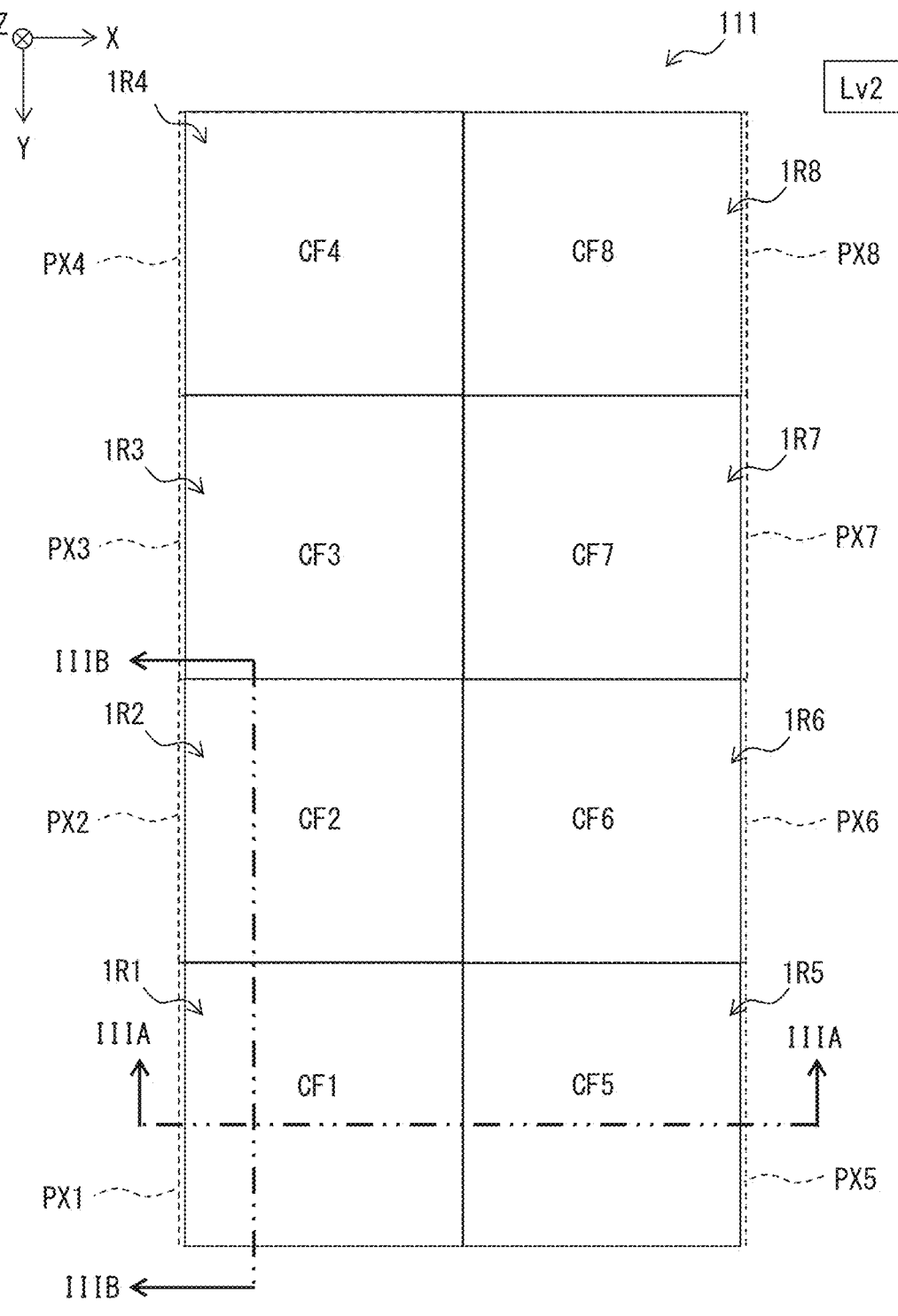

[FIG. 4C]
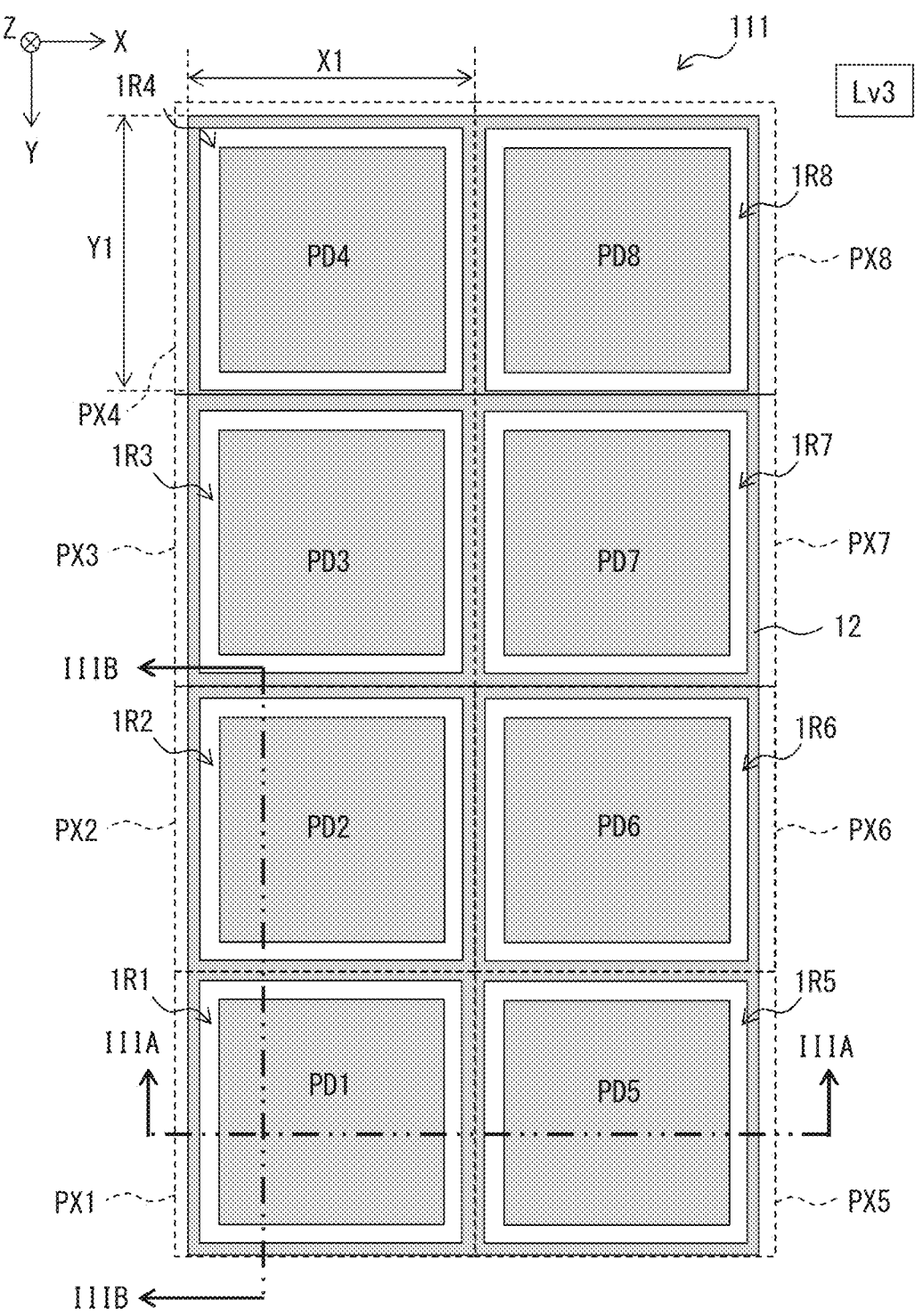

[FIG. 4D]
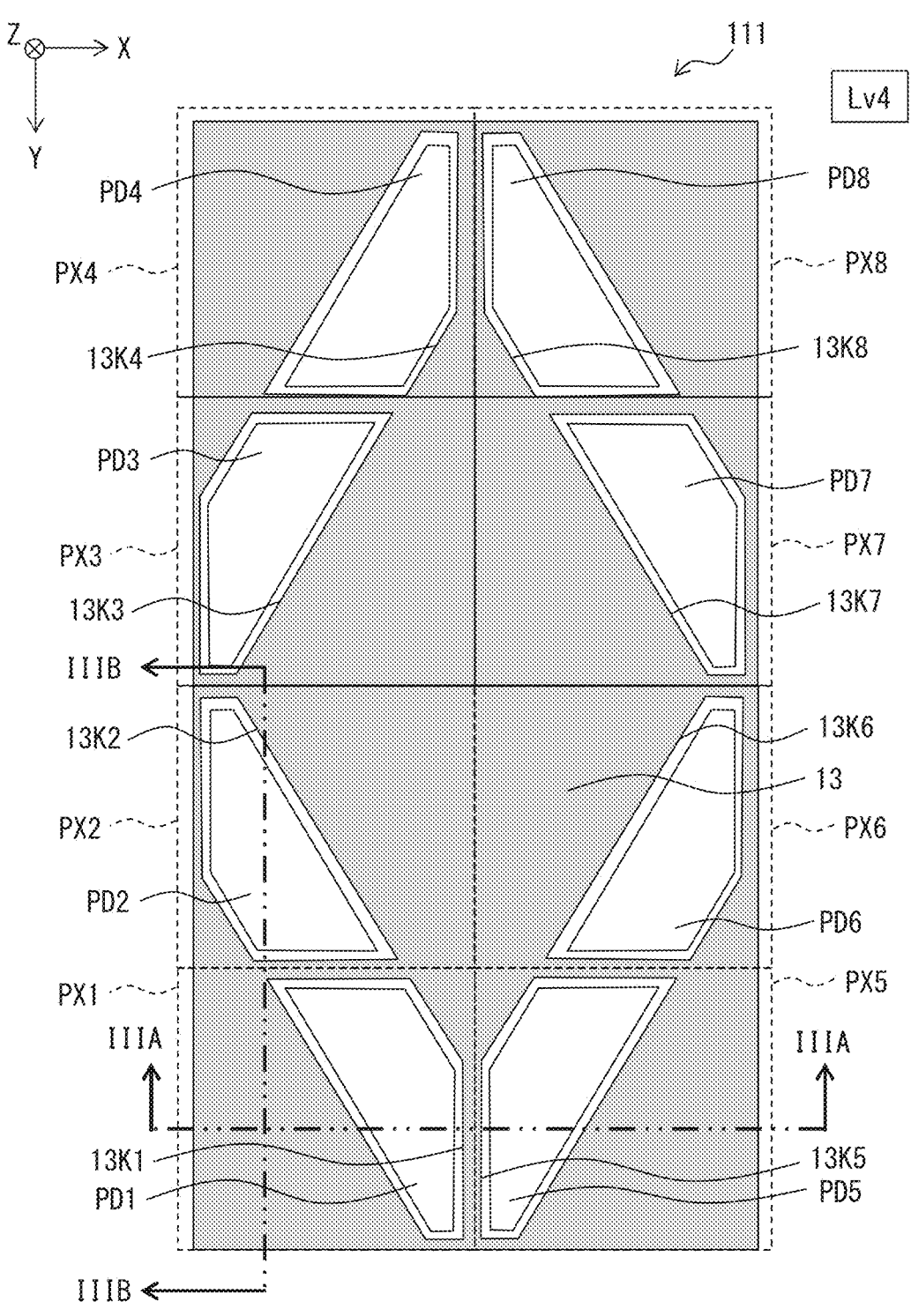

[FIG. 4E]
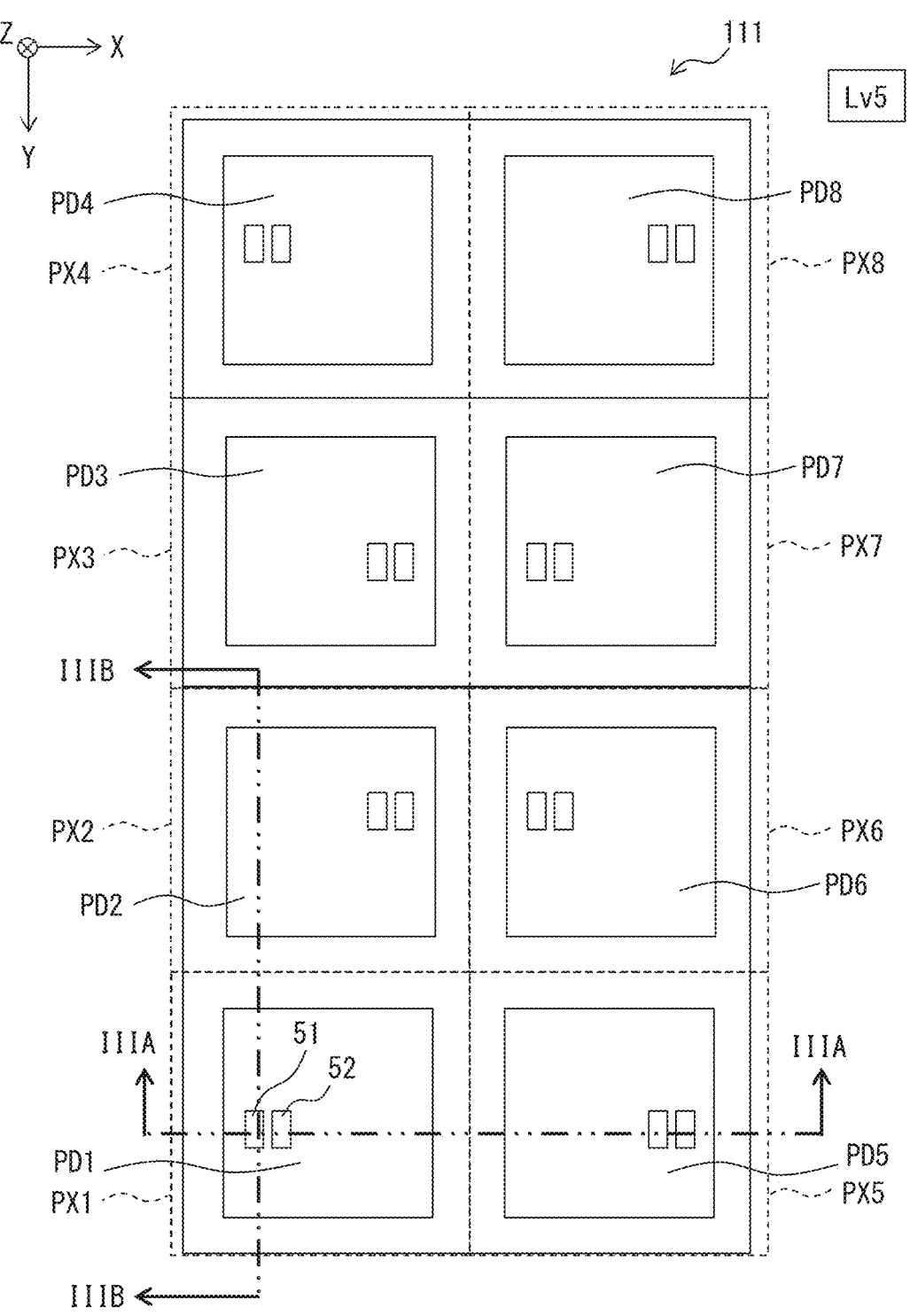

[FIG. 4F]
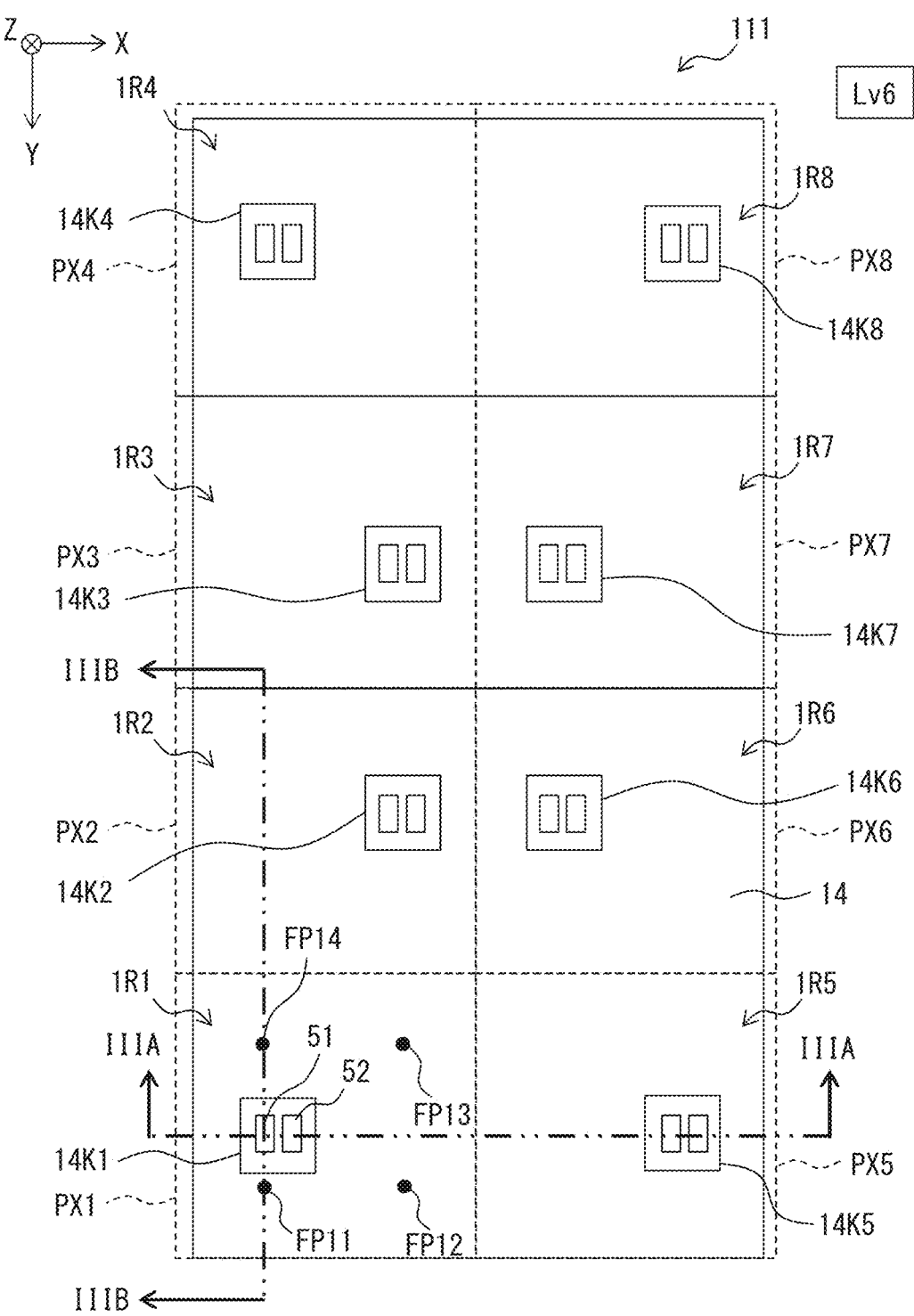

[FIG. 4G]
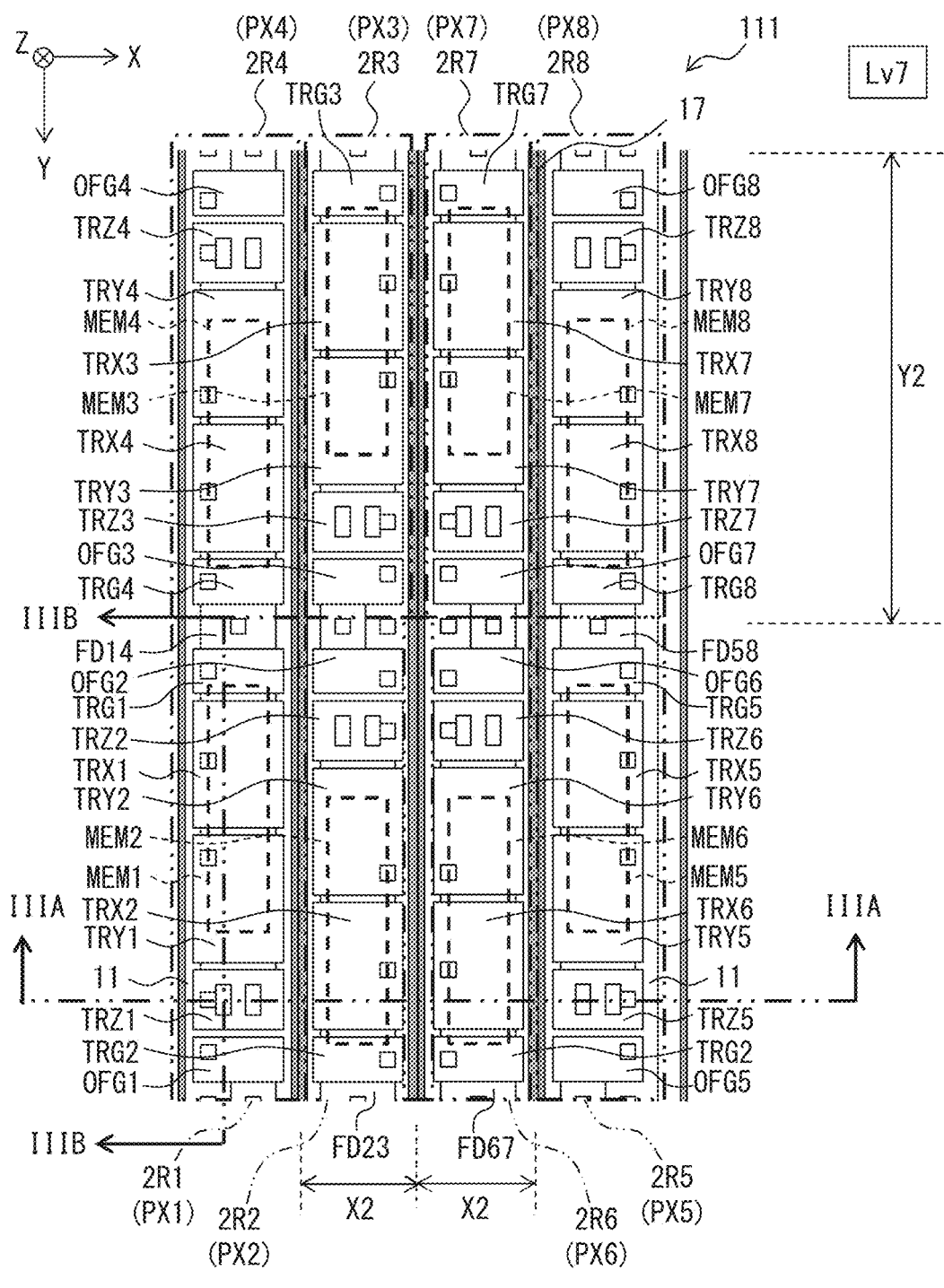

[FIG. 4H]
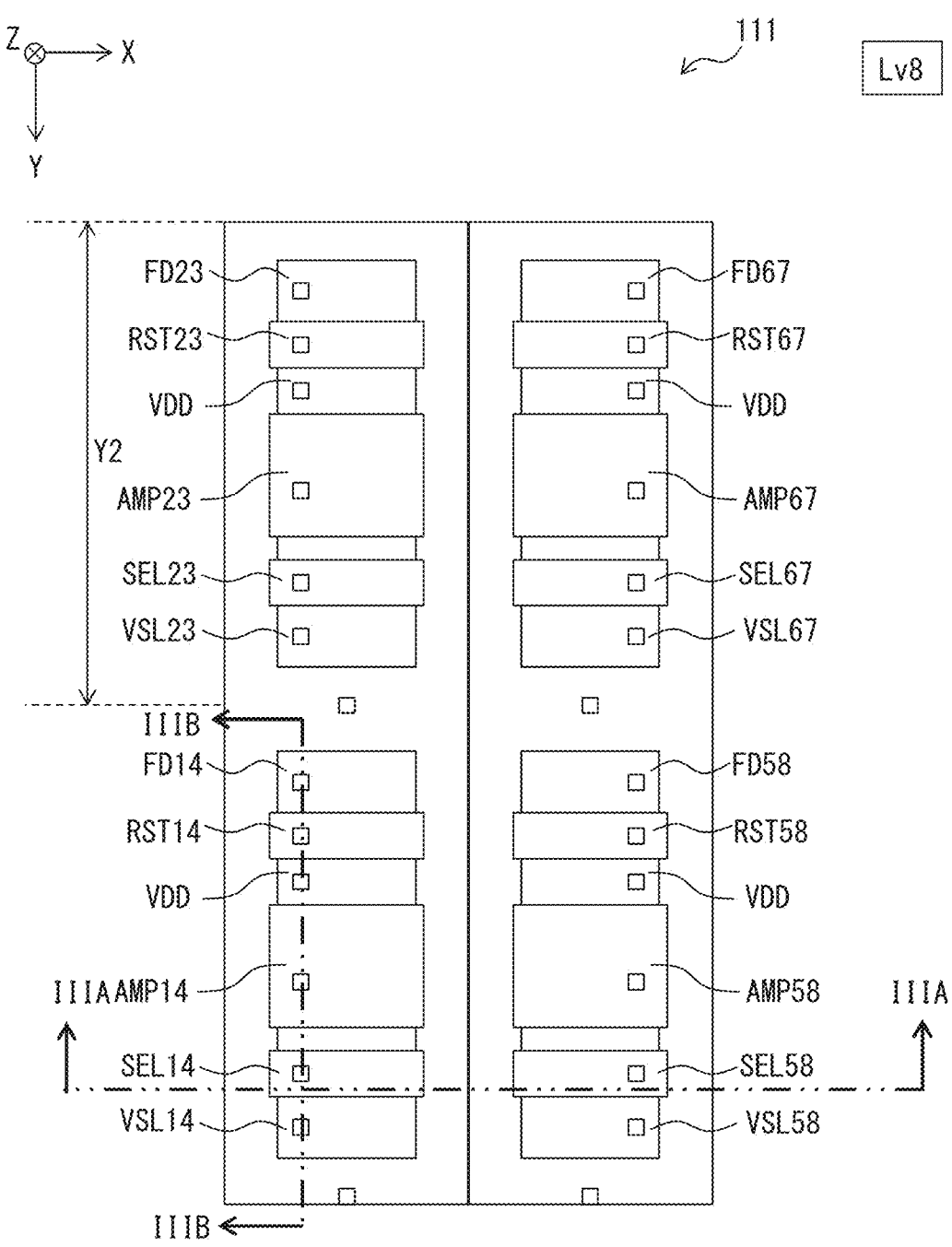

[FIG. 5A]
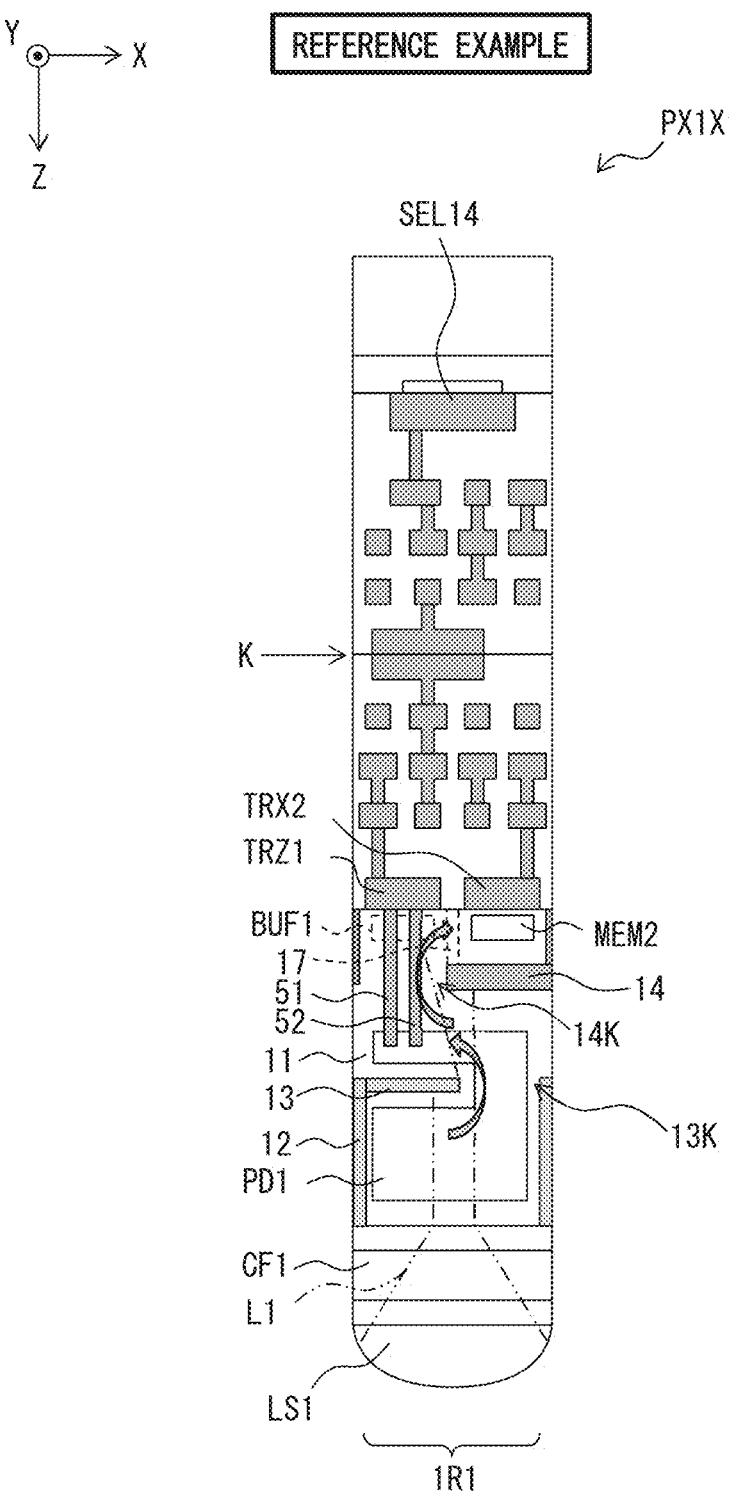

[FIG. 5B]
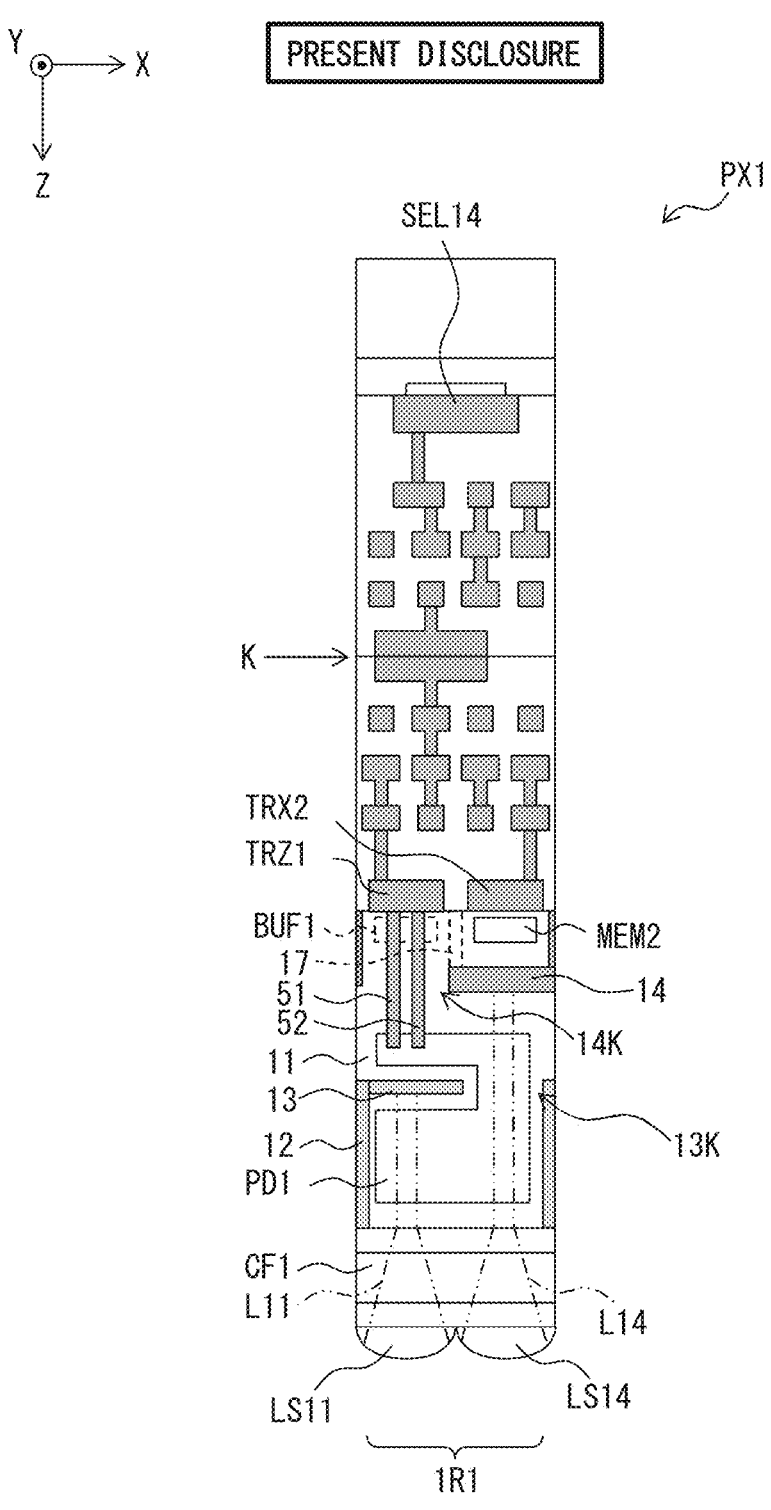

[FIG. 6A]
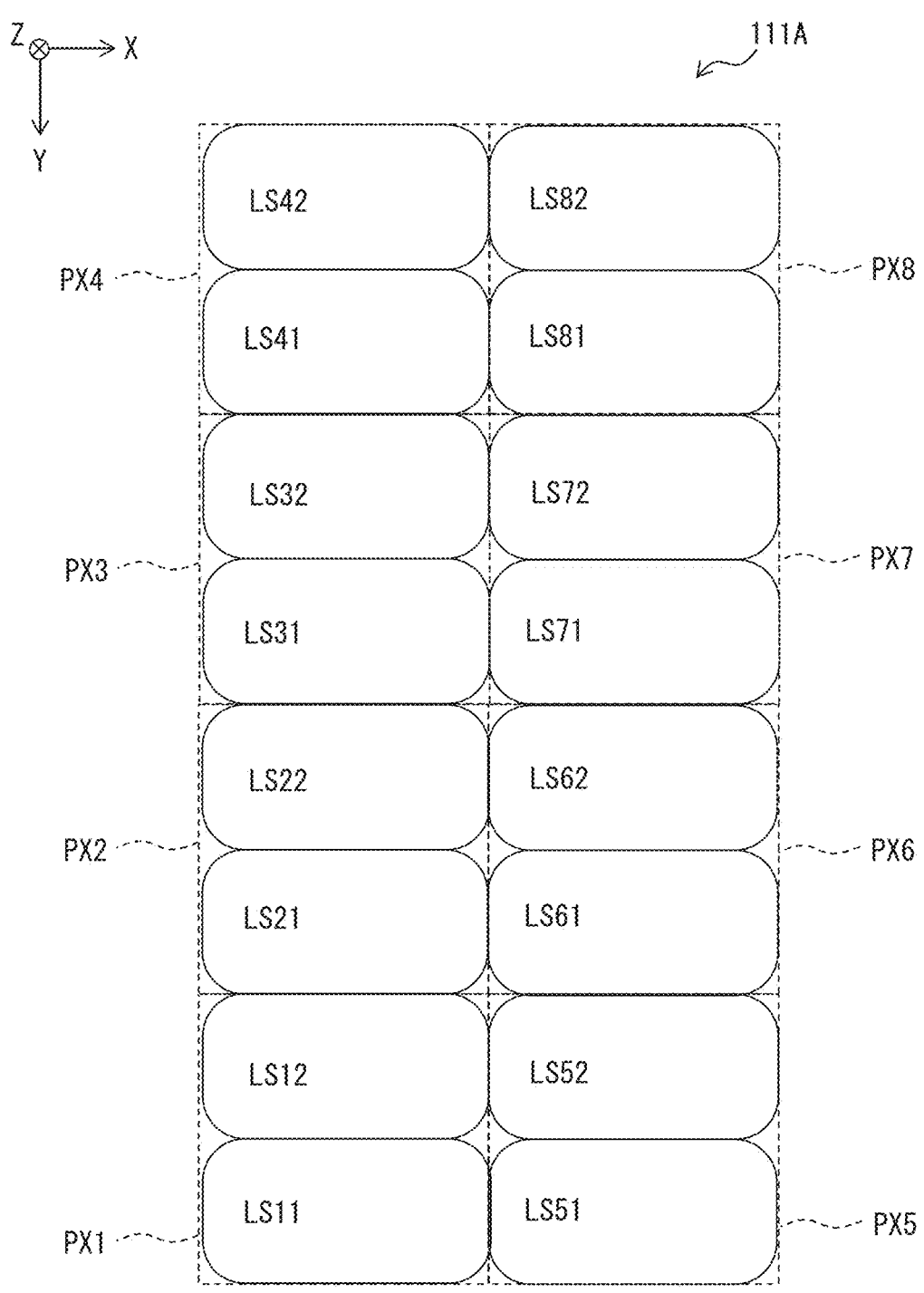

[FIG. 6B]
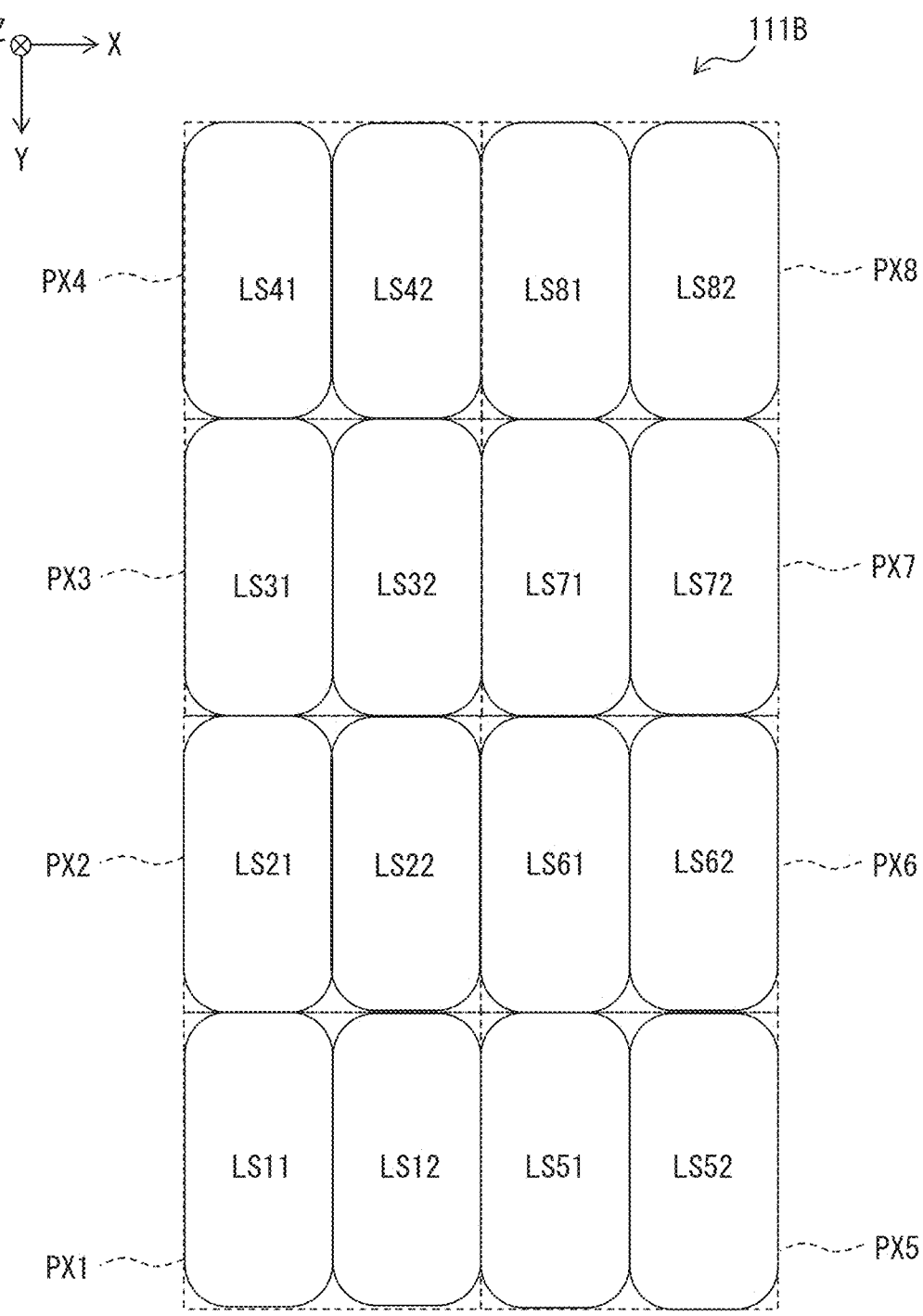

[FIG. 6C]
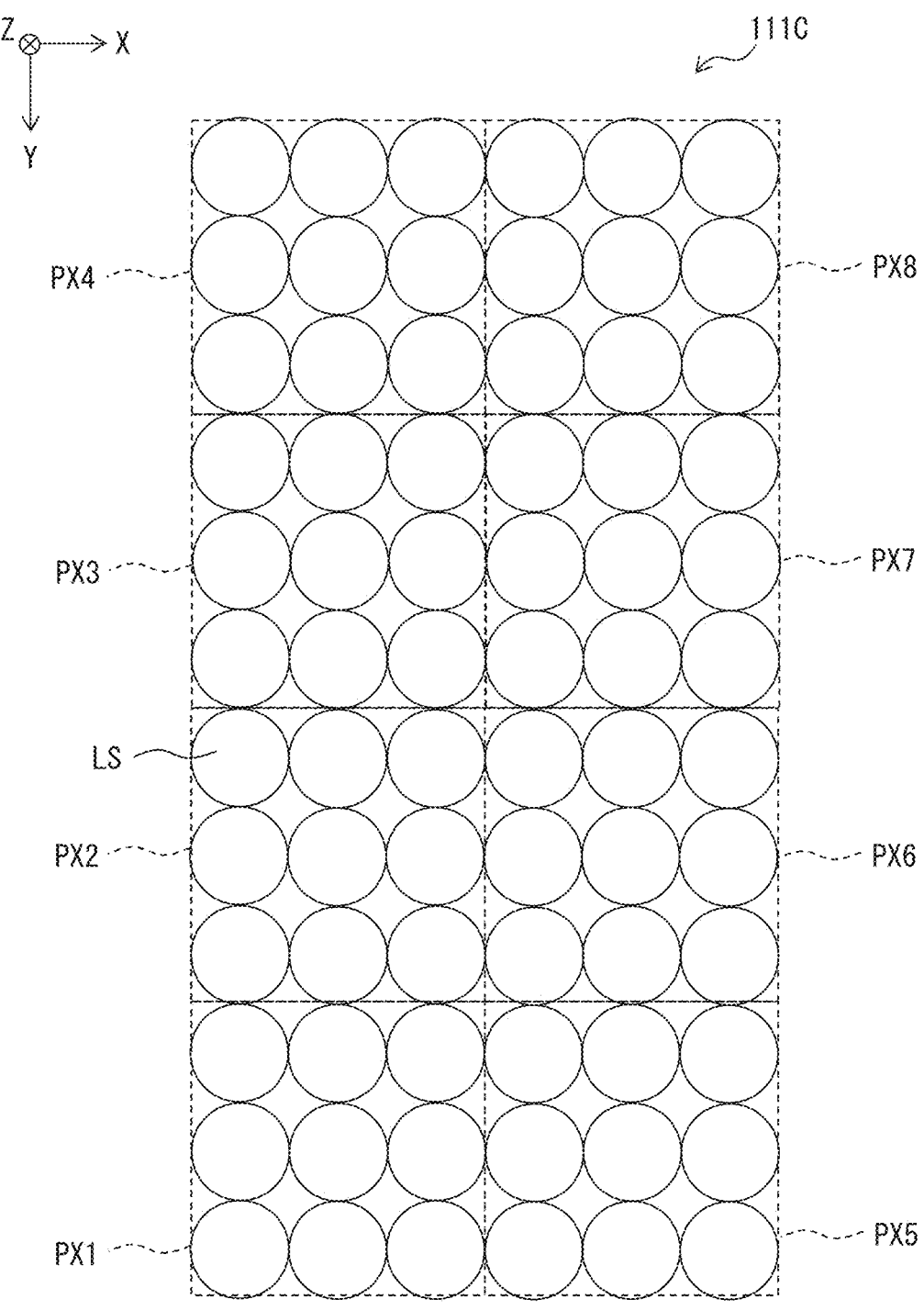

[FIG. 6D]
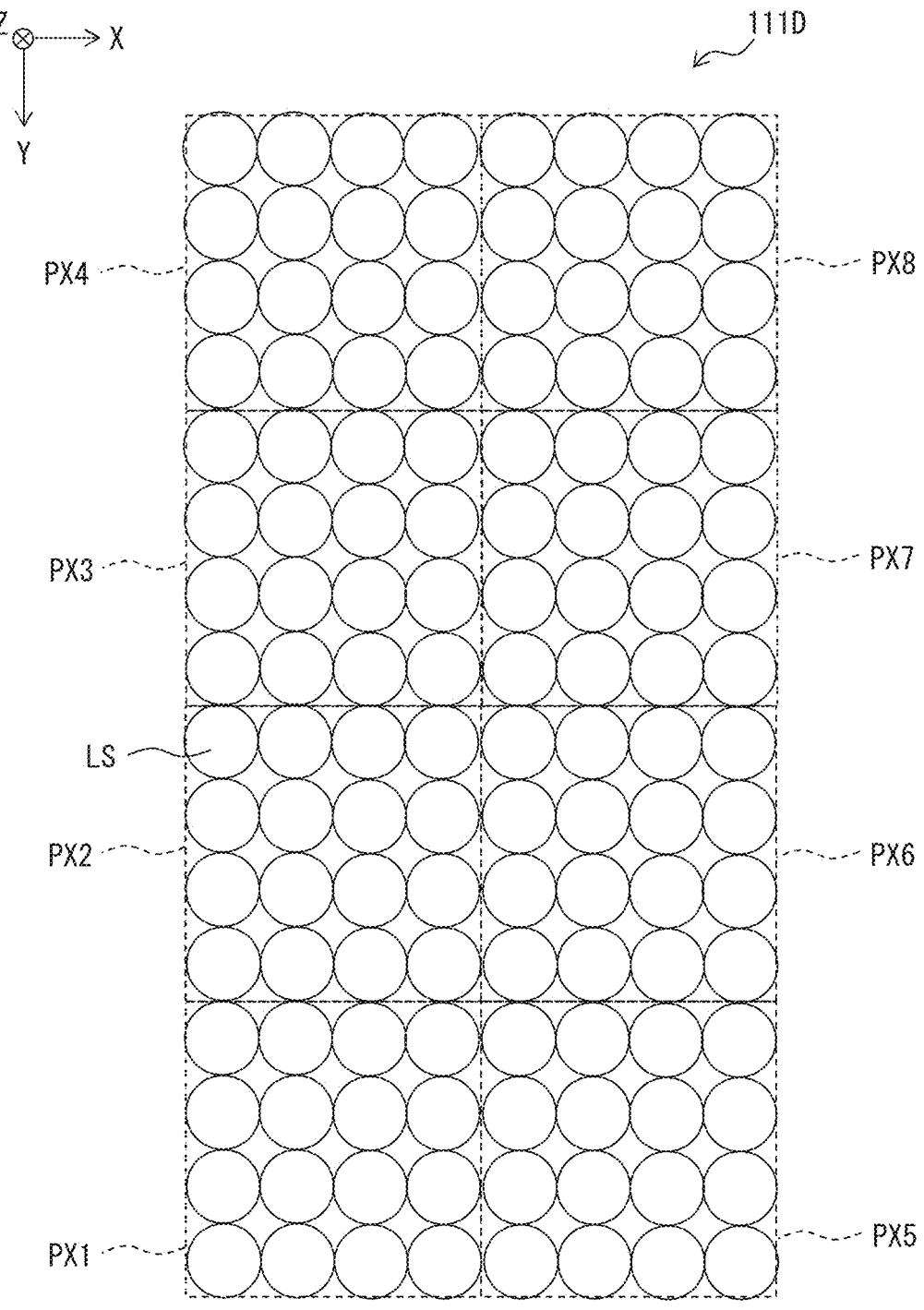

[FIG. 6E]
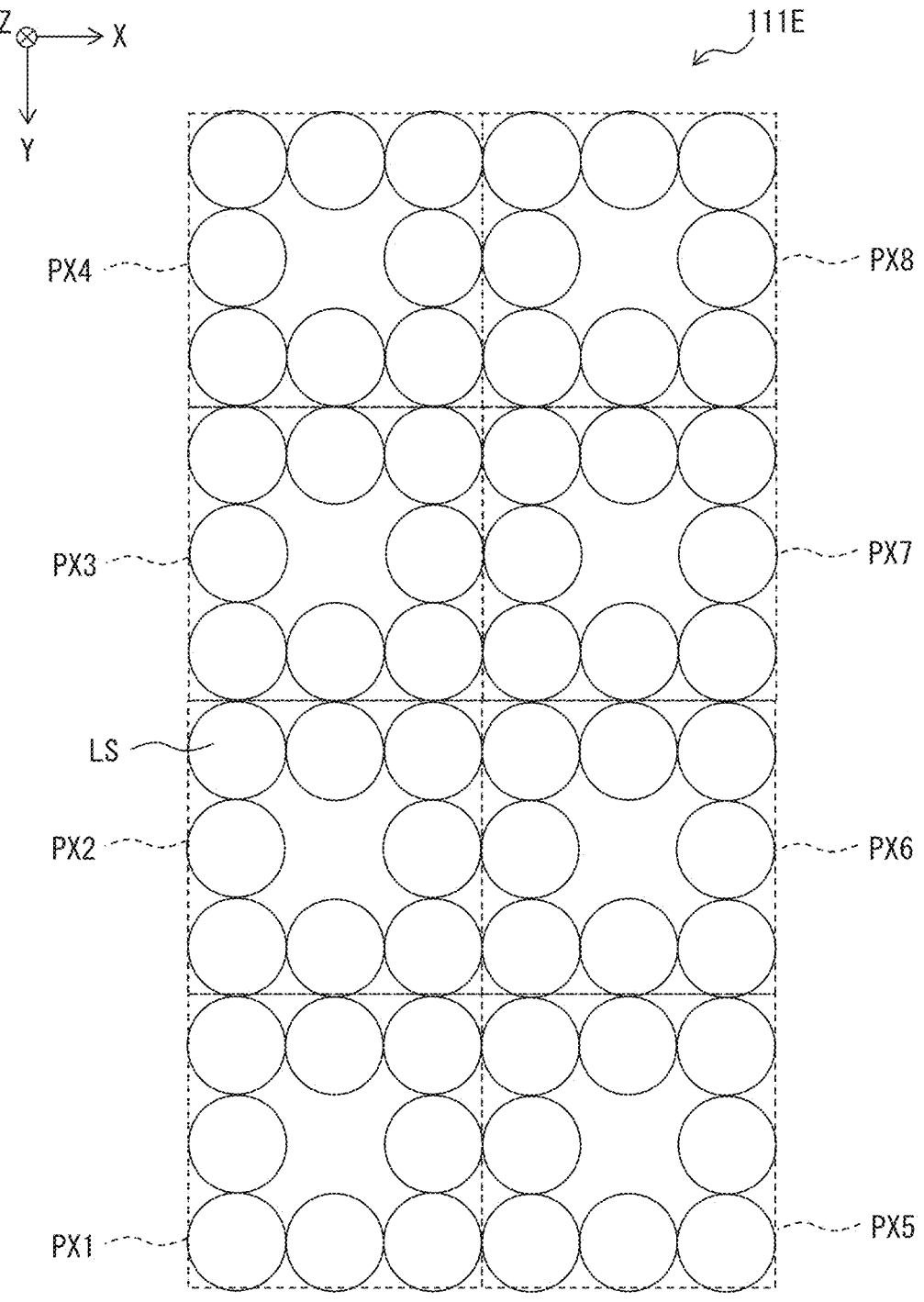

[FIG. 6F]
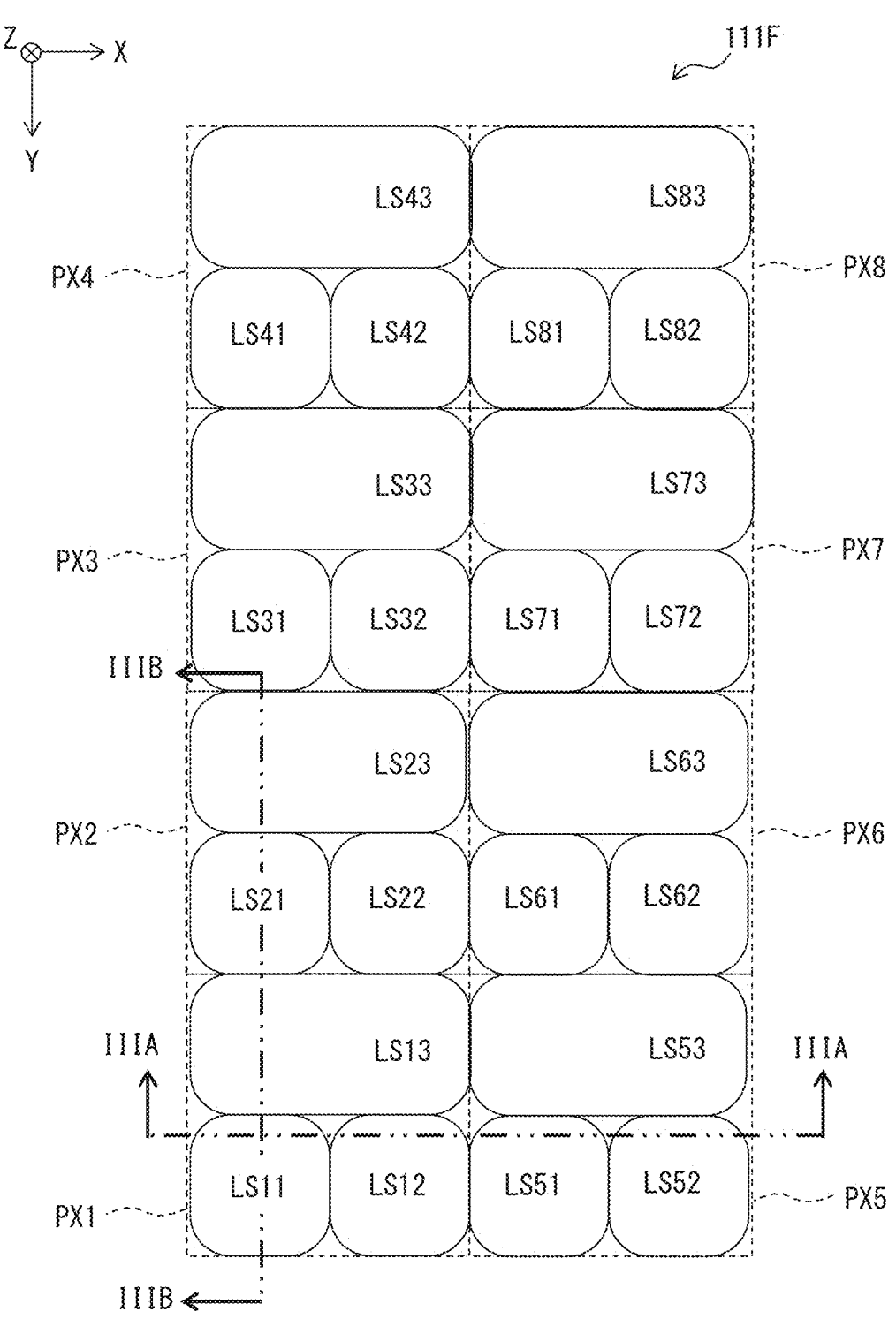

[FIG. 6G]
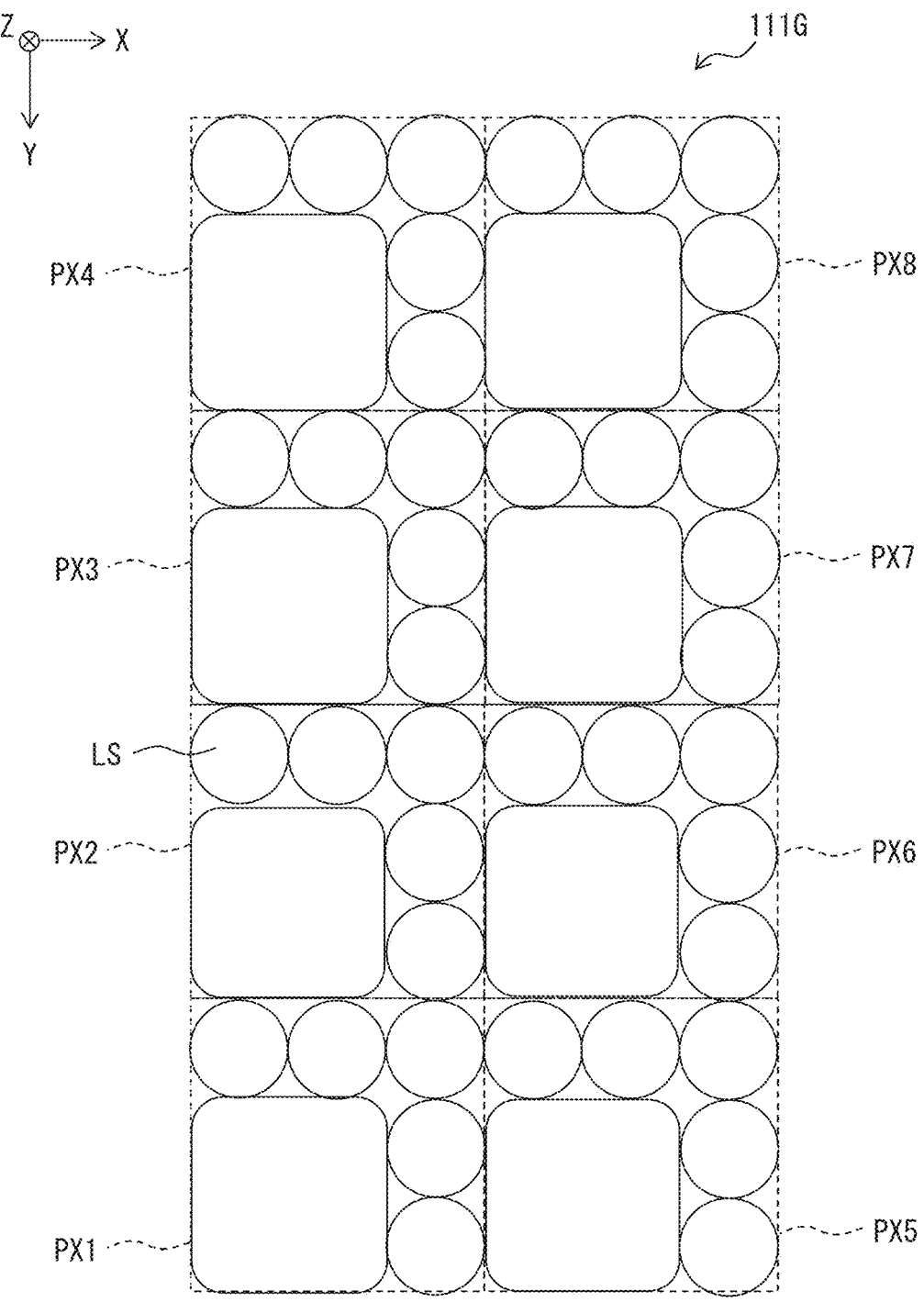

[FIG. 6H]
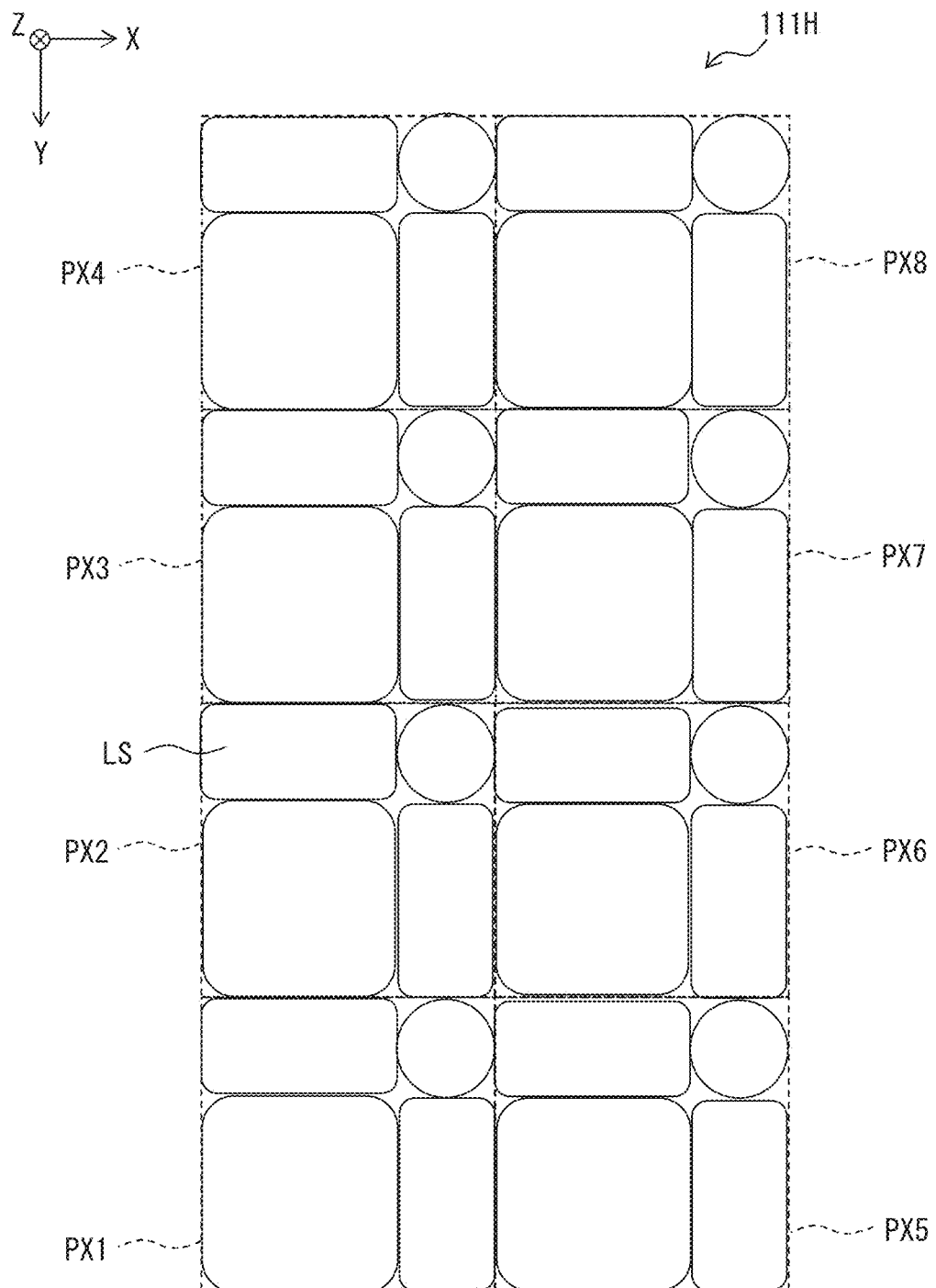

[FIG. 6I]
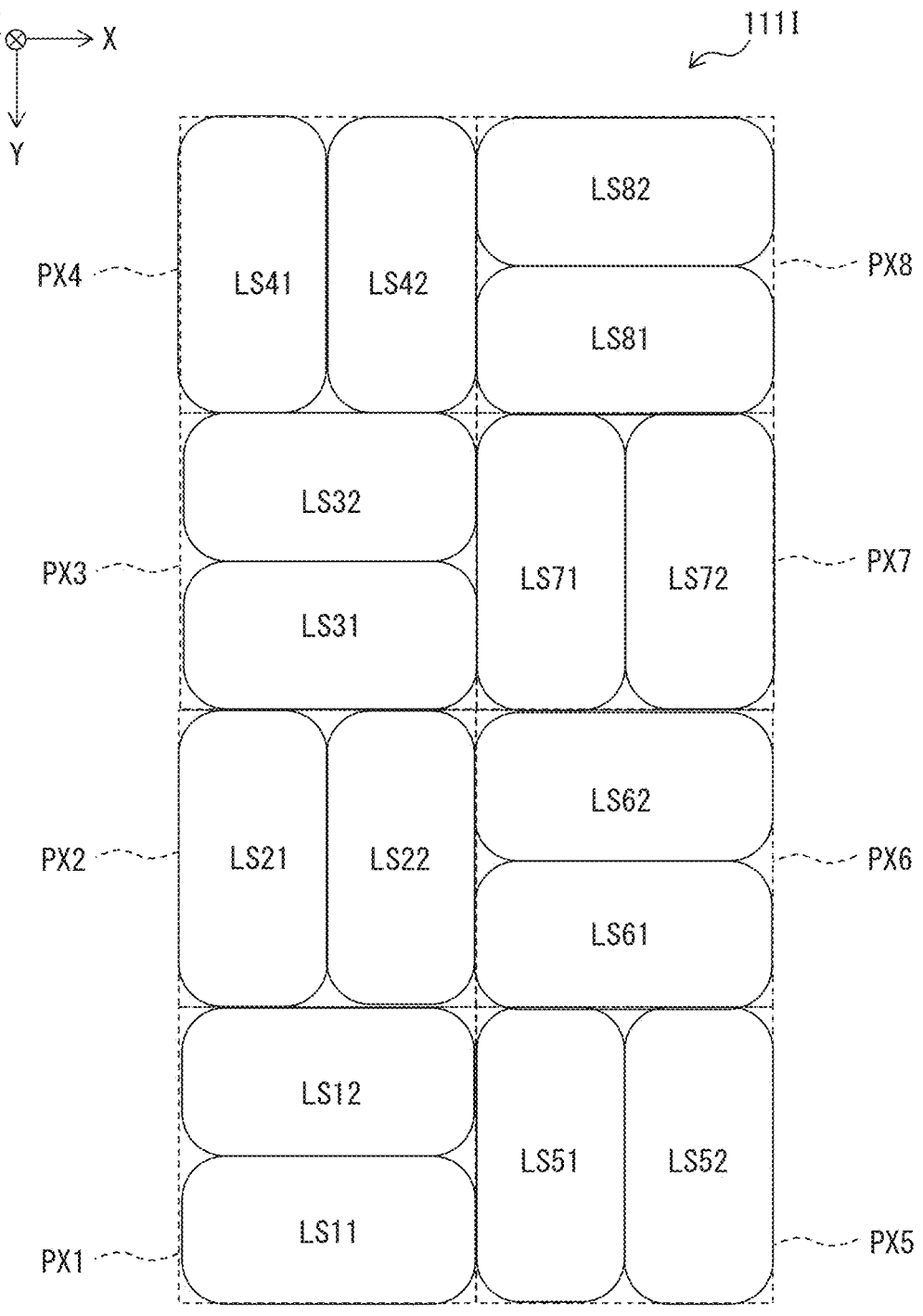

[FIG. 7A]
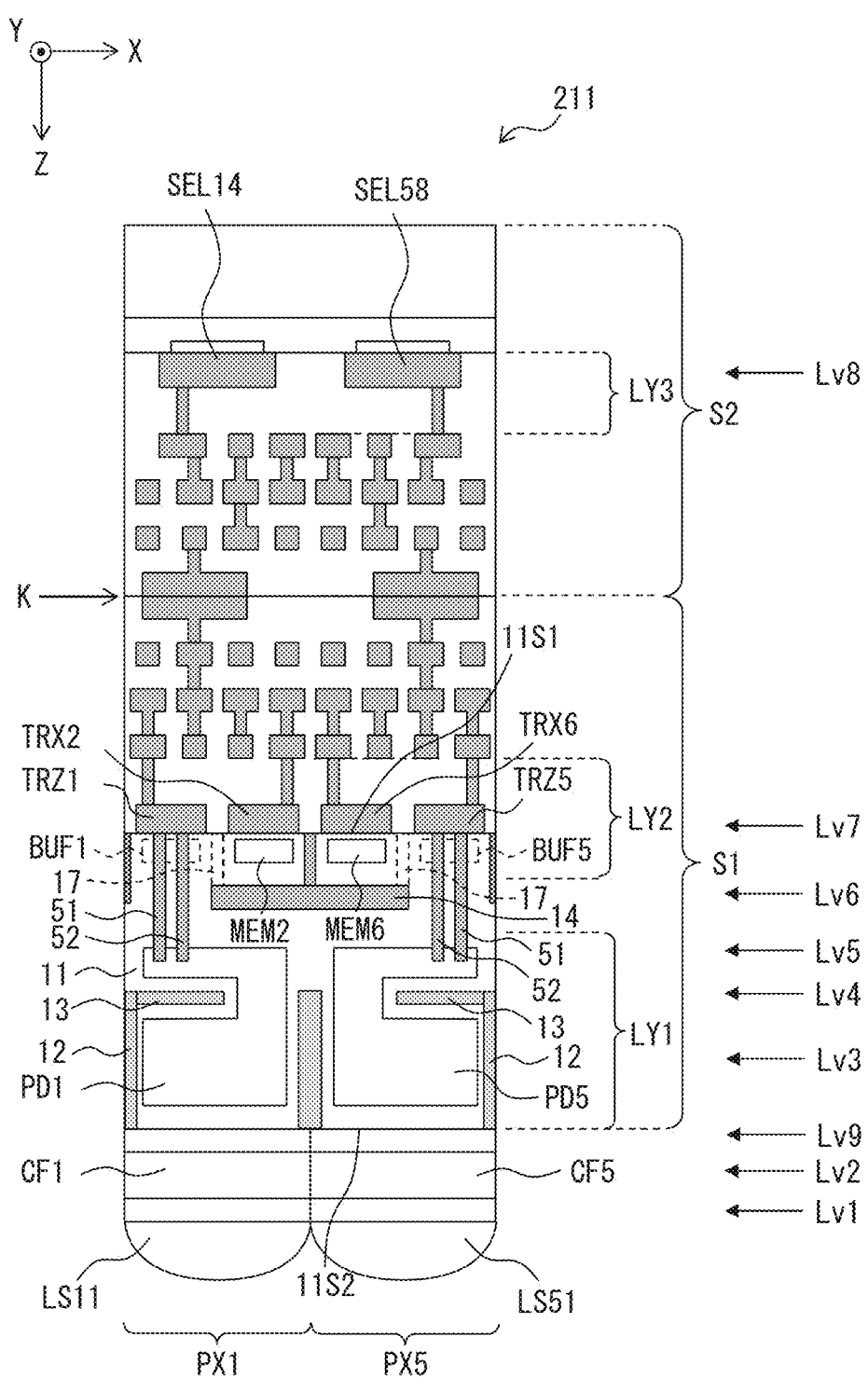

[FIG. 7B]
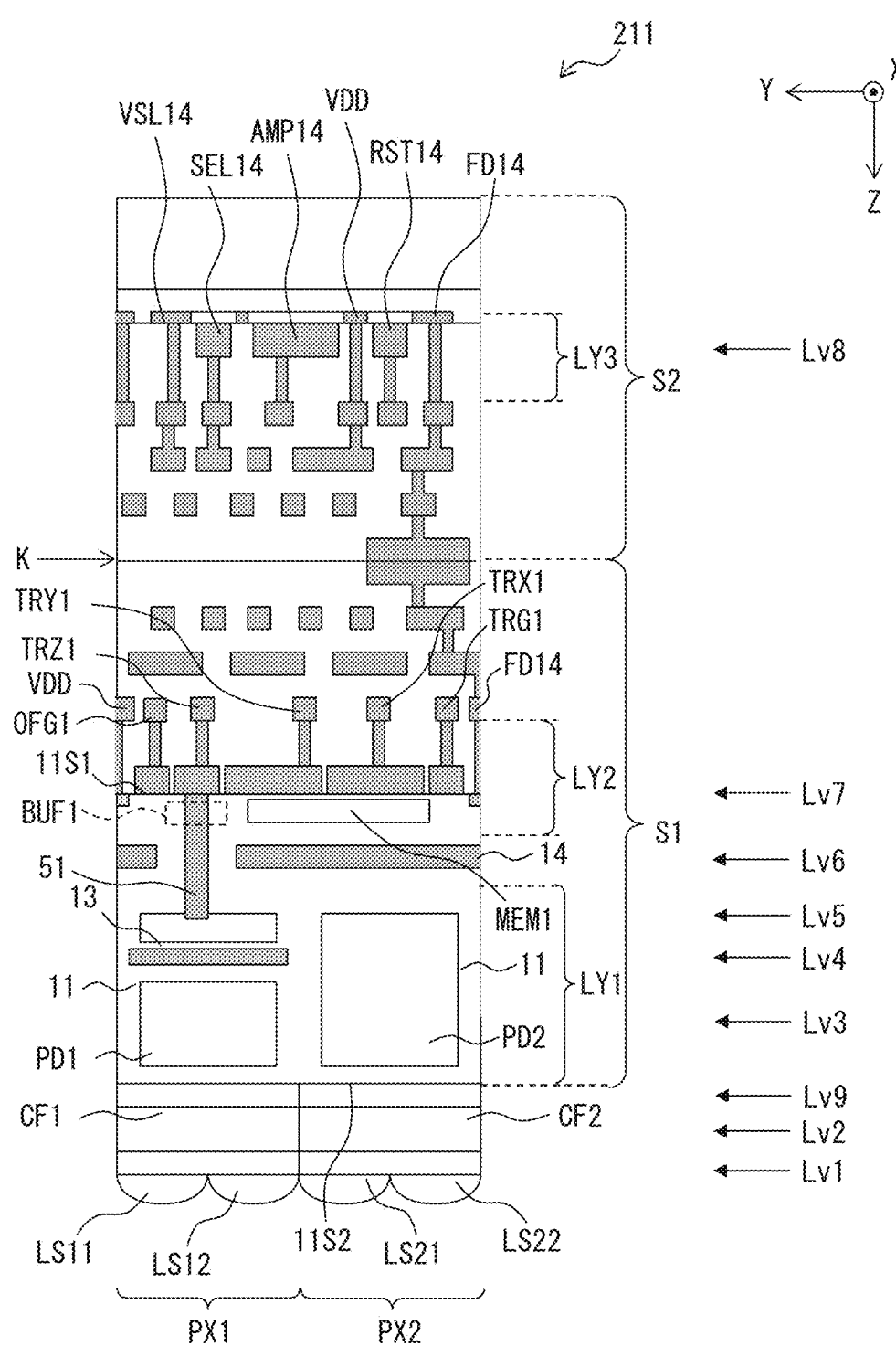

[FIG. 8A]
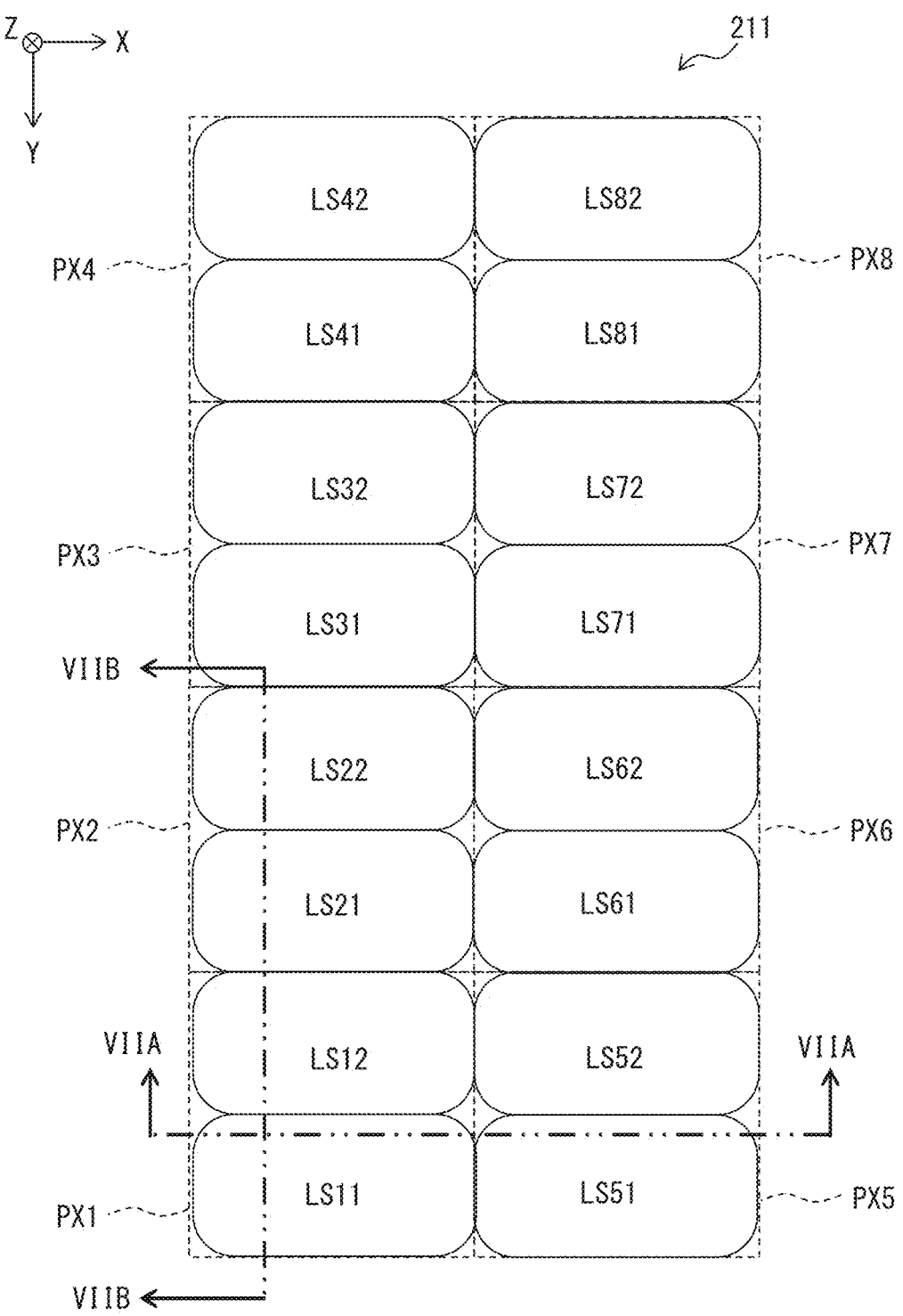

[FIG. 8B]
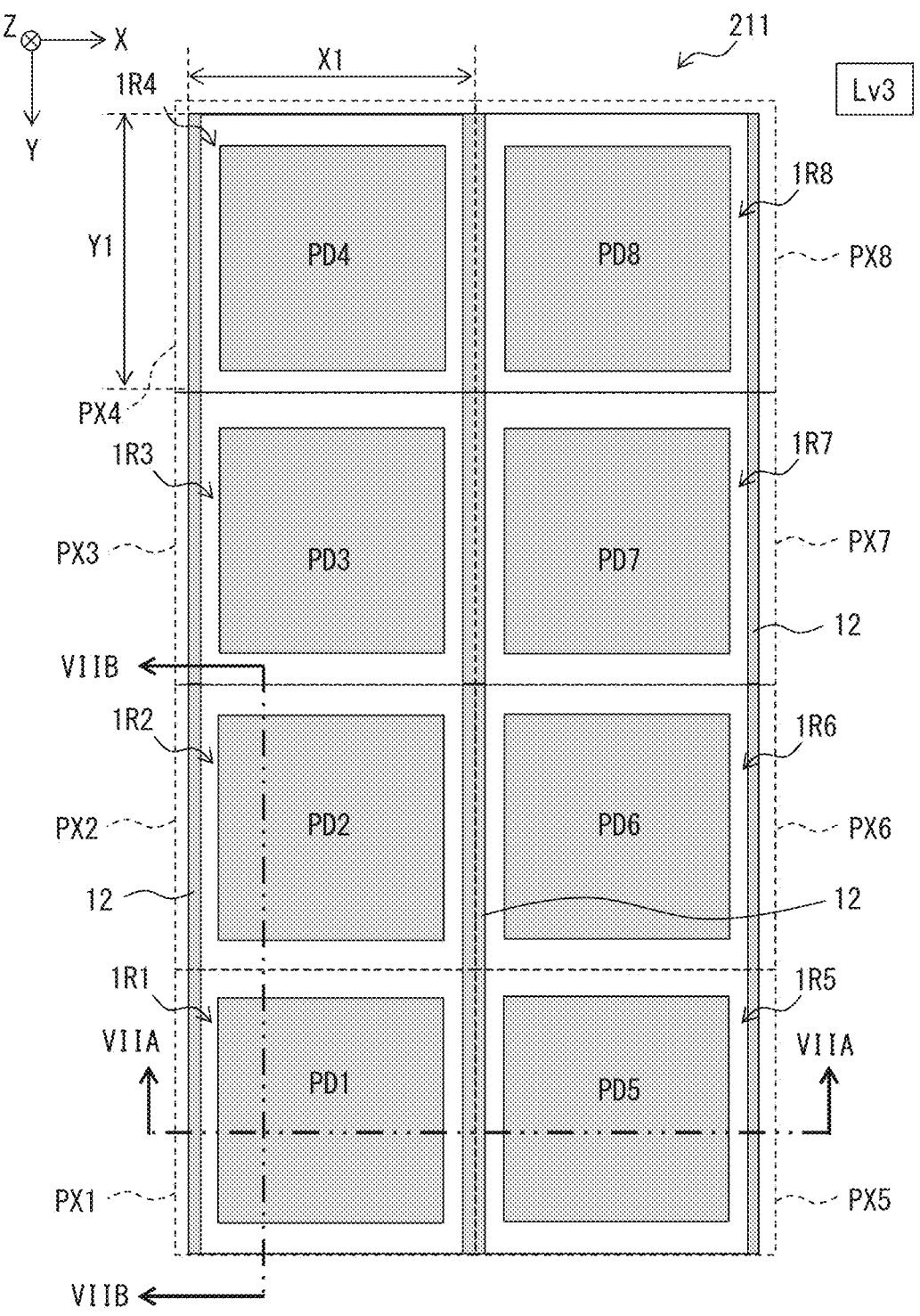

[FIG. 9A]
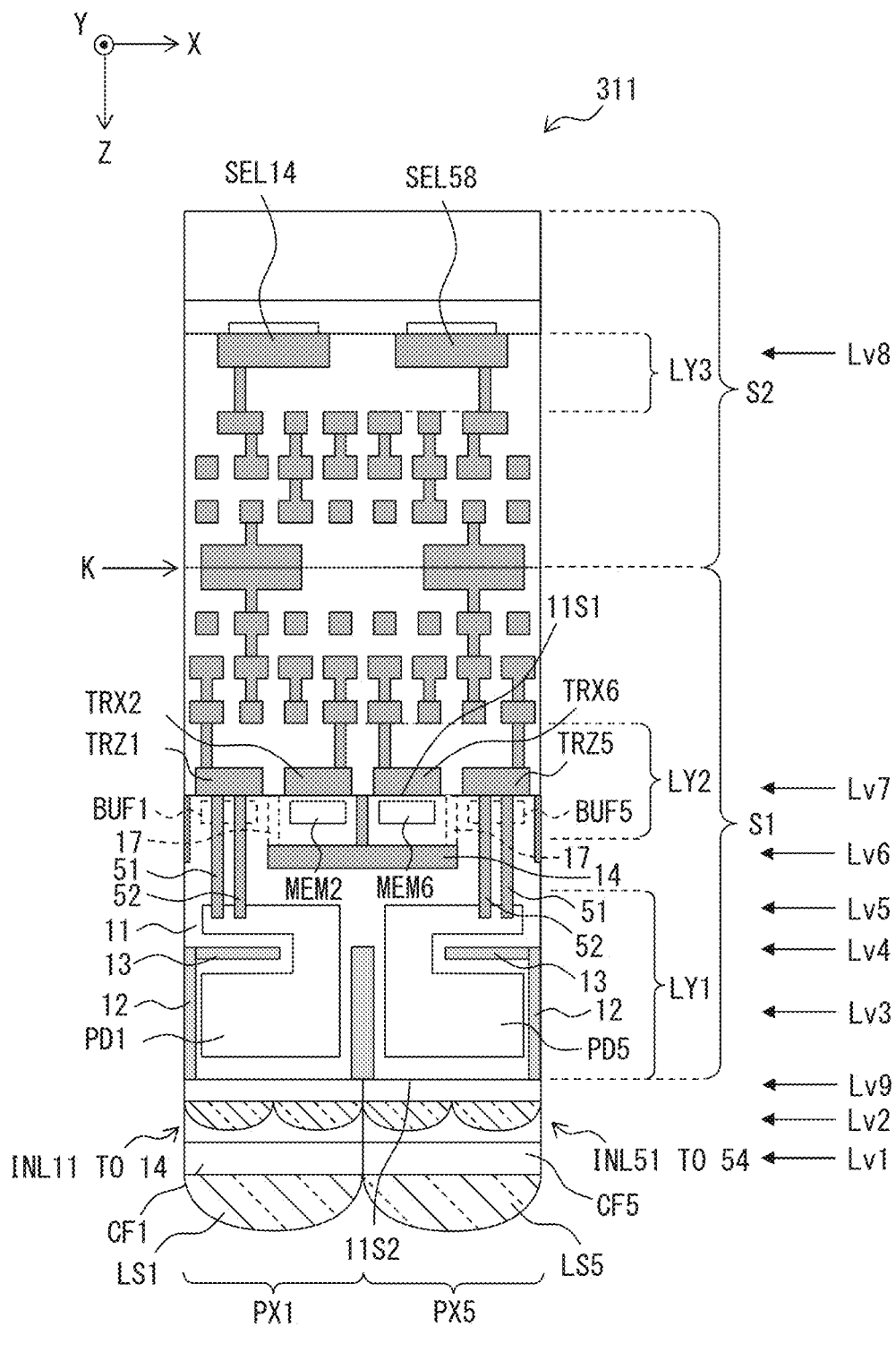

[FIG. 9B]
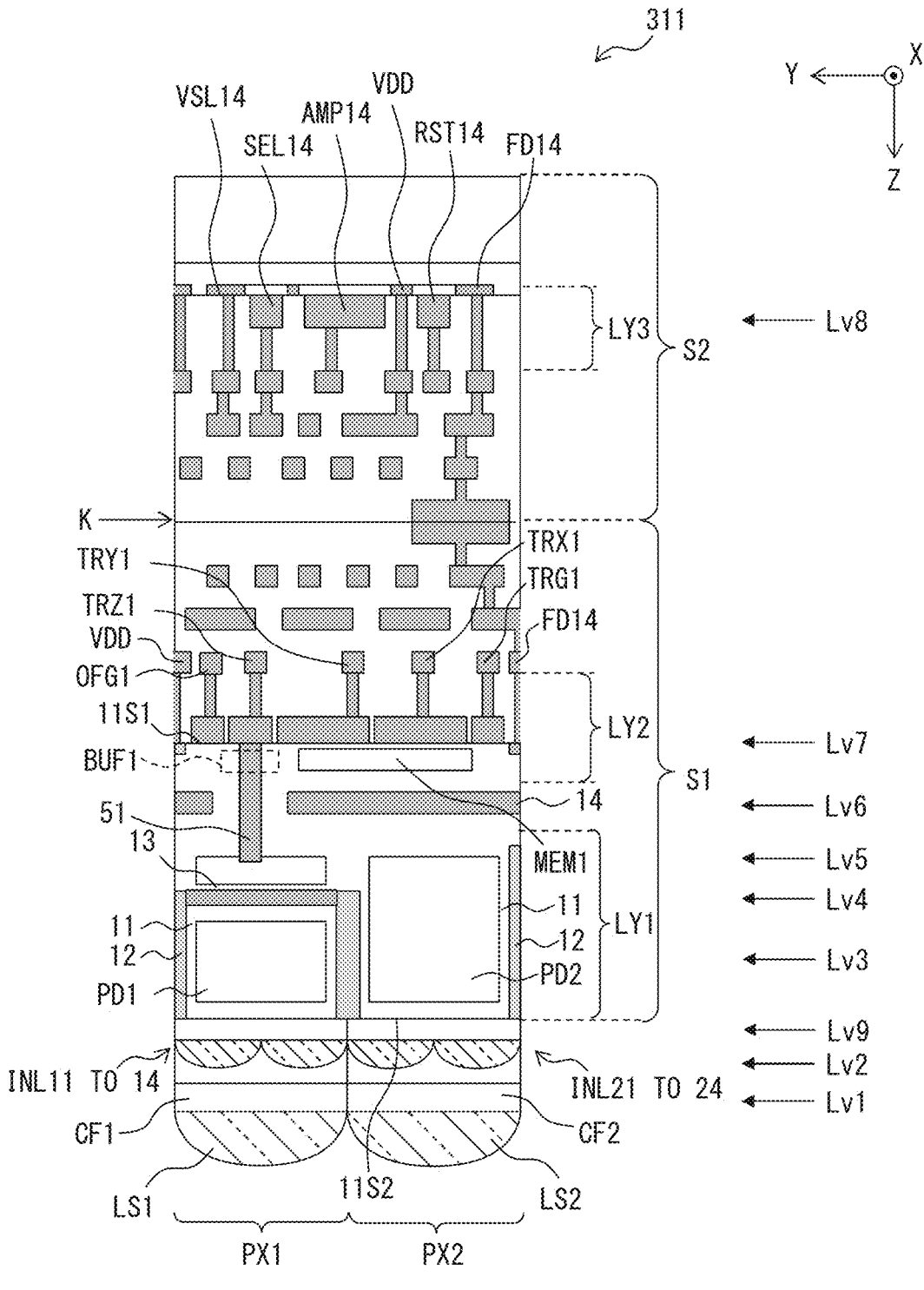

[FIG. 10A]
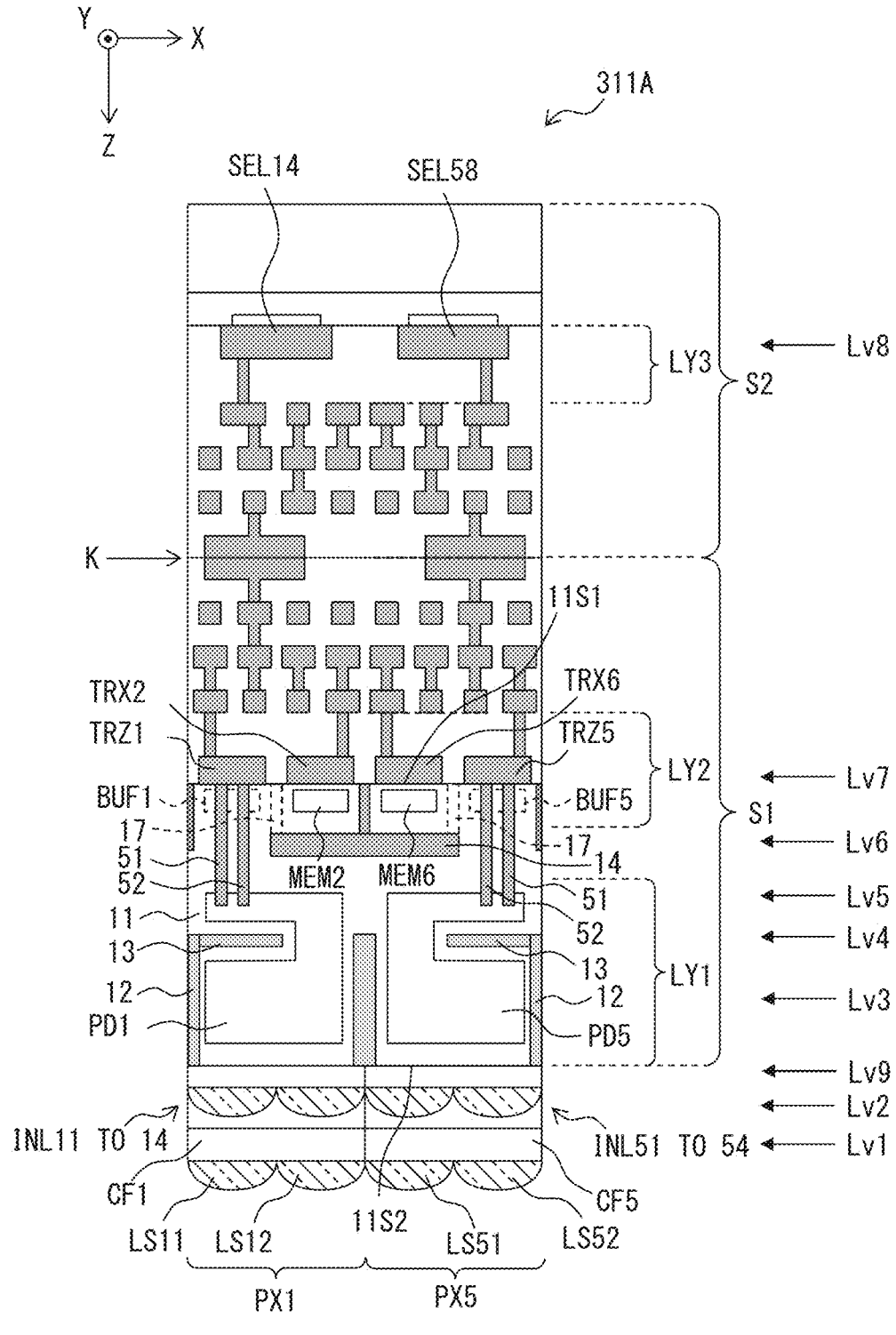

[FIG. 10B]
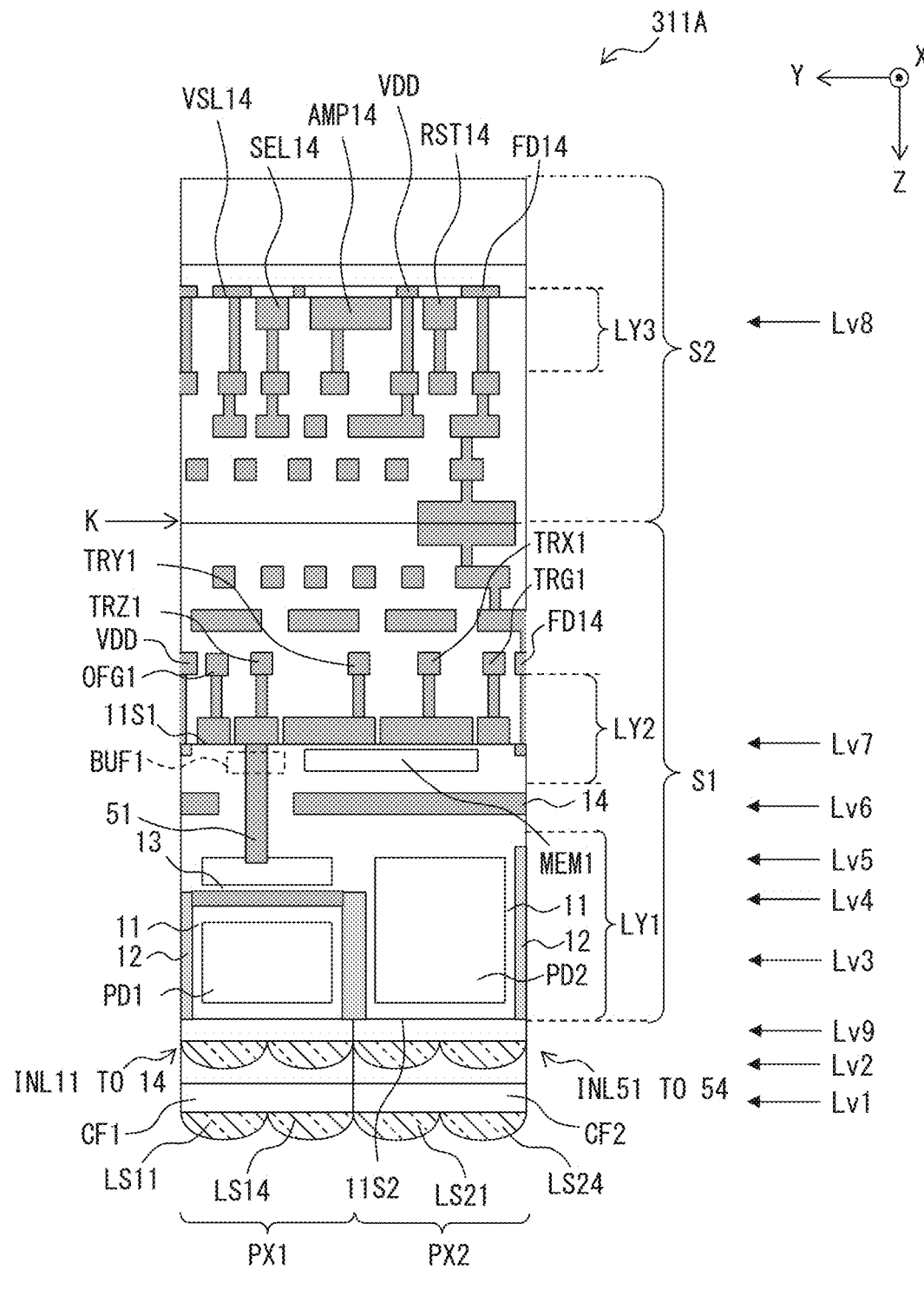

[FIG. 11A]
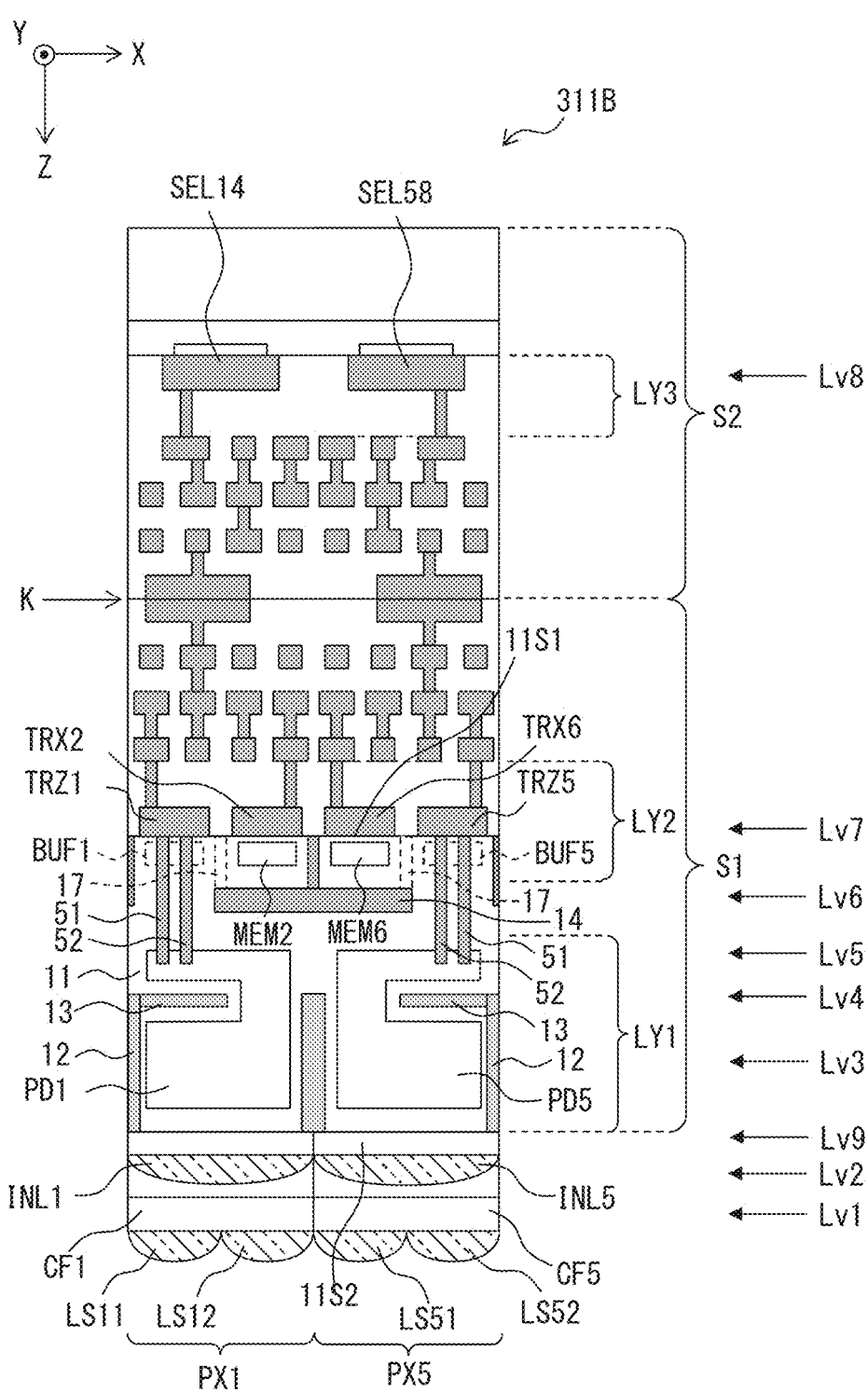

[FIG. 11B]
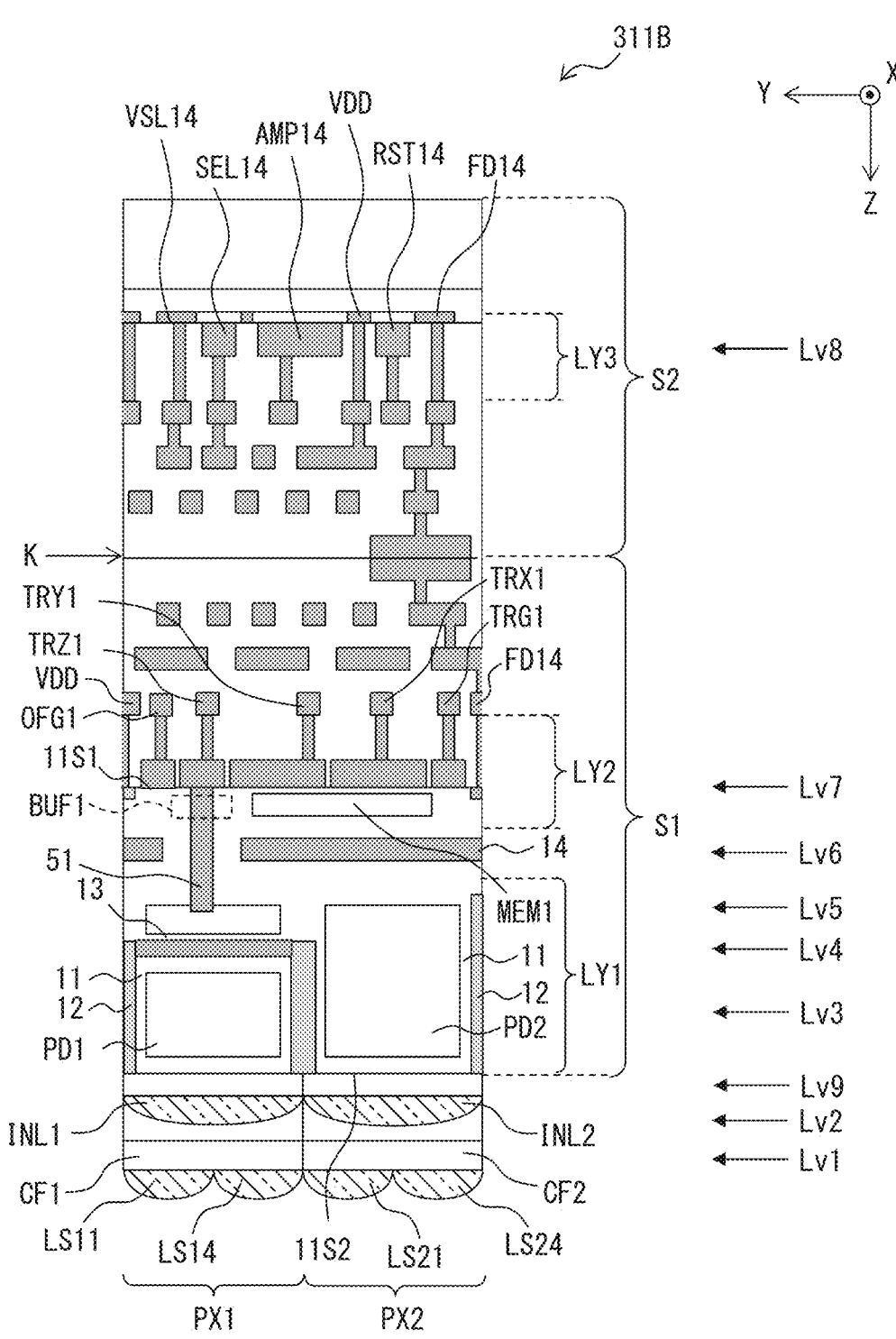

[FIG. 12A]
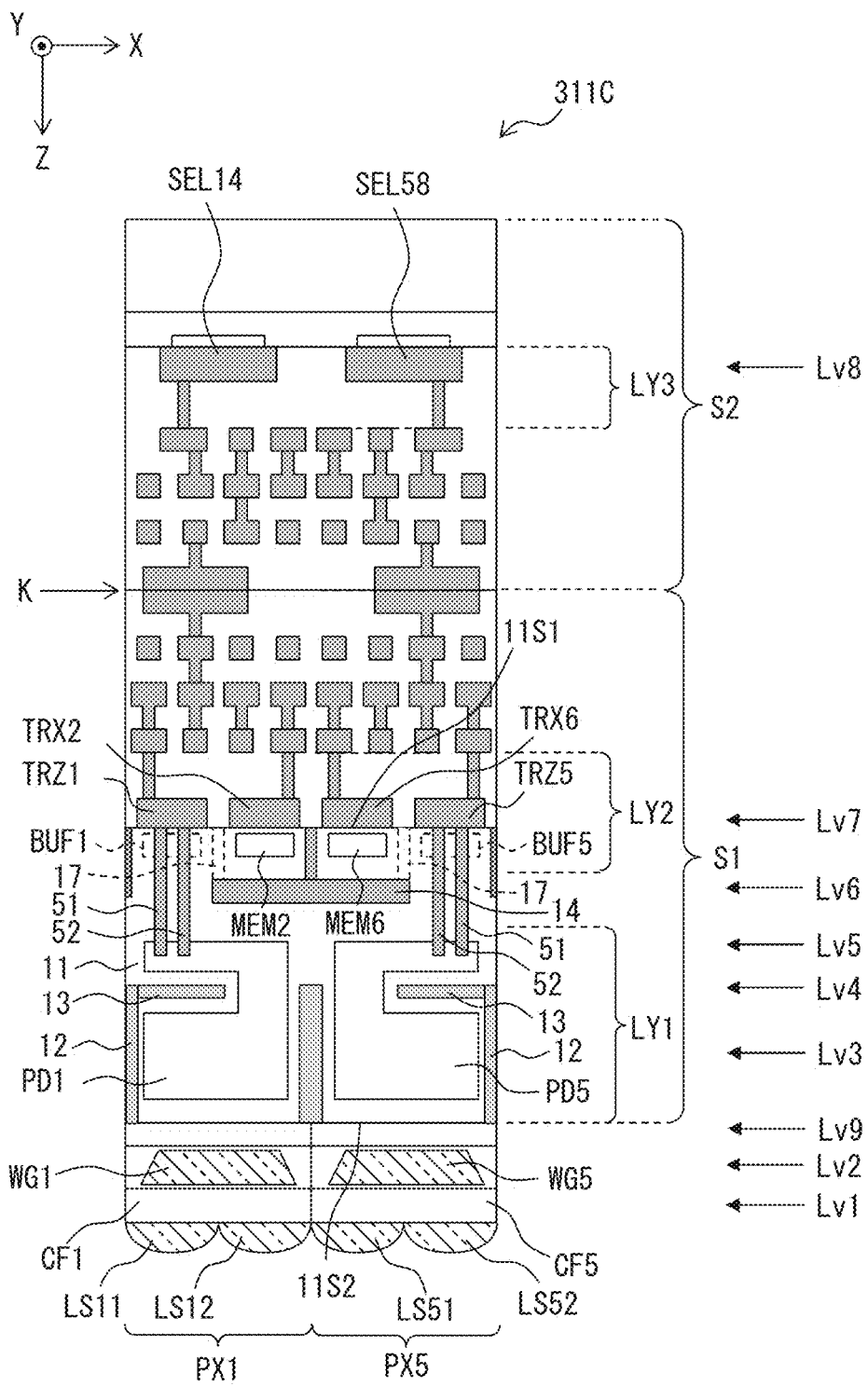

[FIG. 12B]
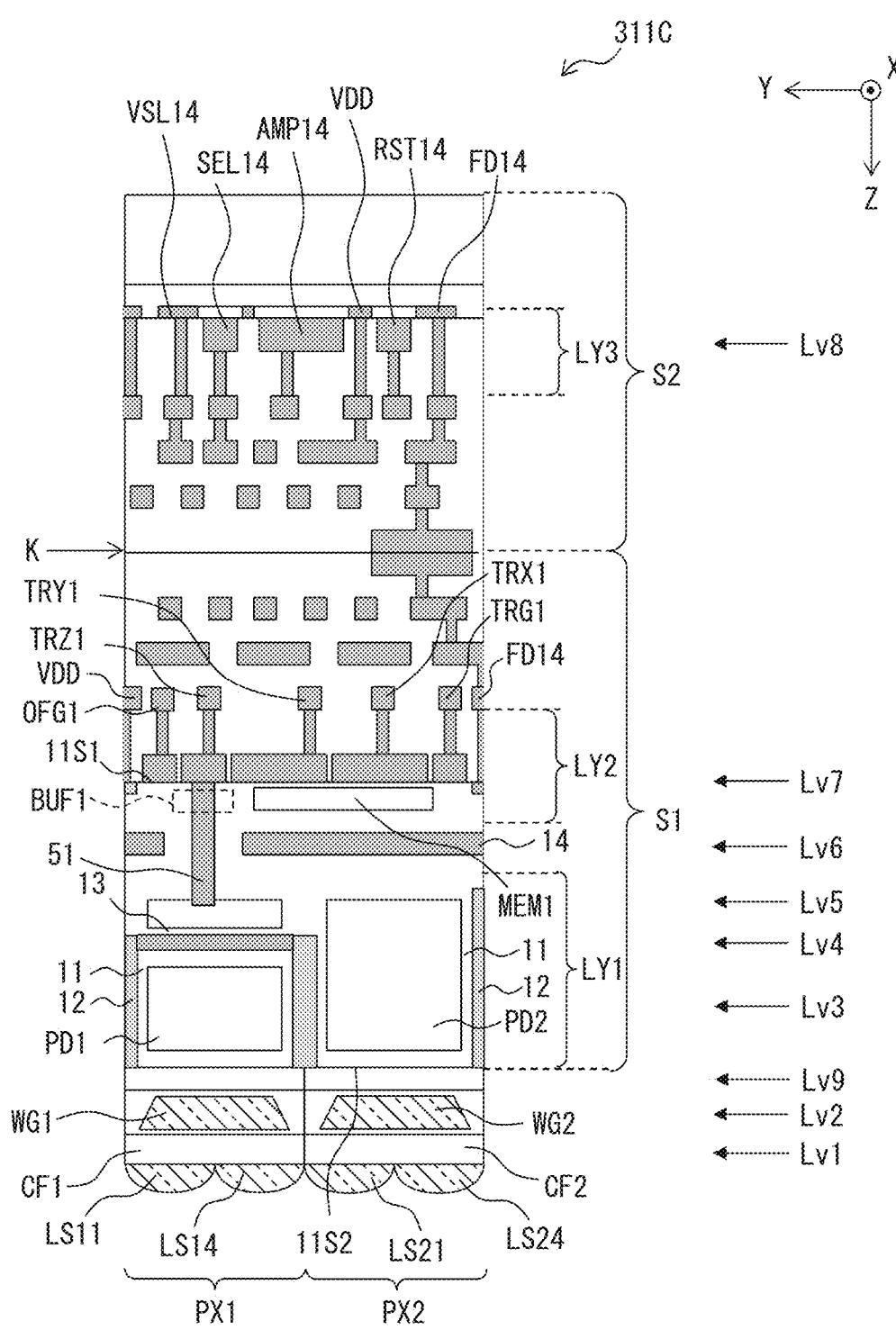

[FIG. 13A]
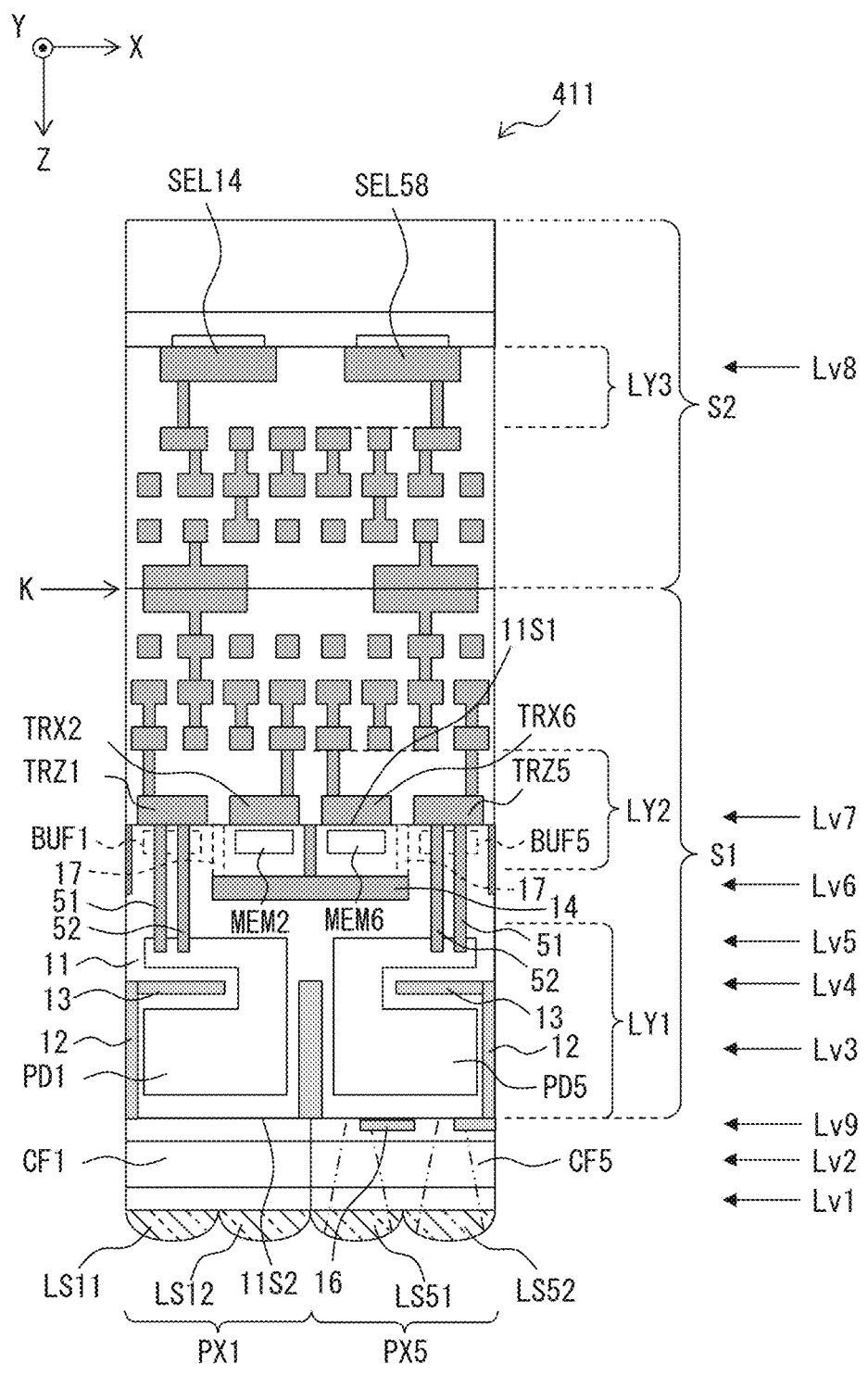

[FIG. 13B]
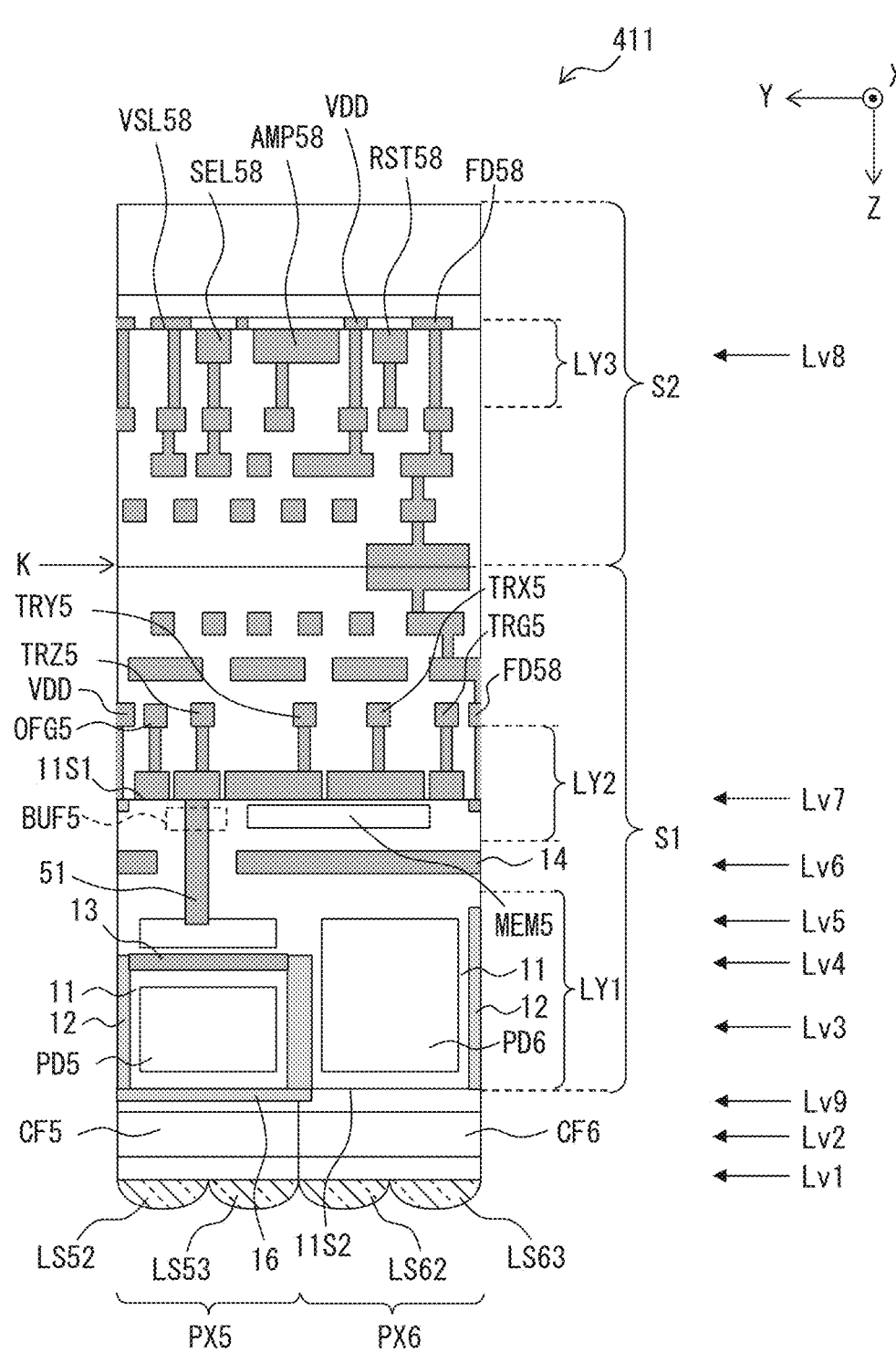

[FIG. 14A]
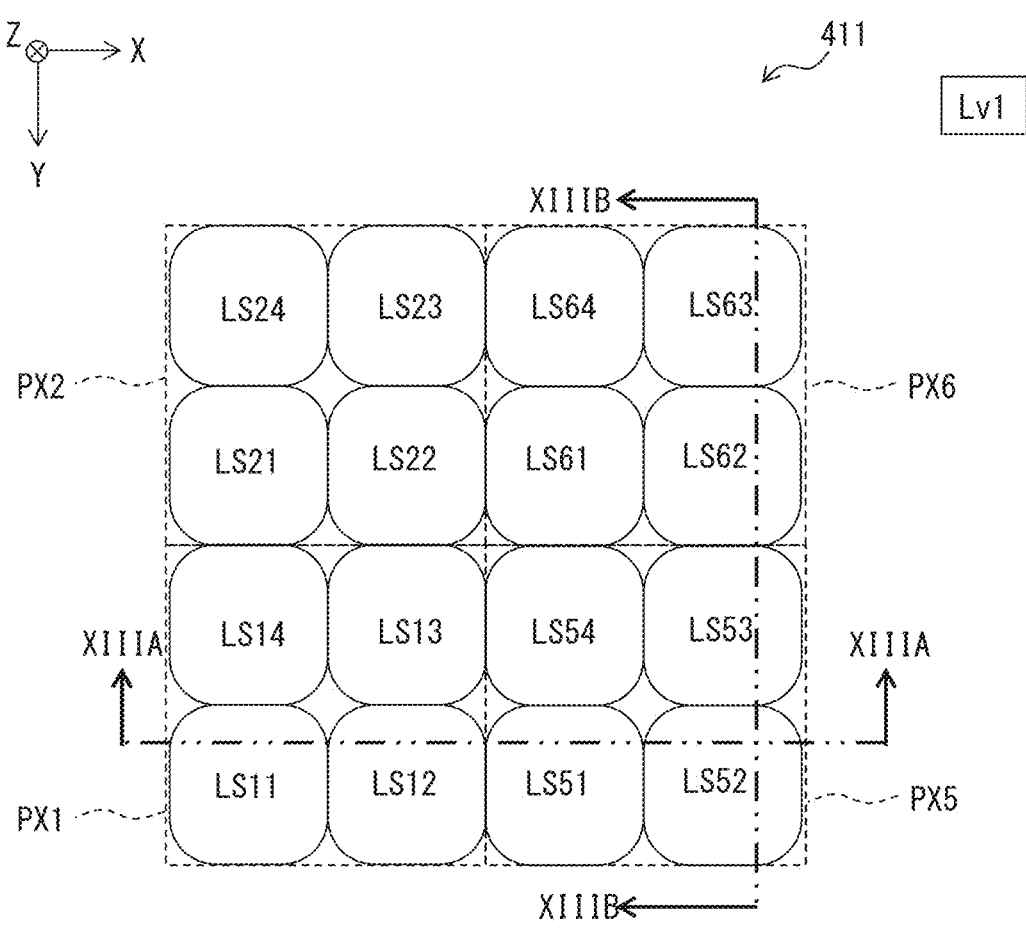

[FIG. 14B]
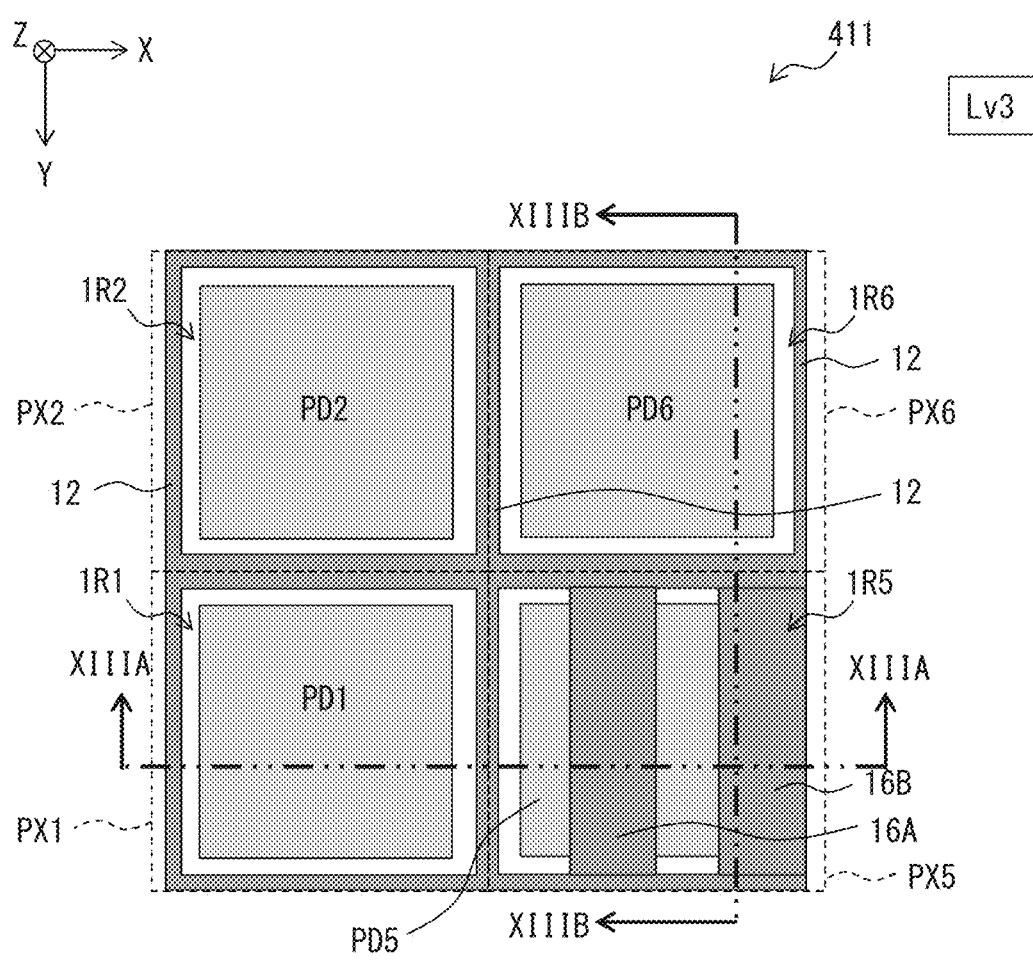

[FIG. 15A]
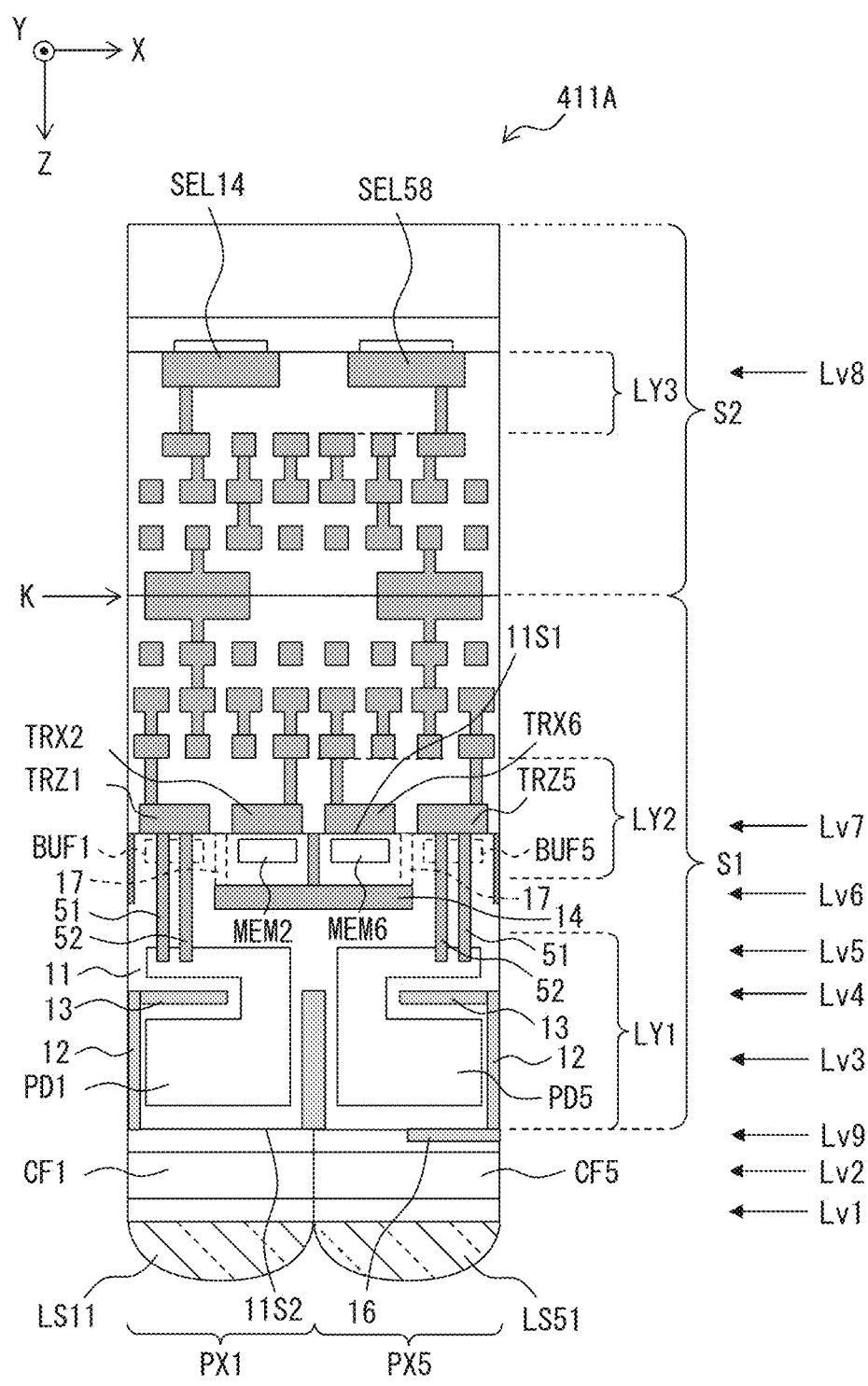

[FIG. 15B]
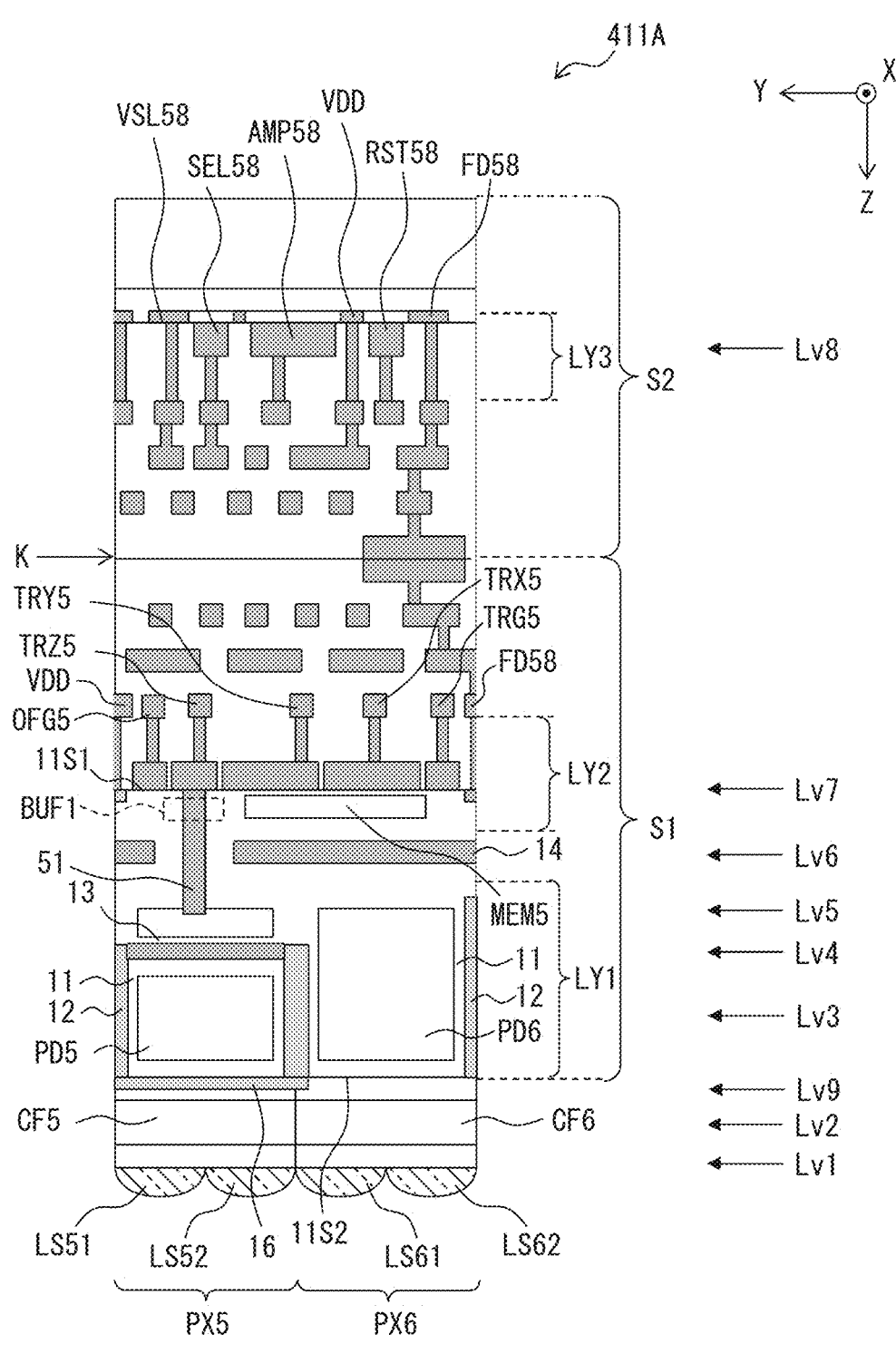

[FIG. 16A]
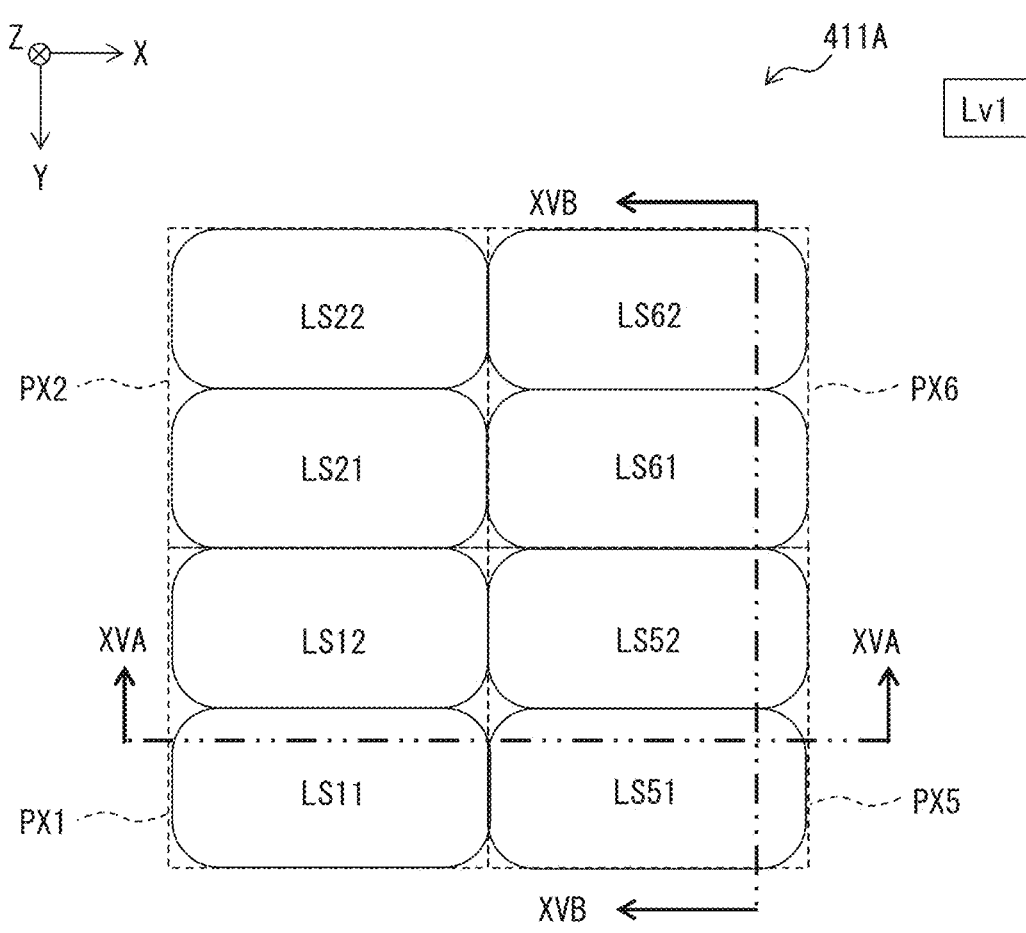

[FIG. 16B]
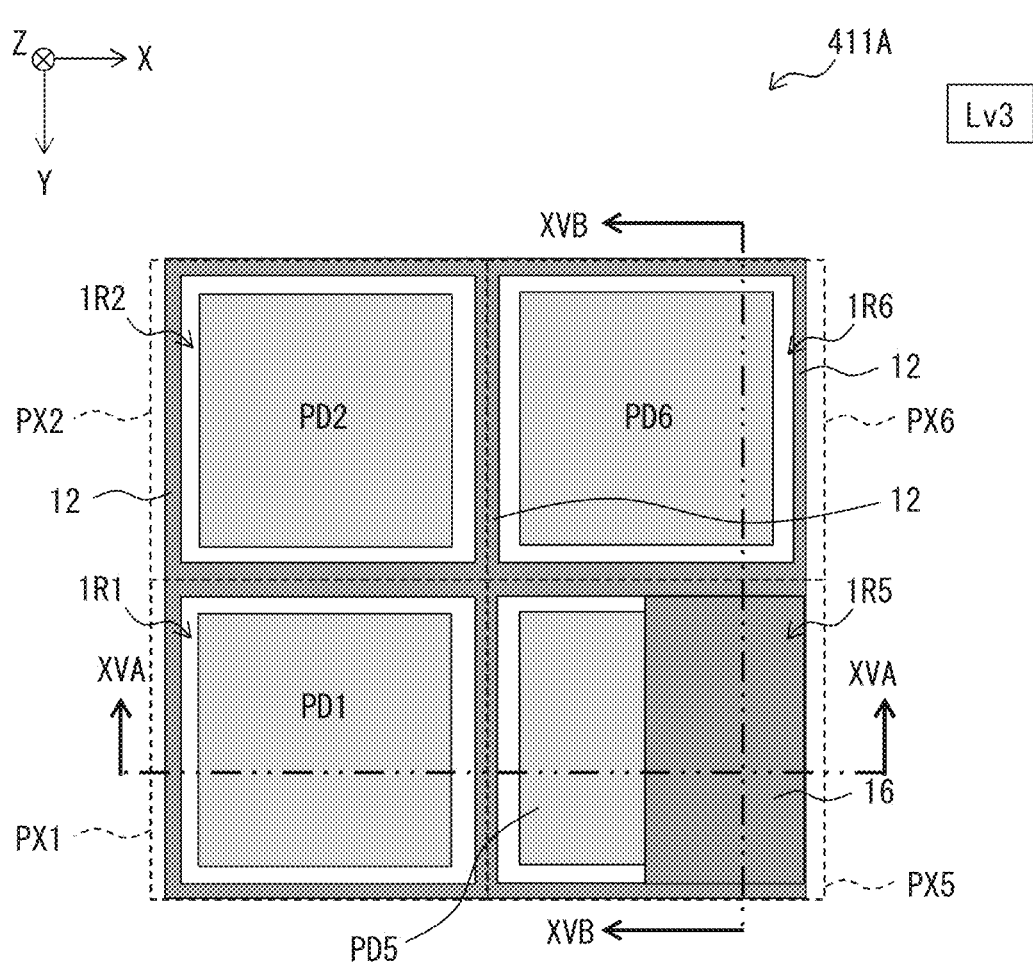

[FIG. 17A]
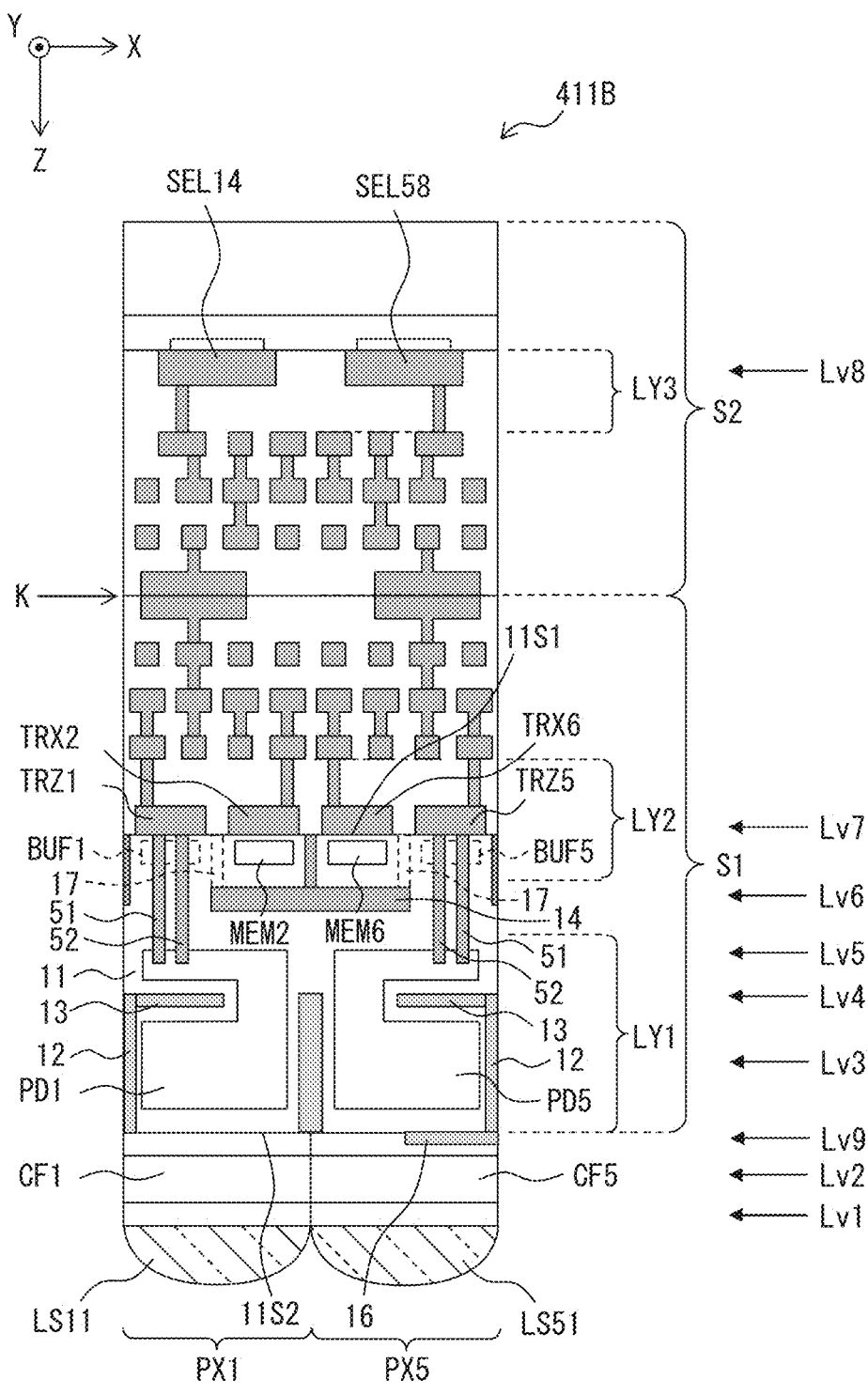

[FIG. 17B]
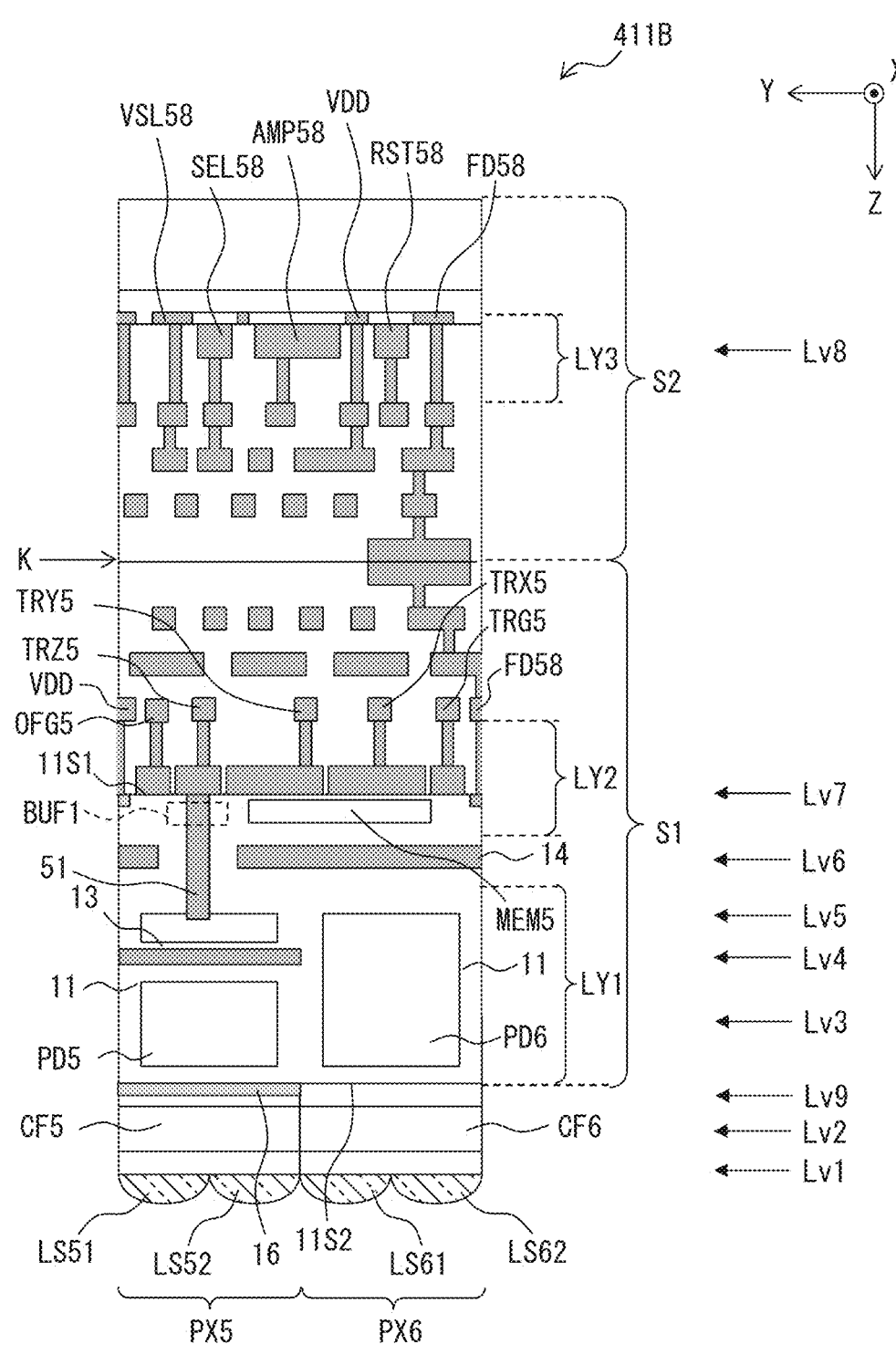

[FIG. 18A]
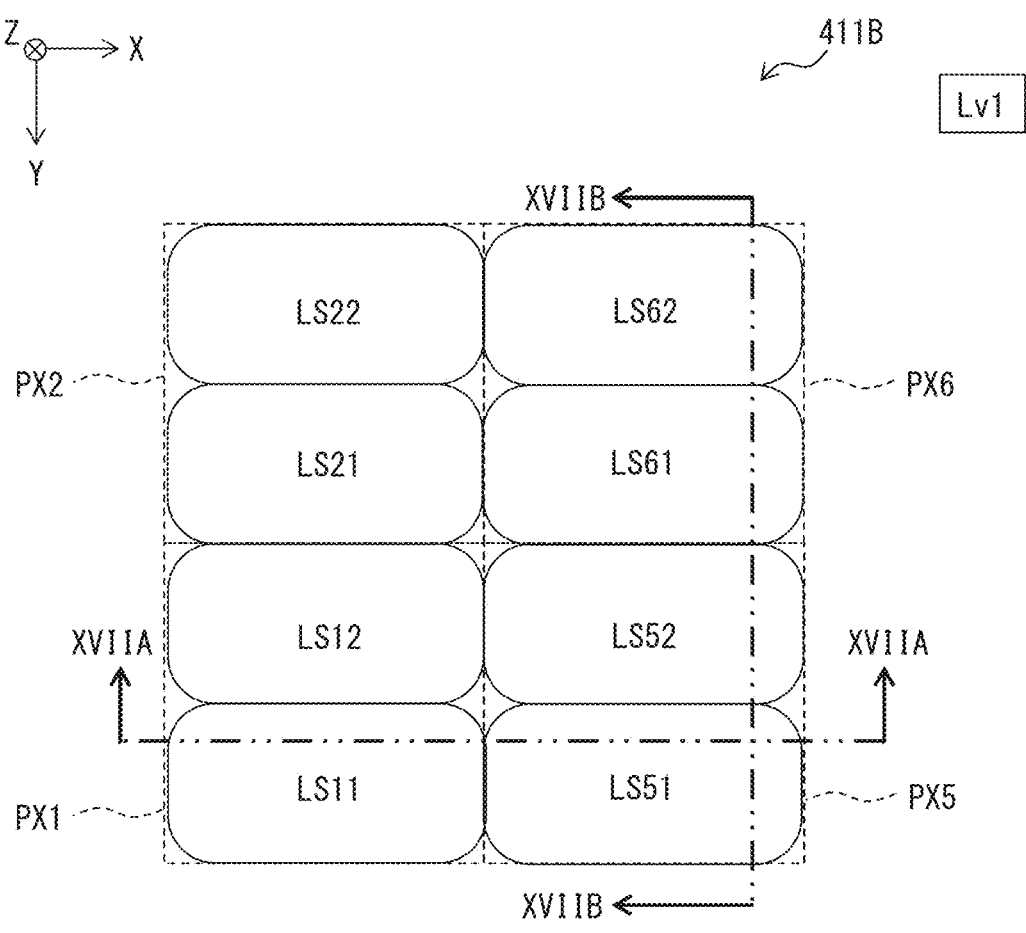

[FIG. 18B]
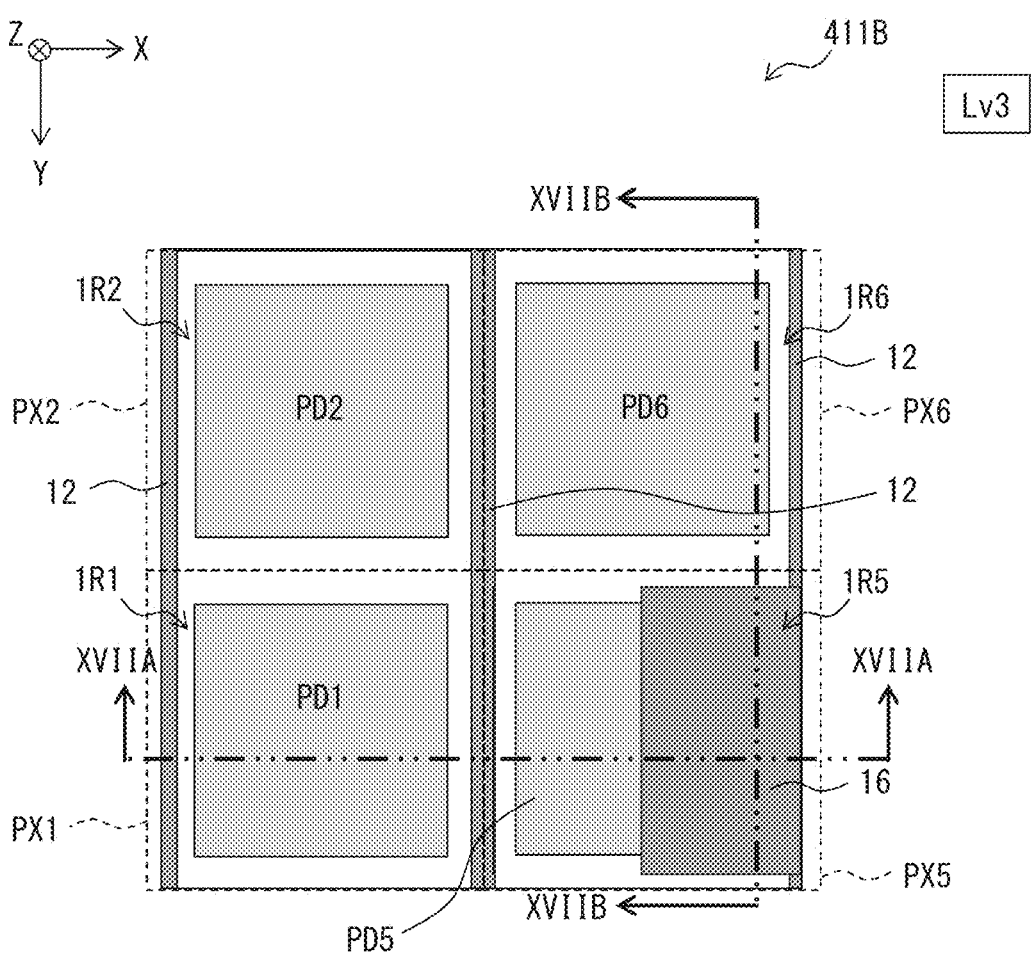

[FIG. 19A]
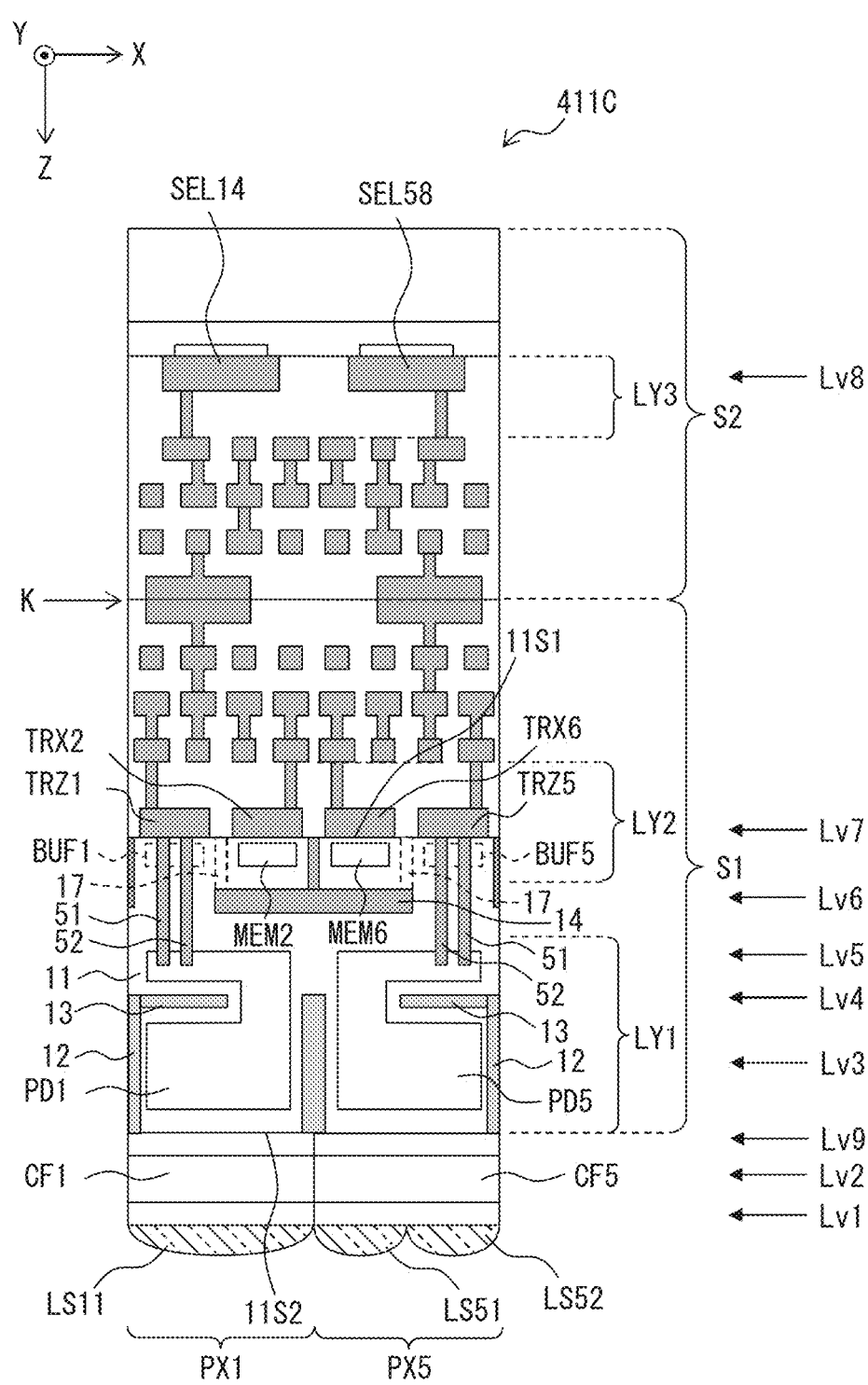

[FIG. 19B]
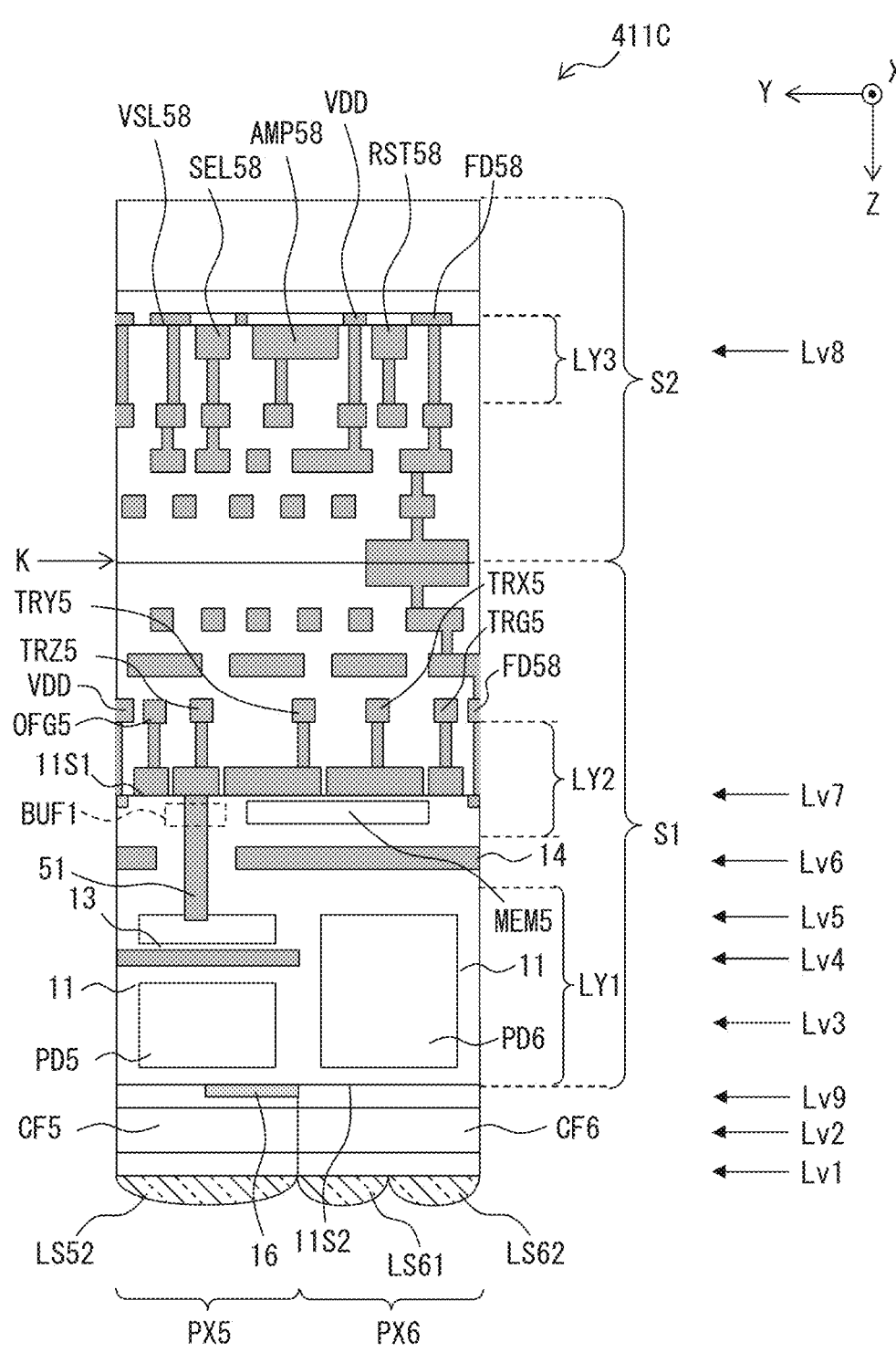

[FIG. 20A]
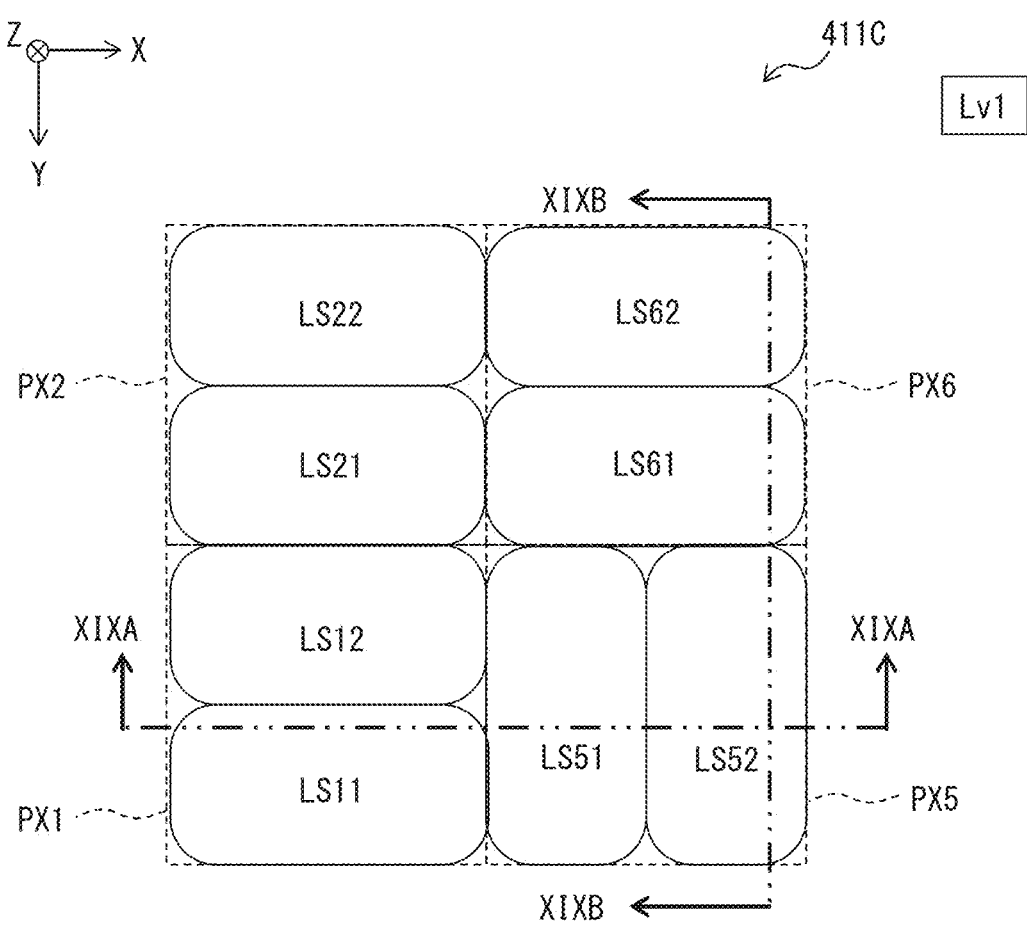

[FIG. 20B]
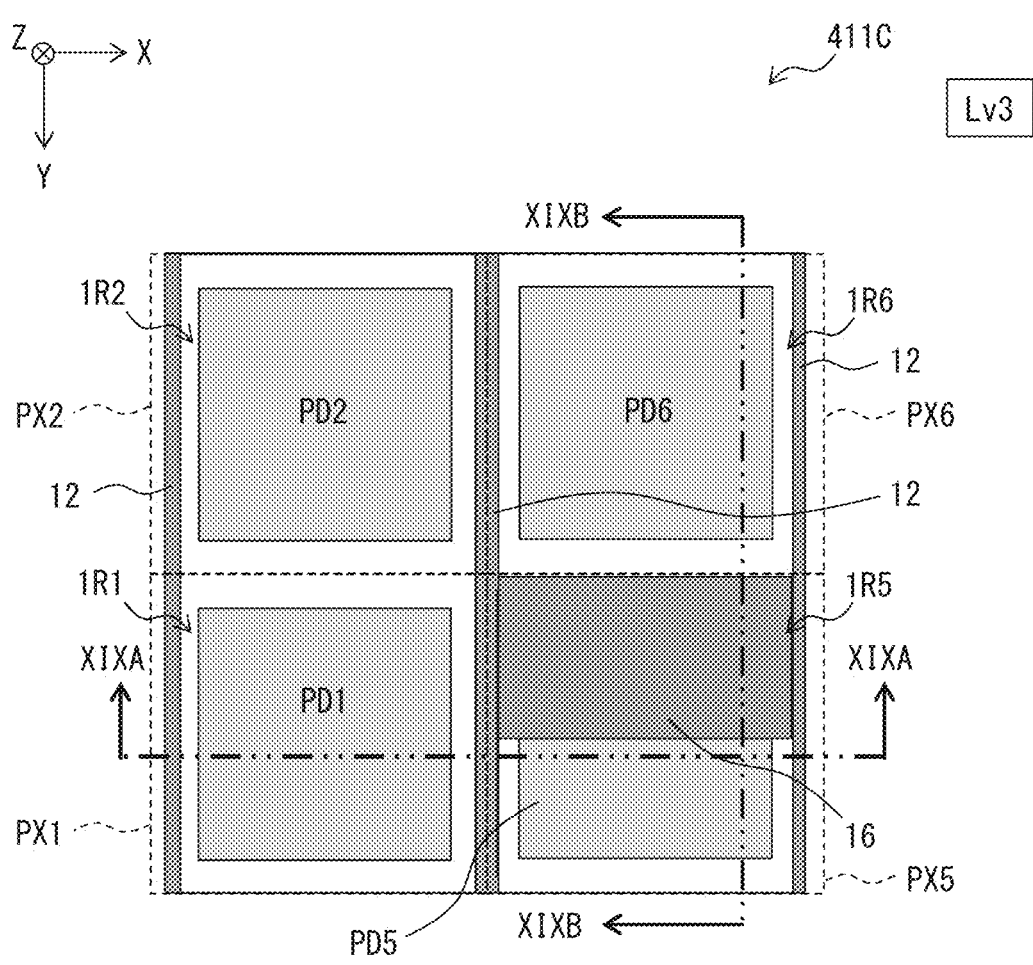

[FIG. 21A]
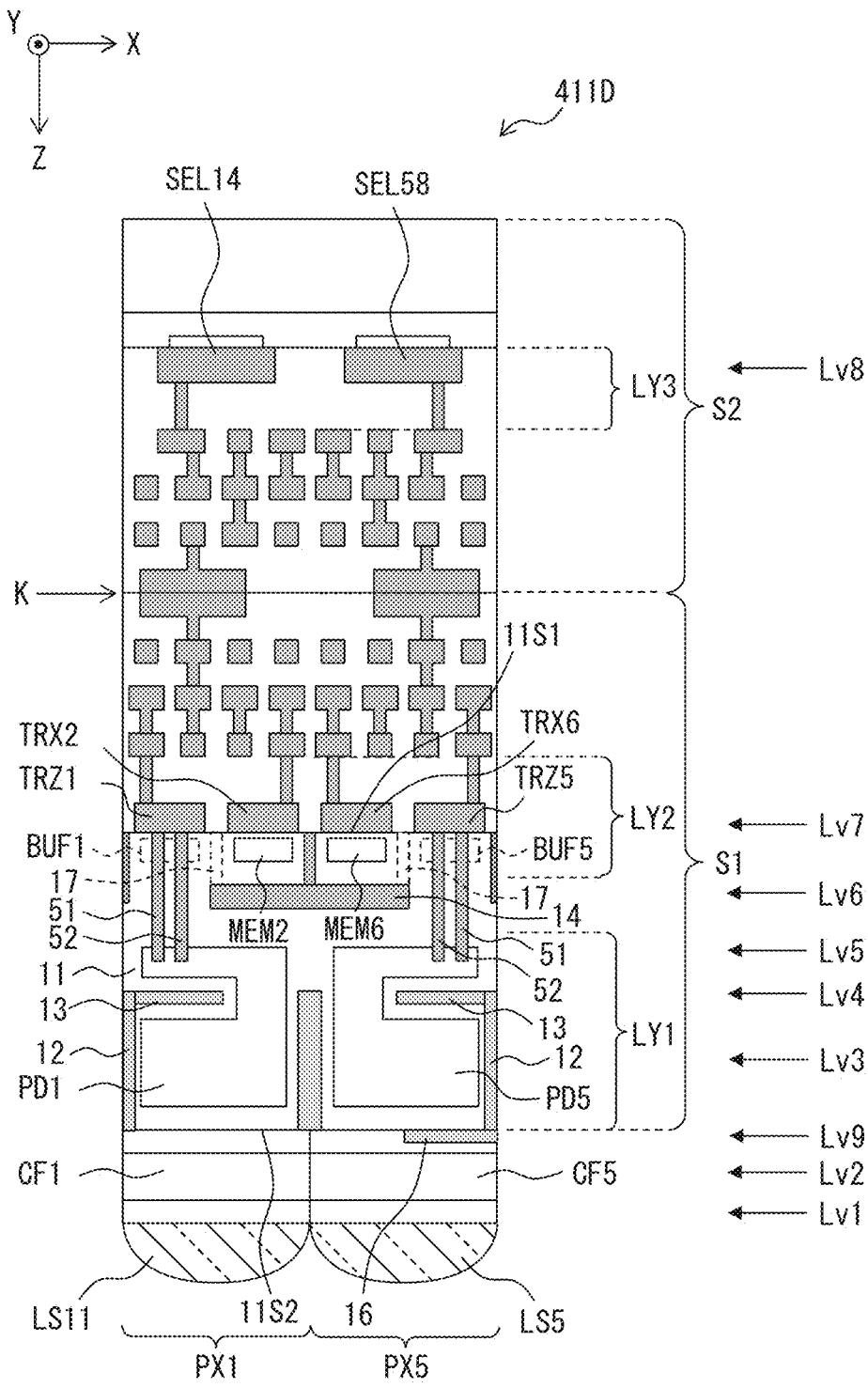

[FIG. 21B]
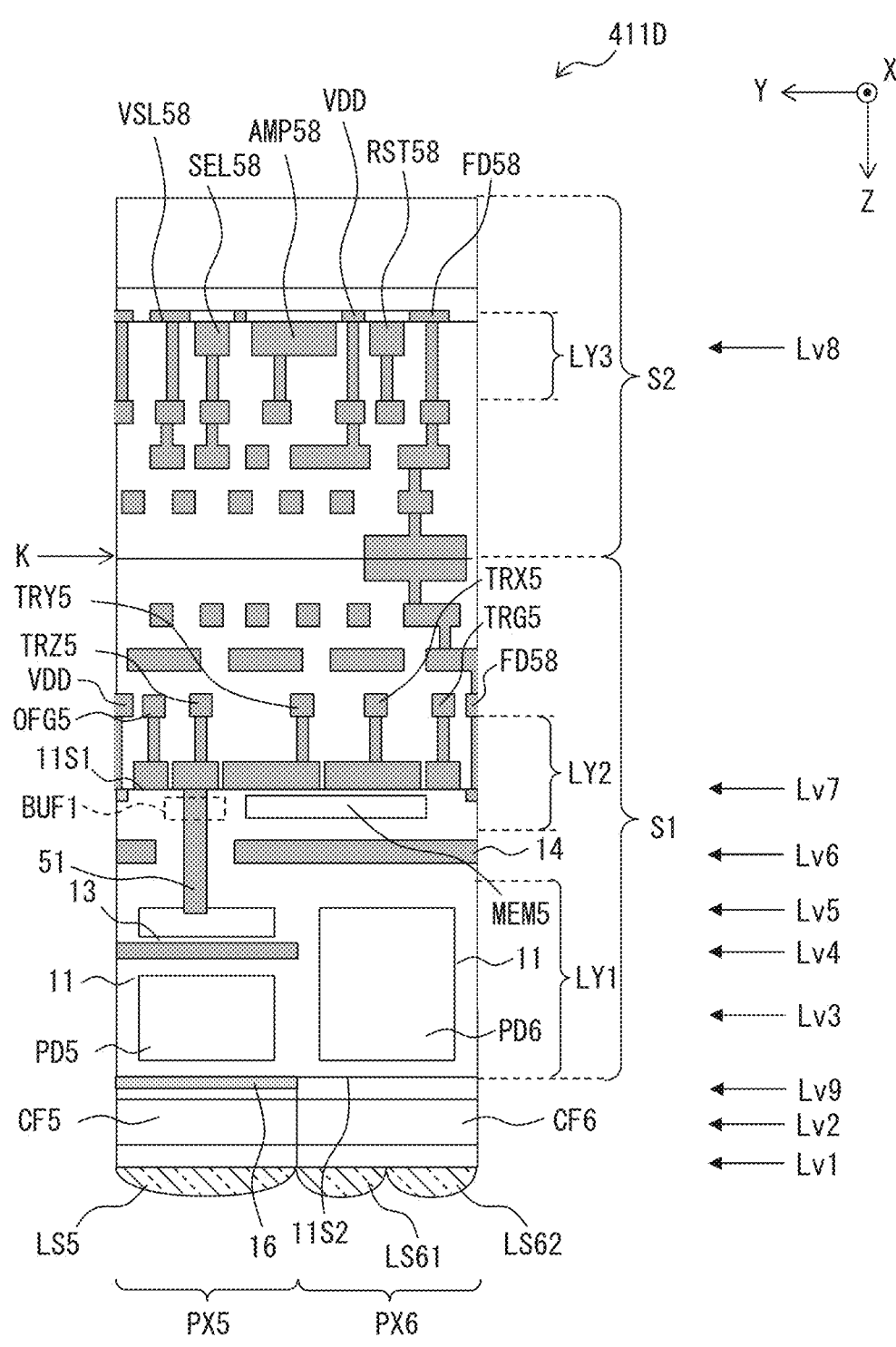

[FIG. 22A]
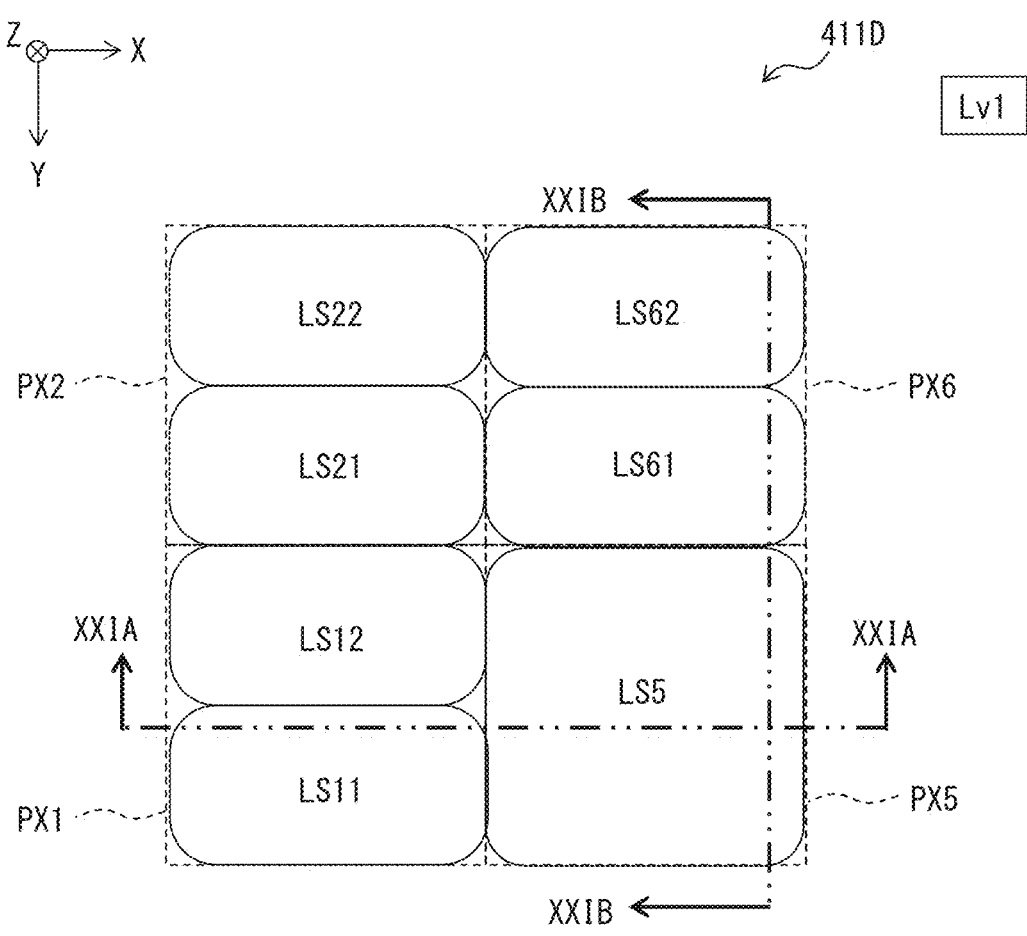

[FIG. 22B]
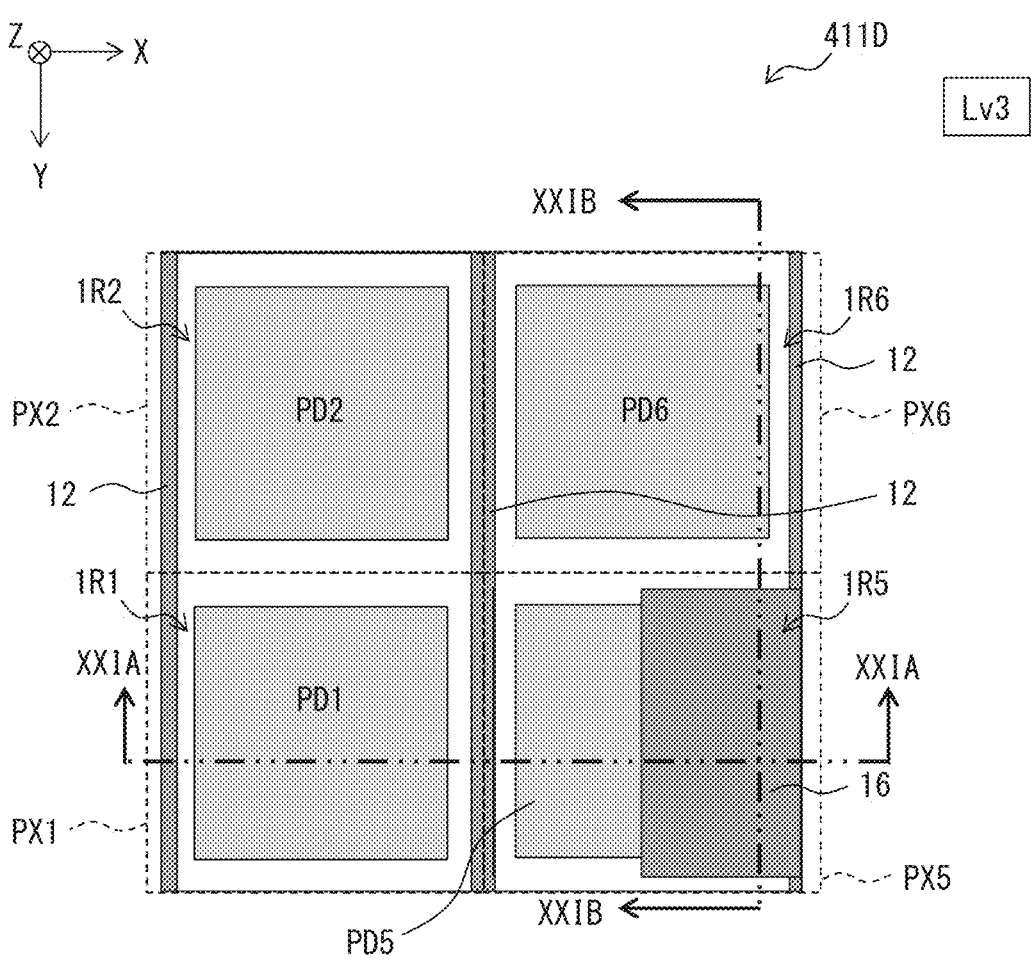

[FIG. 23A]
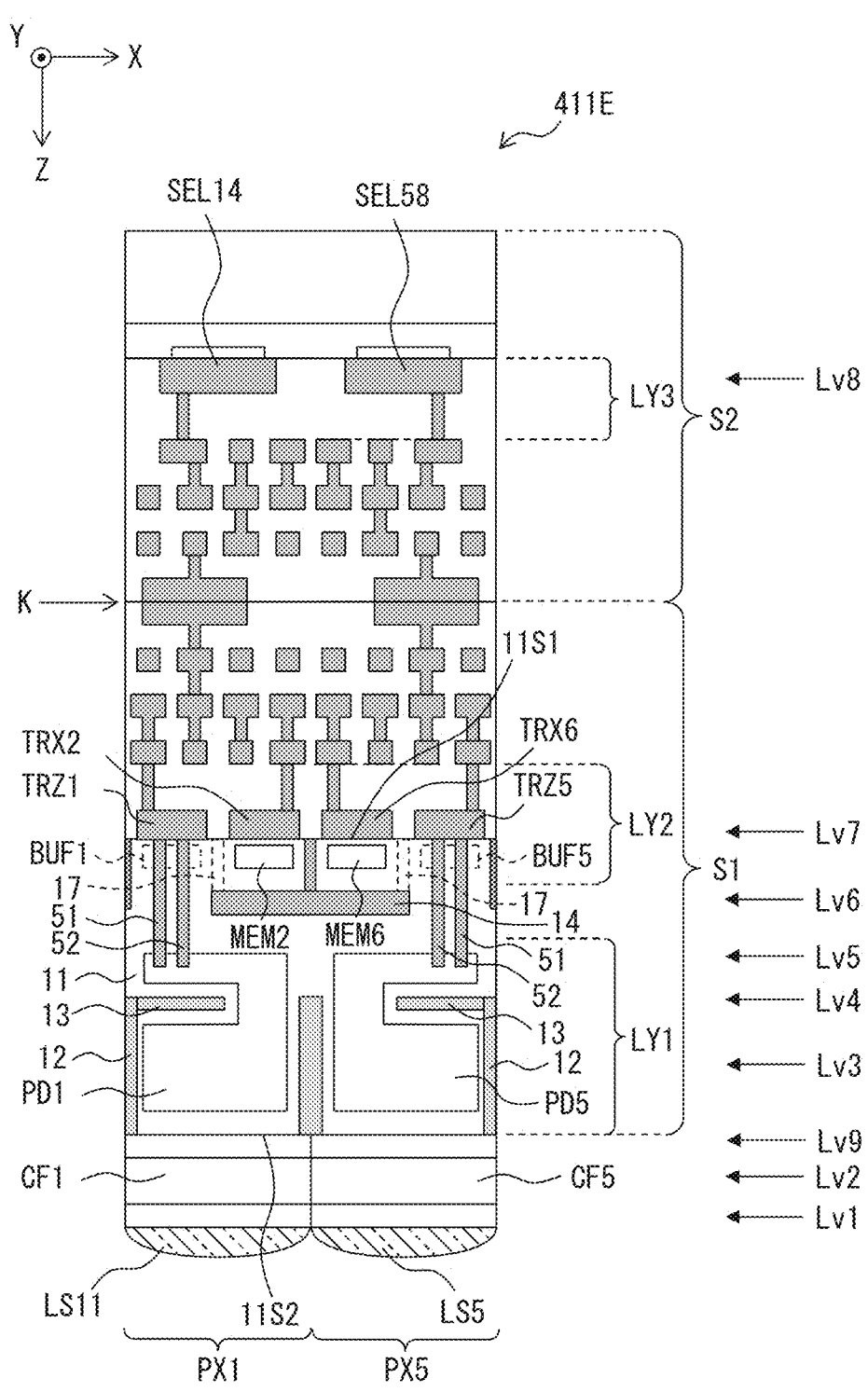

[FIG. 23B]
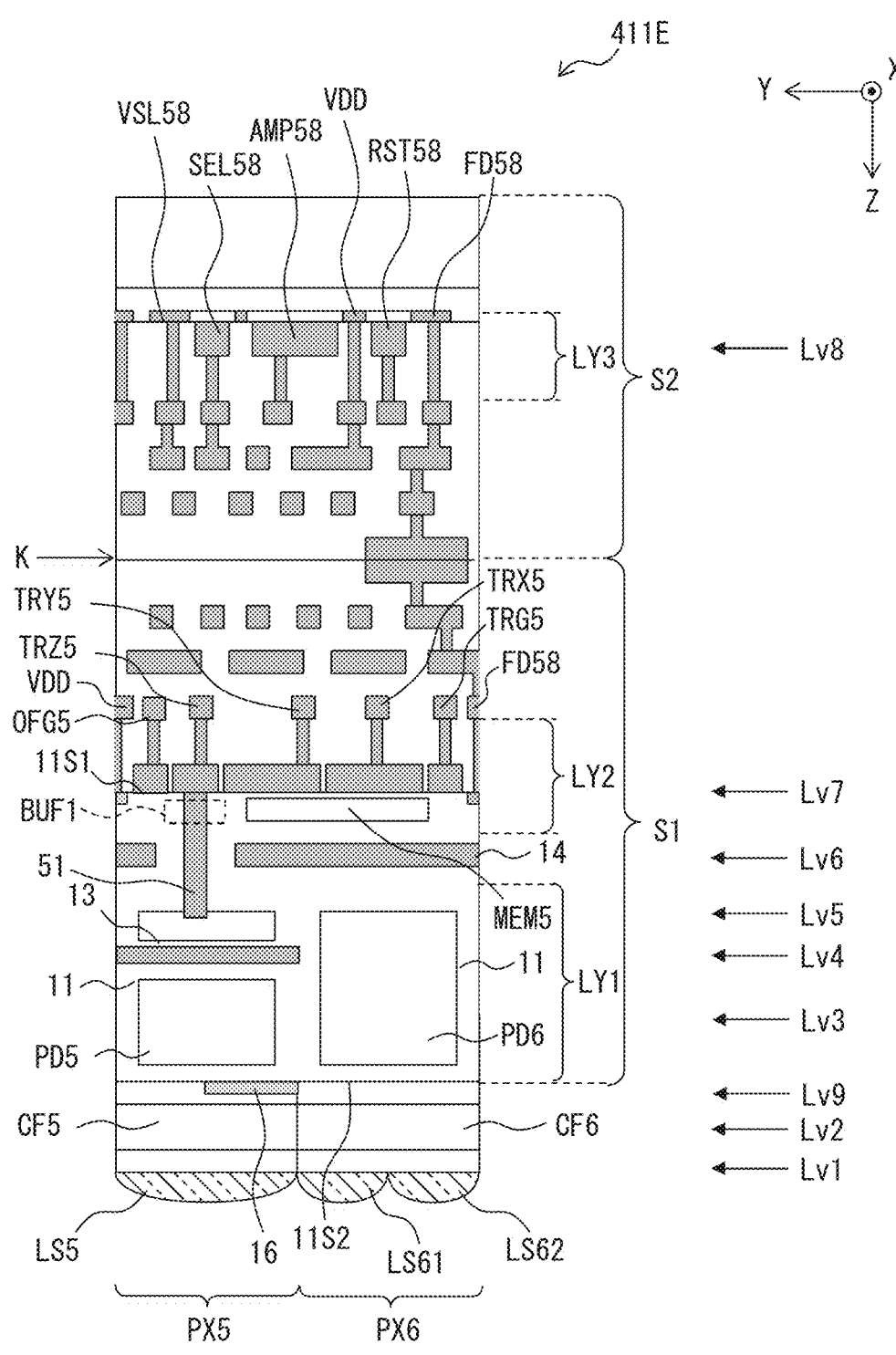

[FIG. 24A]
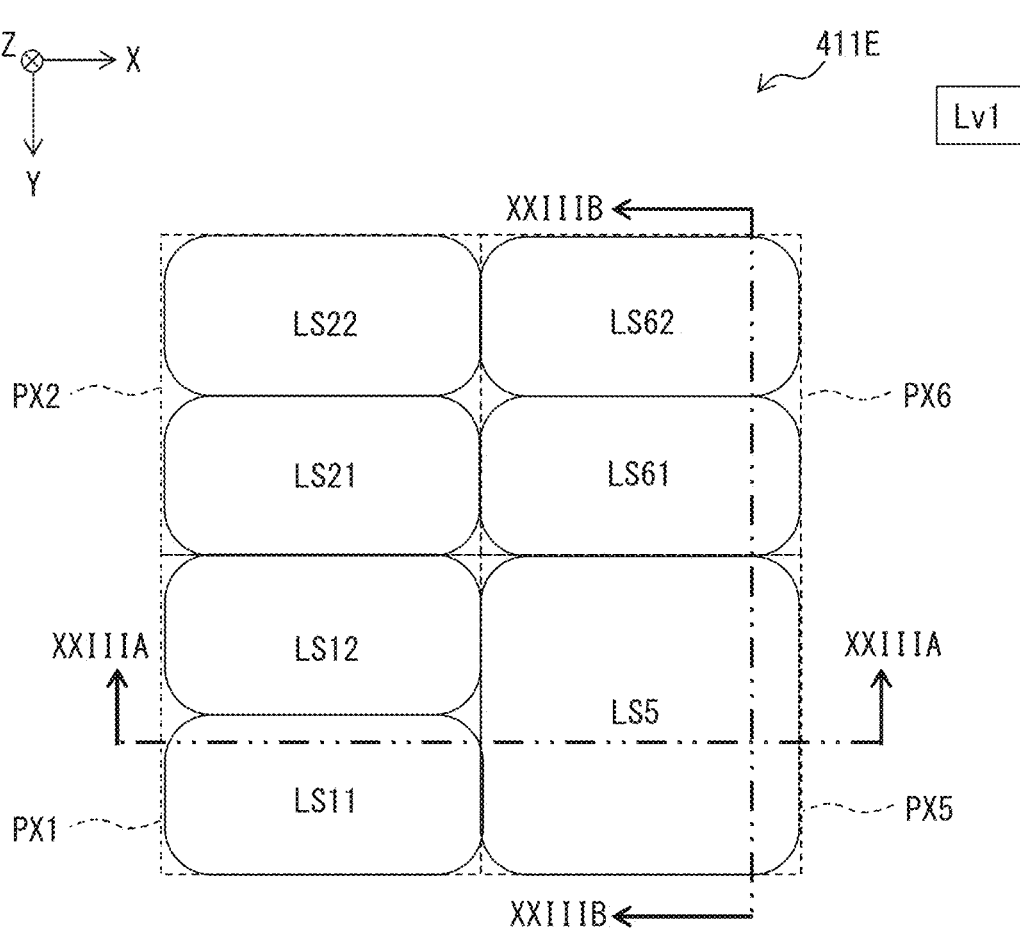

[FIG. 24B]
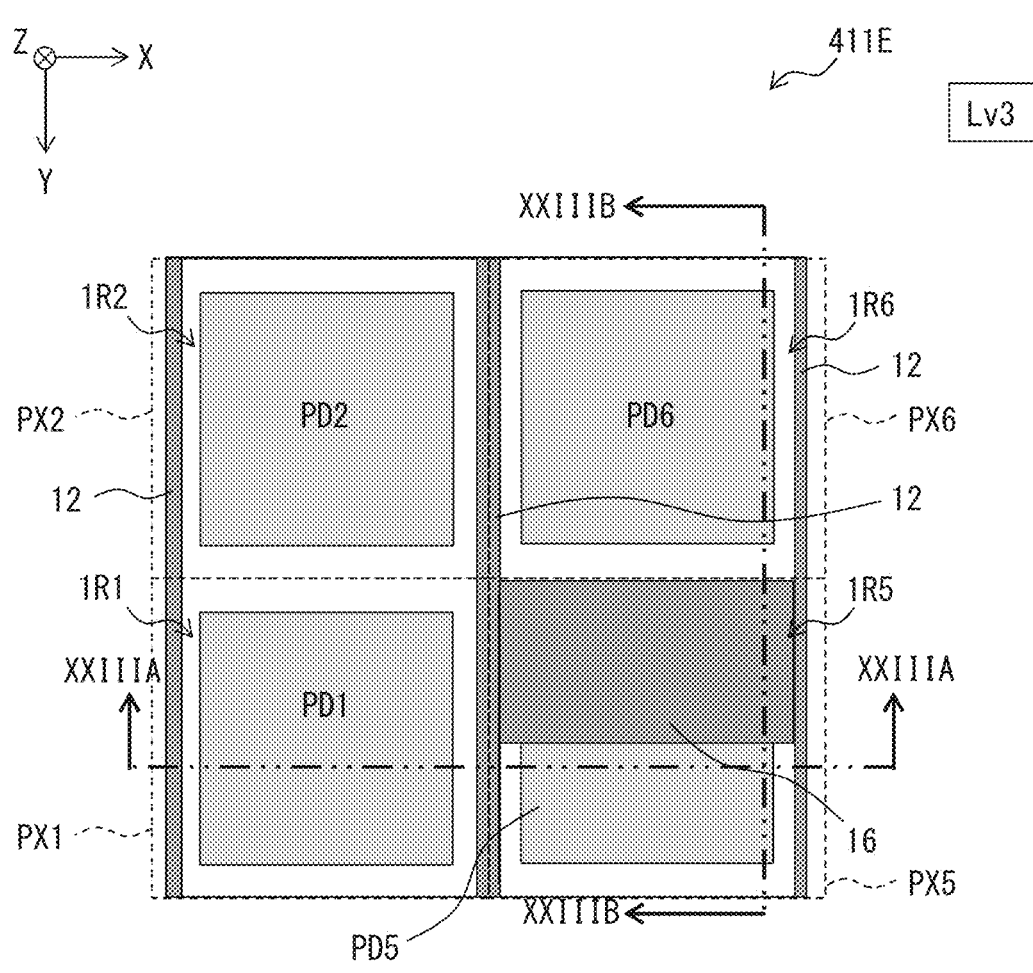

[FIG. 25]
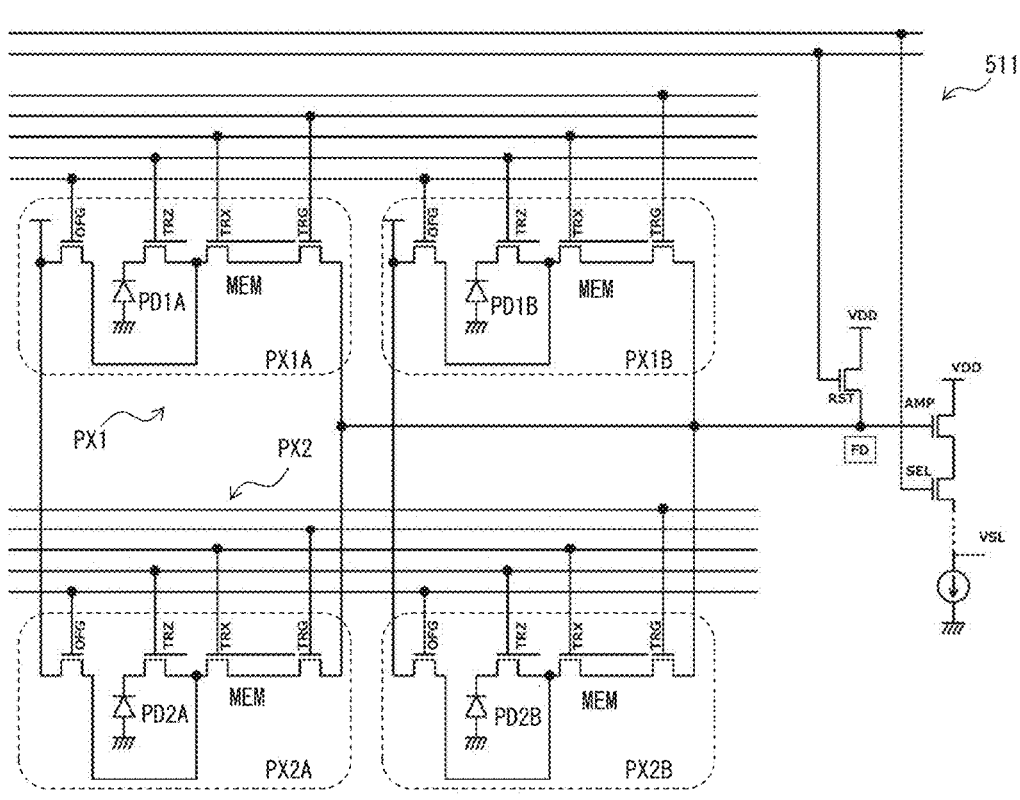

[FIG. 26A]
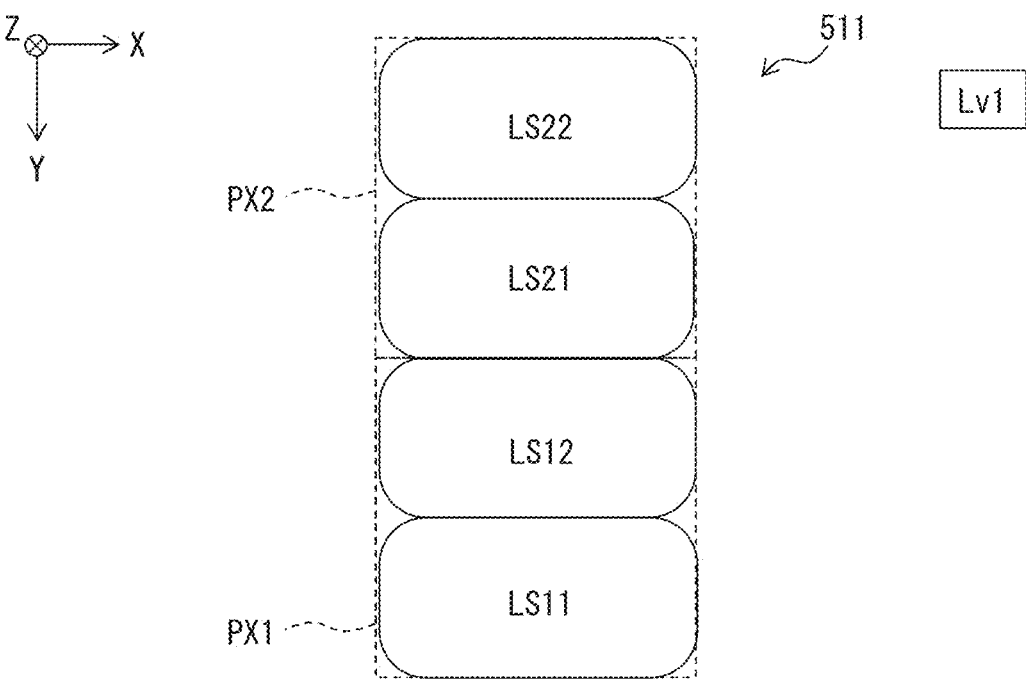
[FIG. 26B]
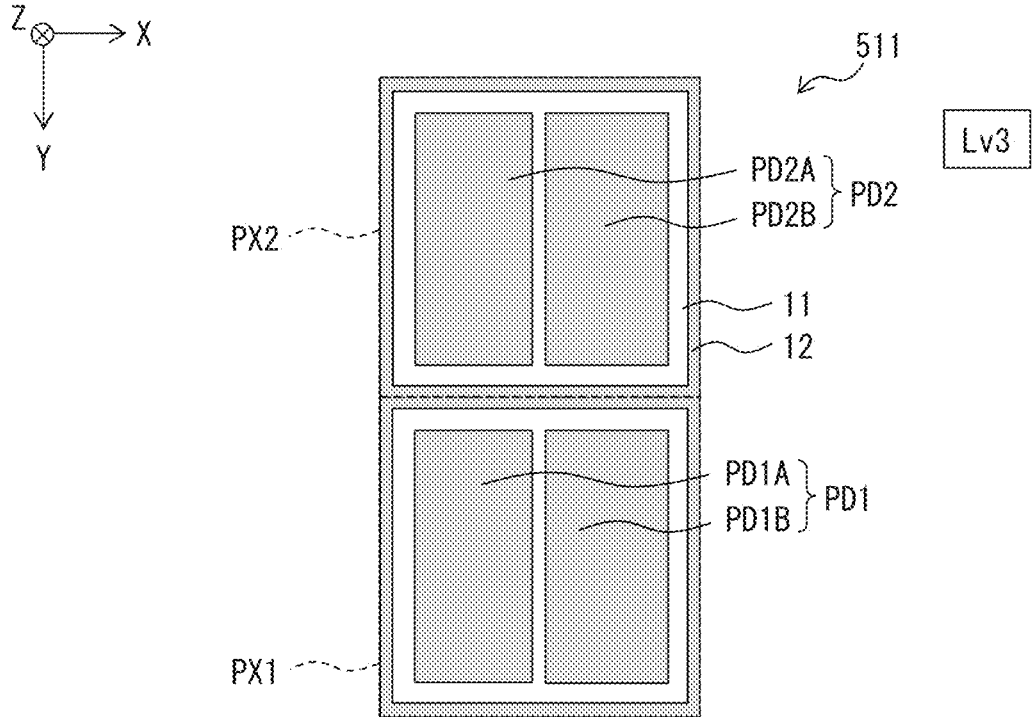

[FIG. 26C]
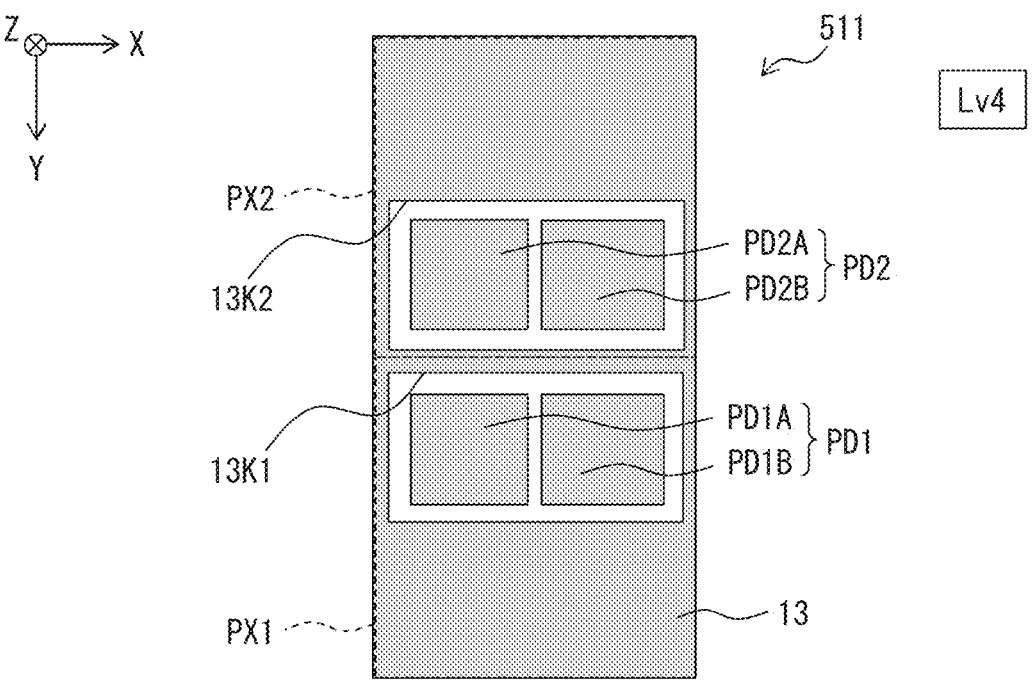
[FIG. 26D]
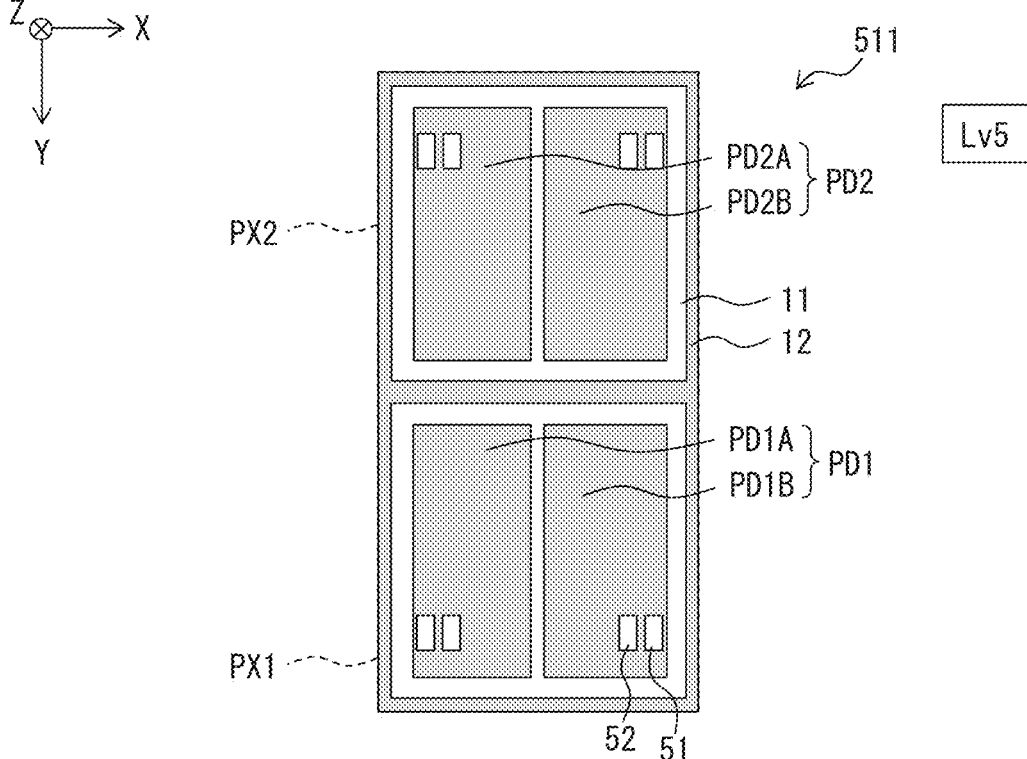

[FIG. 26E]
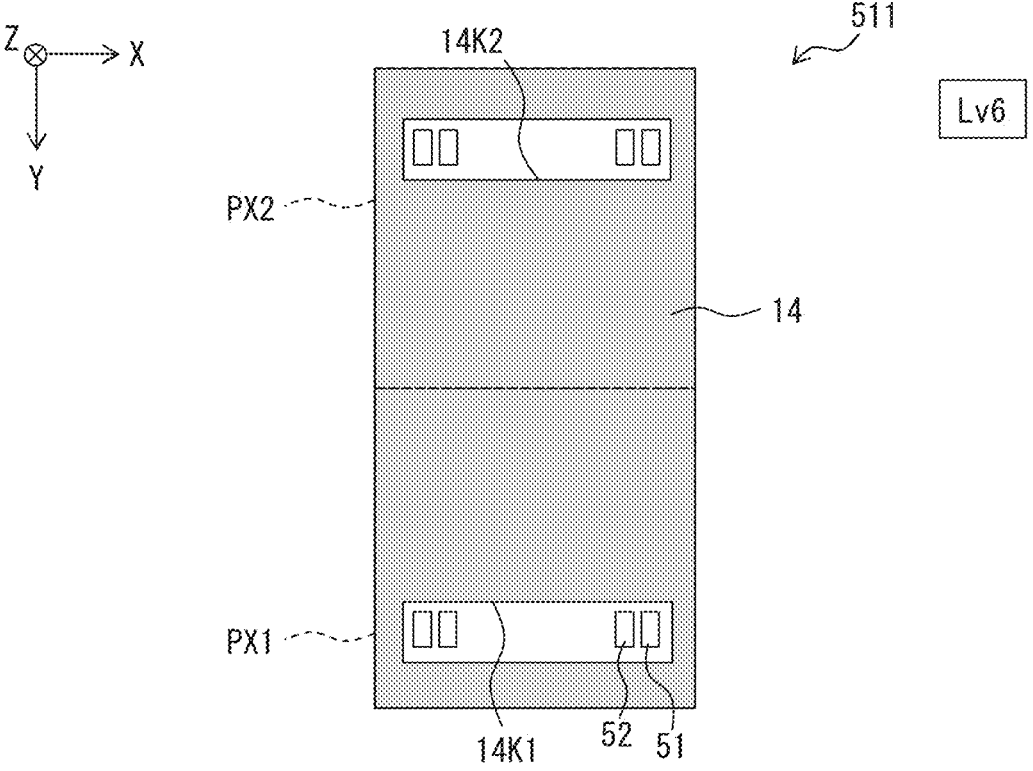
[FIG. 26F]
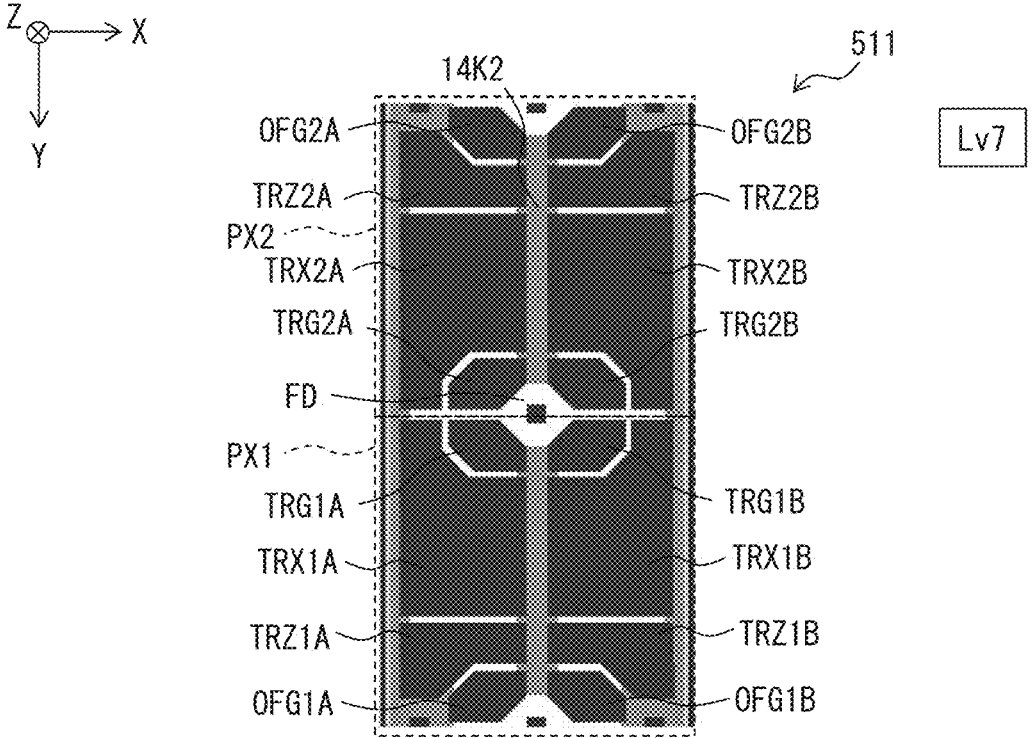

[FIG. 26G]
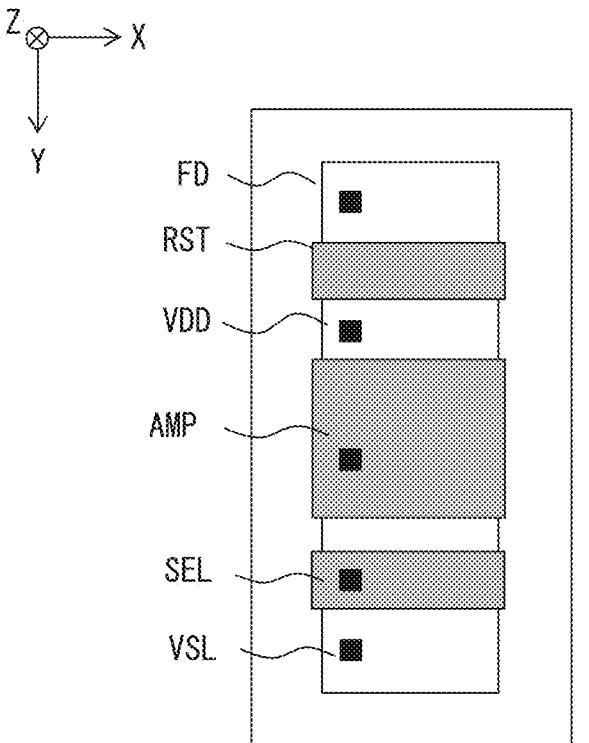
Lv8

[FIG. 27]
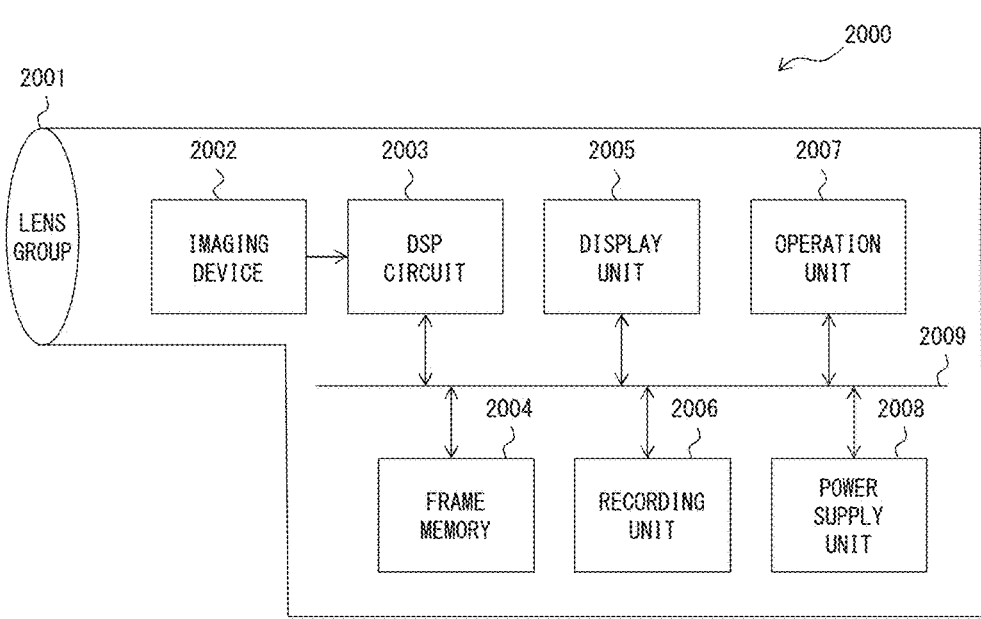

[FIG. 28]
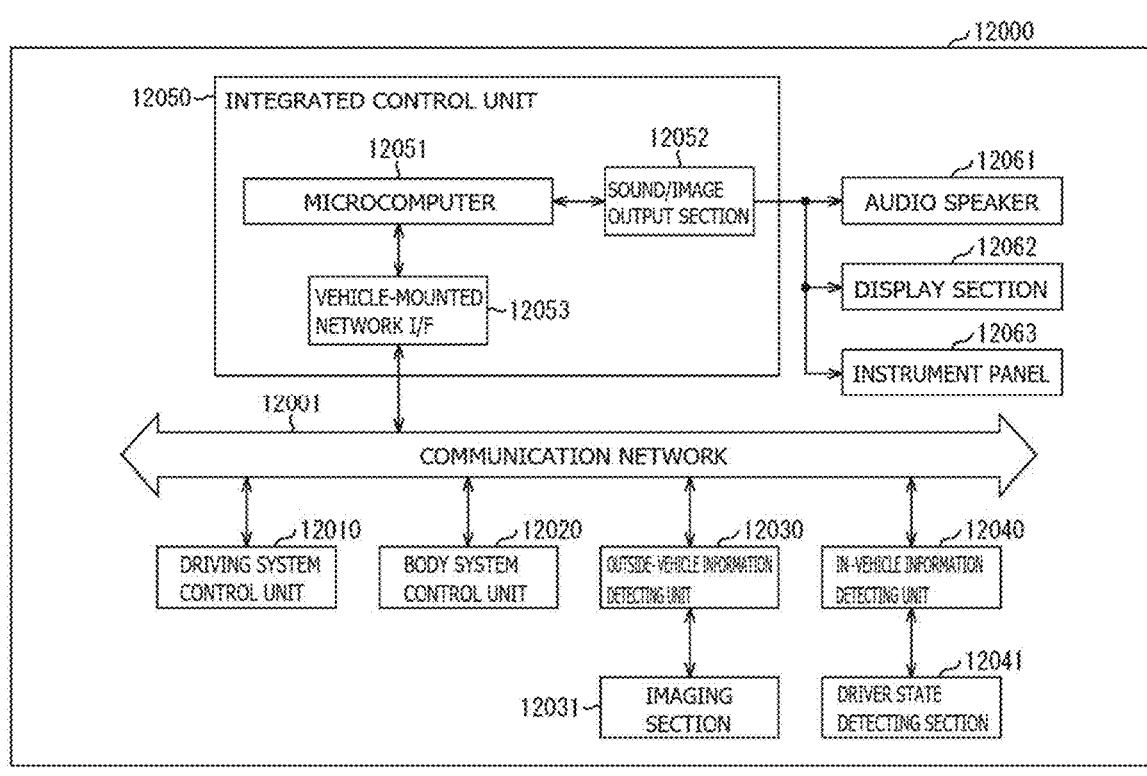

[FIG. 29]
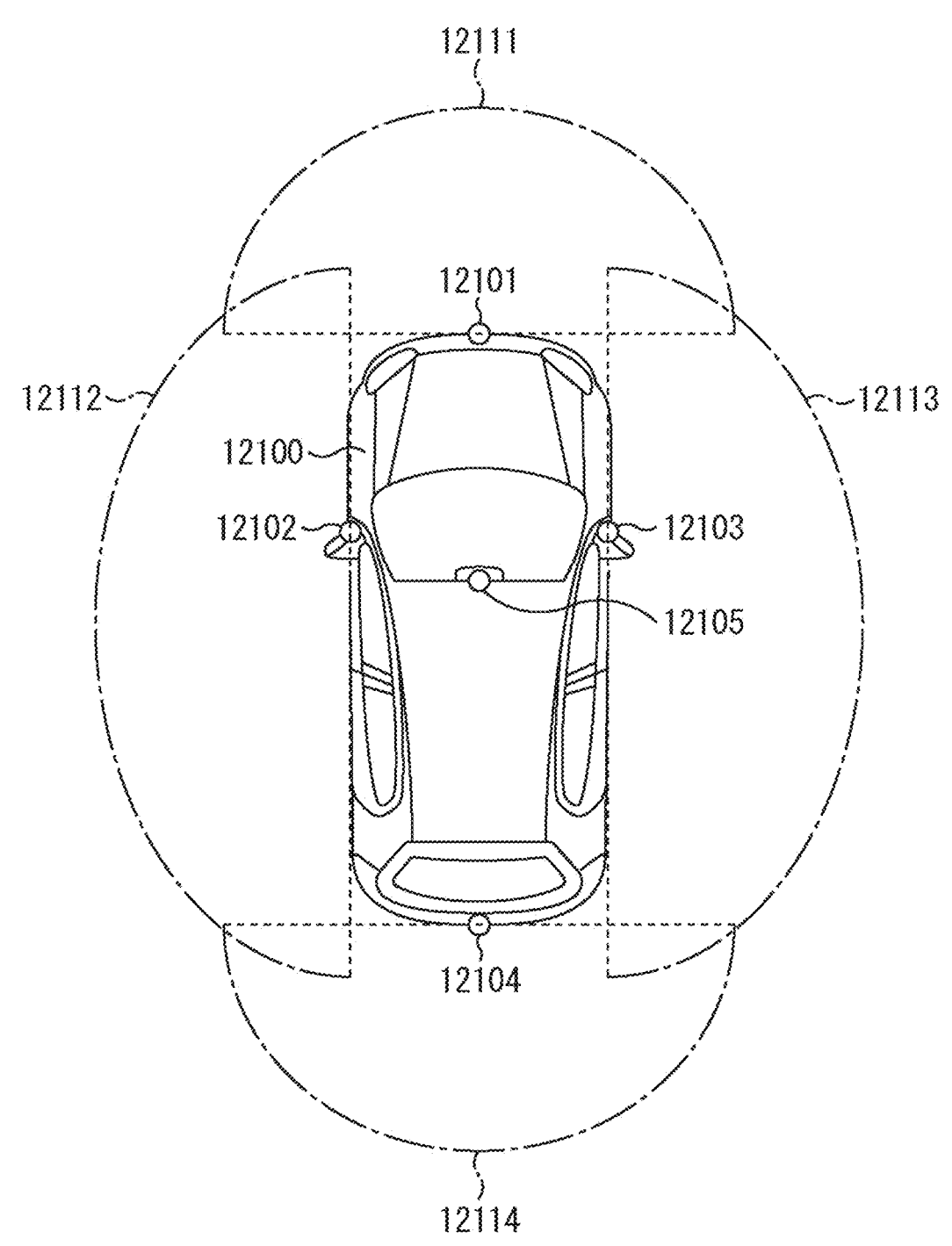

[FIG. 30A]
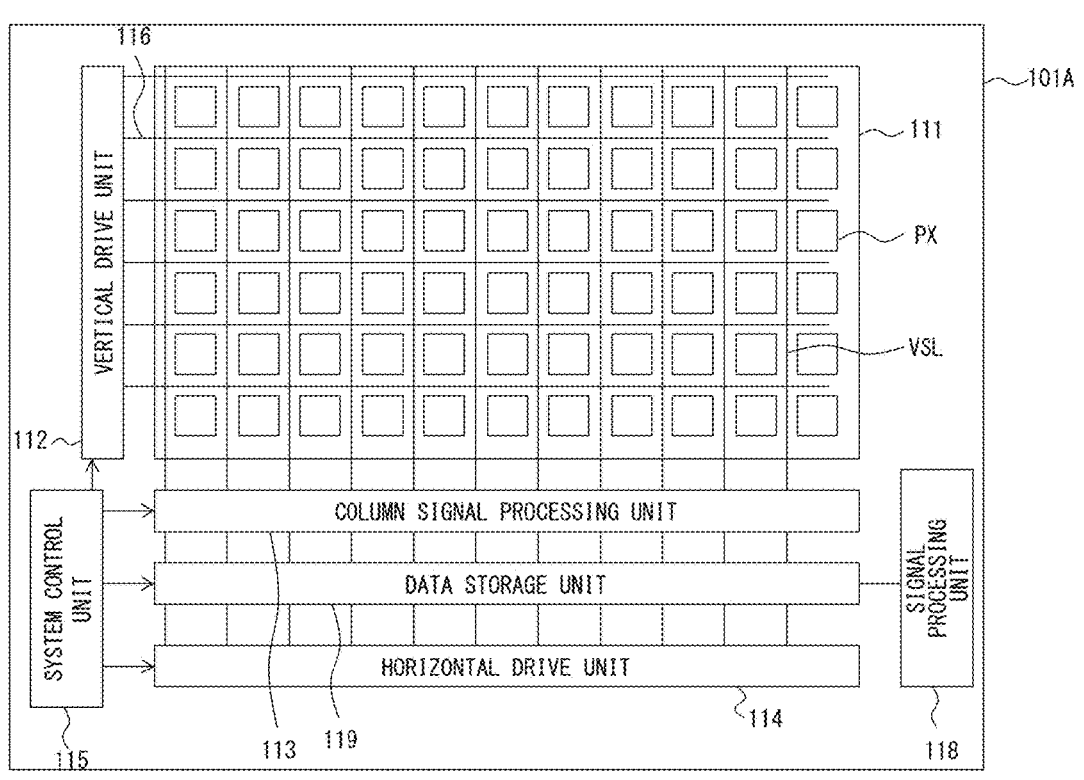

[FIG. 30B]
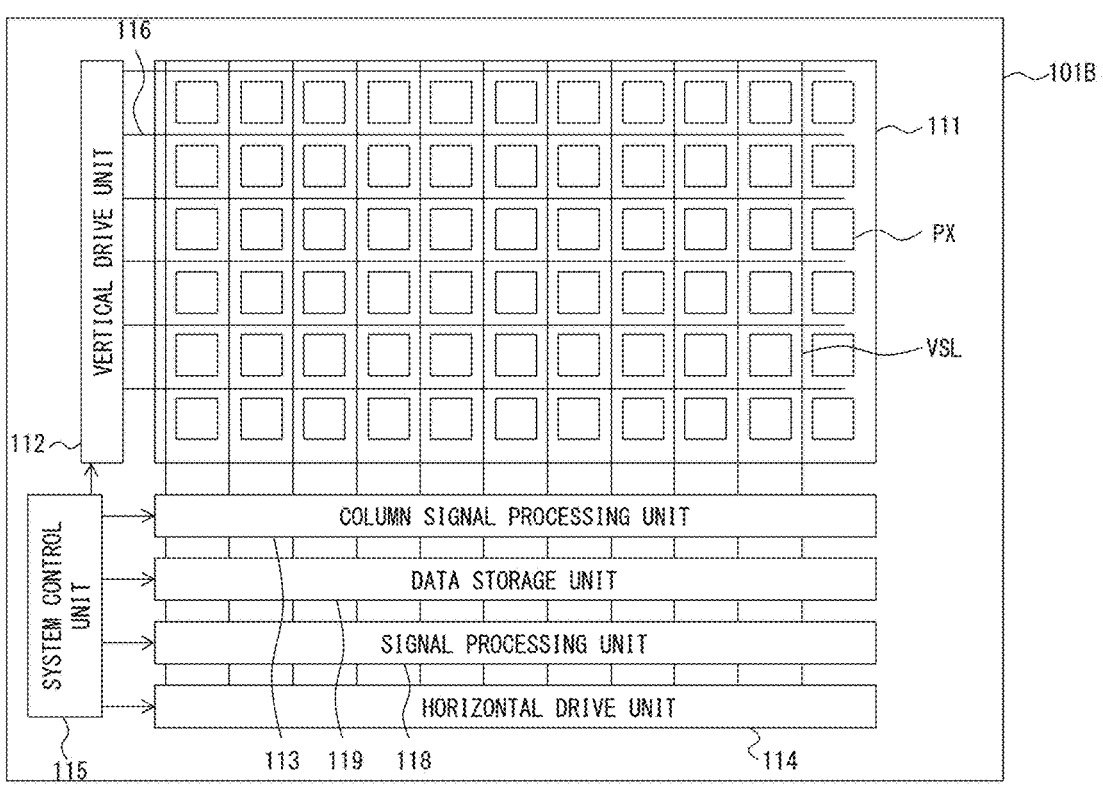

[FIG. 31]
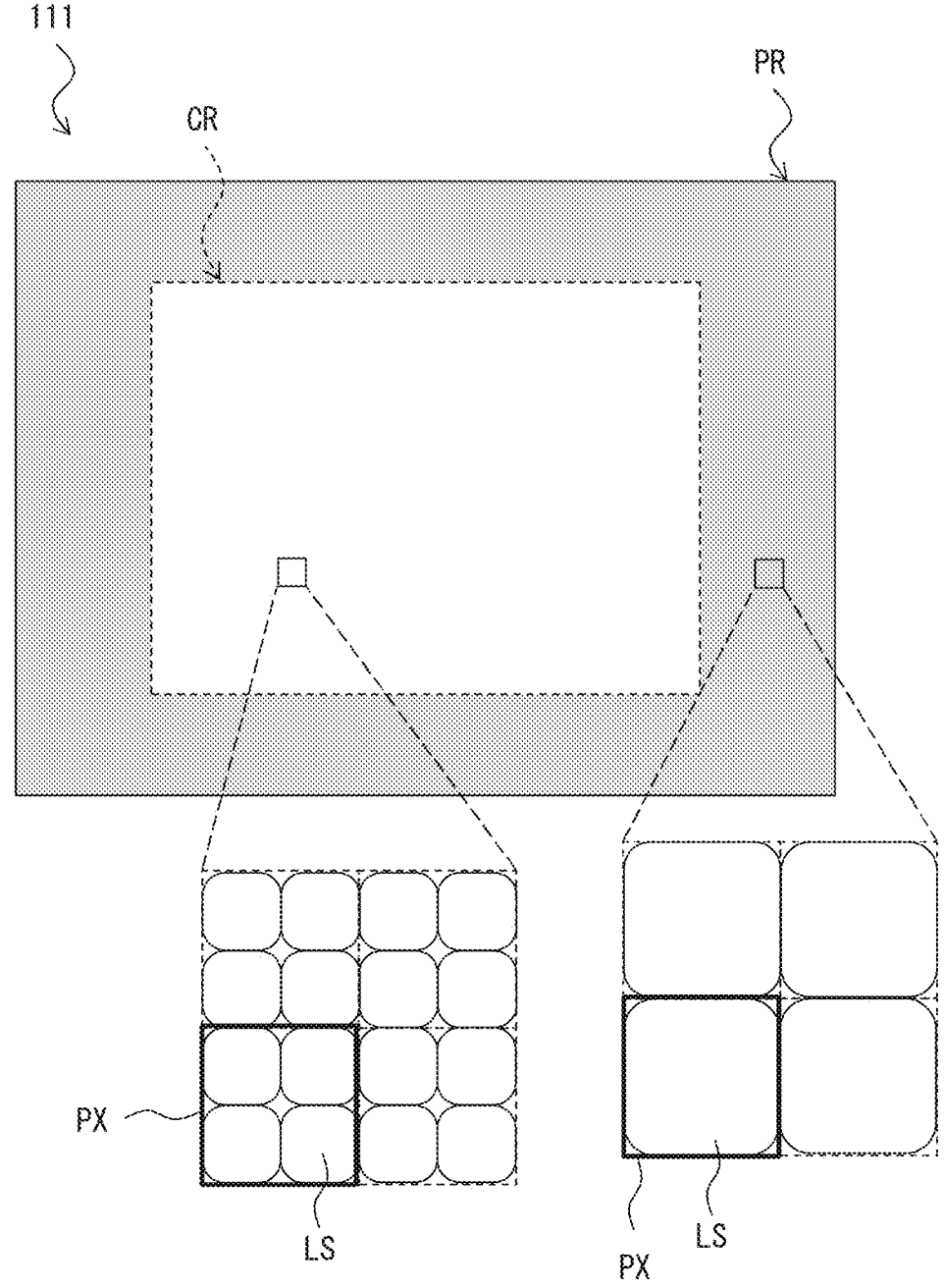

[FIG. 32A]
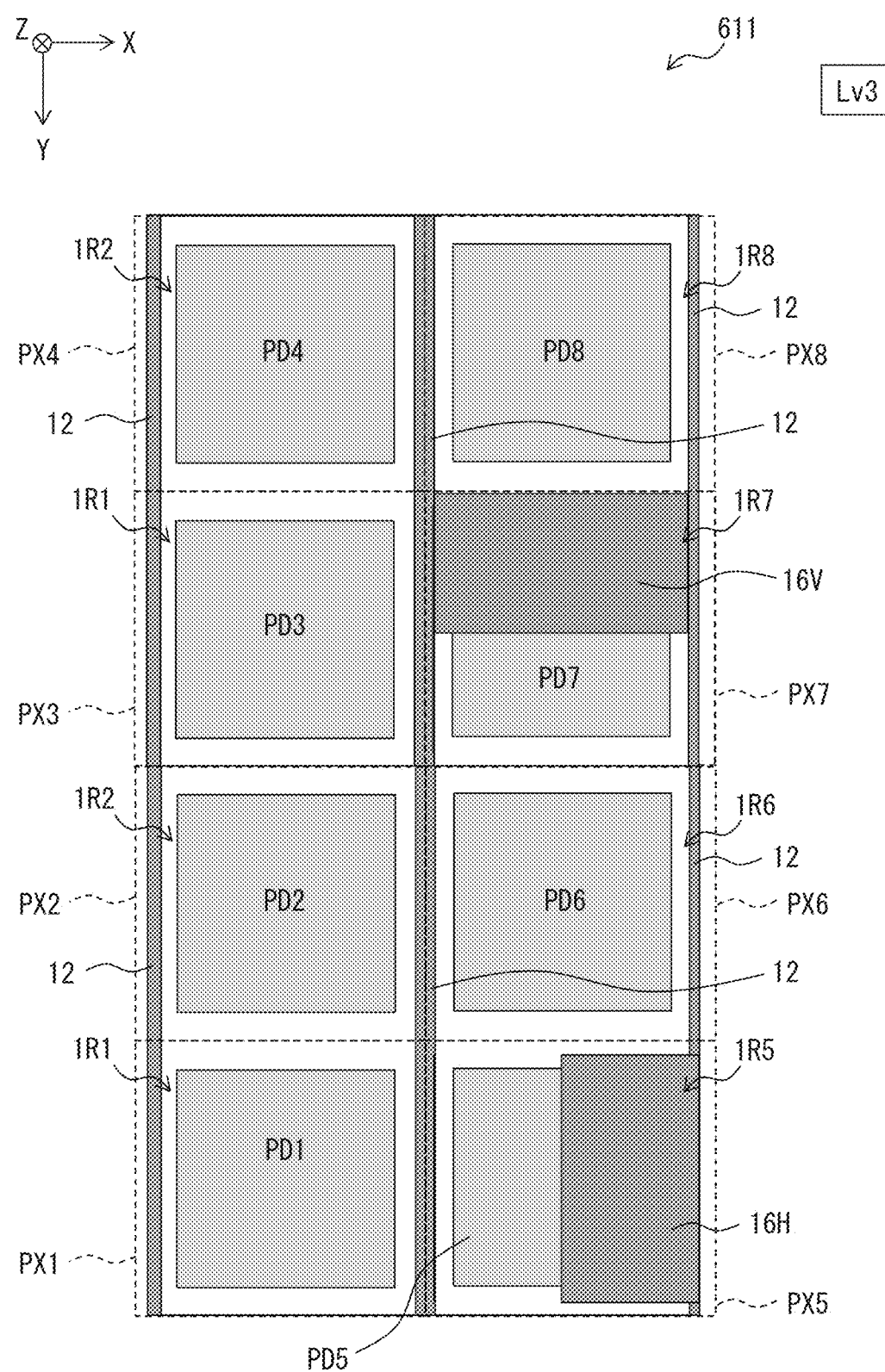

[FIG. 32B]
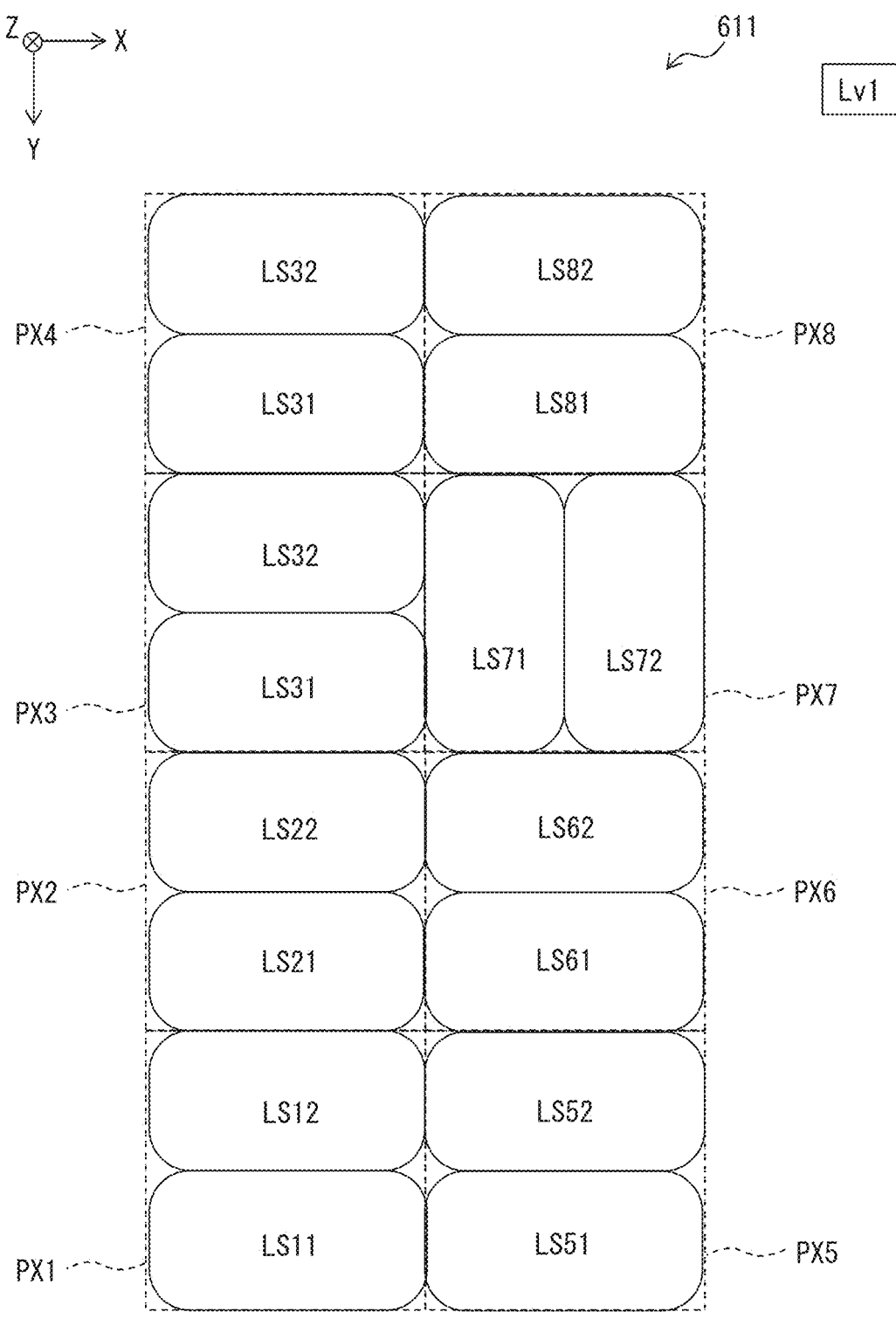

[FIG. 33]
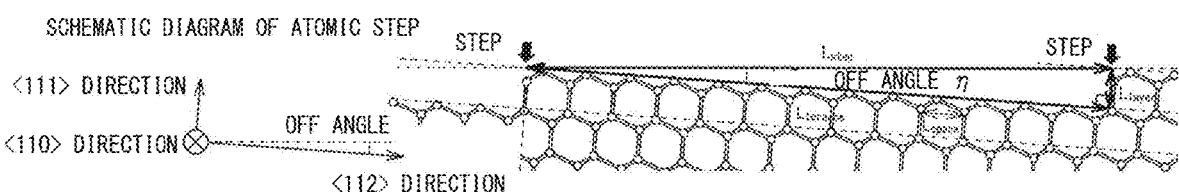
SCHEMATIC DIAGRAM OF ATOMIC STEP
〈111〉 DIRECTION
〈110〉 DIRECTION
〈112〉 DIRECTION
OFF ANGLE

IMAGING DEVICE AND ELECTRONIC APPARATUS INCLUDING LIGHT CONDENSING OPTICAL SYSTEM FOR REDUCING PARASITIC LIGHT SENSITIVITY

CROSS REFERENCE TO RELATED APPLICATIONS

This application is a U.S. National Phase of International Patent Application No. PCT/JP2020/045356 filed on Dec. 5, 2020, which claims priority benefit of Japanese Patent Application No. JP 2019-225188 filed in the Japan Patent Office on Dec. 13, 2019. Each of the above-referenced applications is hereby incorporated herein by reference in its entirety.

TECHNICAL FIELD

The present disclosure relates to an imaging device that performs imaging by performing photoelectric conversion and an electronic apparatus including the imaging device.

BACKGROUND ART

The applicant of the present application has proposed an imaging device including a silicon substrate having a stacked structure in which a photodiode and a memory are stacked in a light incidence direction (see, for example, PTL 1).

CITATION LIST

Patent Literature

PTL 1: International Publication No. WO 2016/136486

SUMMARY OF THE INVENTION

Incidentally, such an imaging device is requested to have further higher imaging performance. It is thus desirable to provide an imaging device that makes it possible to further increase imaging performance and an electronic apparatus including such an imaging device.

An imaging device according to an embodiment of the present disclosure includes, in an effective pixel region extending along a first surface, a condensing optical system that condenses incident light, a photoelectric conversion unit configured to generate electric charge through photoelectric conversion; an electric charge holding unit configured to hold the electric charge transferred from the photoelectric conversion unit; and a first light shielding film that is provided between the photoelectric conversion unit and the electric charge holding unit in a thickness direction orthogonal to the first surface. The electric charge corresponds to an amount of the incident light passing through the condensing optical system. The first light shielding film blocks incident light. Here, the condensing optical system condenses the incident light at a position in the effective pixel region. The position overlaps with the first light shielding film in the thickness direction. It is to be noted that the effective pixel region refers to a region that allows incident light to be received.

In addition, an electronic apparatus according to an embodiment of the present disclosure includes the imaging device described above.

BRIEF DESCRIPTION OF DRAWING

FIG. 1 is a block diagram illustrating a configuration example of an imaging device according to a first embodiment of the present disclosure.

FIG. 2 is a circuit diagram illustrating a circuit configuration of one sensor pixel in the imaging device illustrated in FIG. 1.

FIG. 3A is a first schematic cross-sectional view of a cross section along a stack direction of two sensor pixels adjacent in a solid-state imaging device illustrated in FIG. 1.

FIG. 3B is a second schematic cross-sectional view of the cross section along the stack direction of the two sensor pixels adjacent in the solid-state imaging device illustrated in FIG. 1.

FIG. 4A is a first schematic plan view of a planar configuration of a portion of the sensor pixels in the solid-state imaging device illustrated in FIG. 1.

FIG. 4B is a second schematic plan view of the planar configuration of the portion of the sensor pixels in the solid-state imaging device illustrated in FIG. 1.

FIG. 4C is a third schematic plan view of the planar configuration of the portion of the sensor pixels in the solid-state imaging device illustrated in FIG. 1.

FIG. 4D is a fourth schematic plan view of the planar configuration of the portion of the sensor pixels in the solid-state imaging device illustrated in FIG. 1.

FIG. 4E is a fifth schematic plan view of the planar configuration of the portion of the sensor pixels in the solid-state imaging device illustrated in FIG. 1.

FIG. 4F is a sixth schematic plan view of the planar configuration of the portion of the sensor pixels in the solid-state imaging device illustrated in FIG. 1.

FIG. 4G is a seventh schematic plan view of the planar configuration of the portion of the sensor pixels in the solid-state imaging device illustrated in FIG. 1.

FIG. 4H is an eighth schematic plan view of the planar configuration of the portion of the sensor pixels in the solid-state imaging device illustrated in FIG. 1.

FIG. 5A is a schematic cross-sectional view of a path of light entering a sensor pixel in a solid-state imaging device according to a reference example.

FIG. 5B is a schematic cross-sectional view of a path of light entering the sensor pixel illustrated in FIG. 3A.

FIG. 6A is a plan view schematically illustrating a first modification example of an arrangement pattern of lenses in the solid-state imaging device according to the first embodiment.

FIG. 6B is a plan view schematically illustrating a second modification example of the arrangement pattern of the lenses in the solid-state imaging device according to the first embodiment.

FIG. 6C is a plan view schematically illustrating a third modification example of the arrangement pattern of the lenses in the solid-state imaging device according to the first embodiment.

FIG. 6D is a plan view schematically illustrating a fourth modification example of the arrangement pattern of the lenses in the solid-state imaging device according to the first embodiment.

FIG. 6E is a plan view schematically illustrating a fifth modification example of the arrangement pattern of the lenses in the solid-state imaging device according to the first embodiment.

FIG. 6F is a plan view schematically illustrating a sixth modification example of the arrangement pattern of the lenses in the solid-state imaging device according to the first embodiment.

FIG. 6G is a plan view schematically illustrating a seventh modification example of the arrangement pattern of the lenses in the solid-state imaging device according to the first embodiment.

FIG. 6H is a plan view schematically illustrating an eighth modification example of the arrangement pattern of the lenses in the solid-state imaging device according to the first embodiment.

FIG. 6I is a plan view schematically illustrating a ninth modification example of the arrangement pattern of the lenses in the solid-state imaging device according to the first embodiment.

FIG. 7A is a first schematic cross-sectional view of a cross section taken along a stack direction of two sensor pixels adjacent in a pixel array unit according to a second embodiment of the present disclosure.

FIG. 7B is a second schematic cross-sectional view of the cross section taken along the stack direction of the two sensor pixels adjacent in the pixel array unit according to the second embodiment of the present disclosure.

FIG. 8A is a first schematic plan view of a planar configuration of a portion of the sensor pixels in the solid-state imaging device illustrated in FIG. 7A.

FIG. 8B is a second schematic plan view of the planar configuration of the portion of the sensor pixels in the solid-state imaging device illustrated in FIG. 7B.

FIG. 9A is a first schematic cross-sectional view of a cross section taken along a stack direction of two sensor pixels adjacent in a pixel array unit according to a third embodiment of the present disclosure.

FIG. 9B is a second schematic cross-sectional view of the cross section taken along the stack direction of the two sensor pixels adjacent in the pixel array unit according to the third embodiment of the present disclosure.

FIG. 10A is a first schematic cross-sectional view of a cross section taken along a stack direction of two sensor pixels adjacent in a pixel array unit according to a first modification example of the third embodiment of the present disclosure.

FIG. 10B is a second schematic cross-sectional view of the cross section taken along the stack direction of the two sensor pixels adjacent in the pixel array unit according to the first modification example of the third embodiment of the present disclosure.

FIG. 11A is a first schematic cross-sectional view of a cross section taken along a stack direction of two sensor pixels adjacent in a pixel array unit according to a second modification example of the third embodiment of the present disclosure.

FIG. 11B is a second schematic cross-sectional view of the cross section taken along the stack direction of the two sensor pixels adjacent in the pixel array unit according to the second modification example of the third embodiment of the present disclosure.

FIG. 12A is a first schematic cross-sectional view of a cross section taken along a stack direction of two sensor pixels adjacent in a pixel array unit according to a third modification example of the third embodiment of the present disclosure.

FIG. 12B is a second schematic cross-sectional view of the cross section taken along the stack direction of the two sensor pixels adjacent in the pixel array unit according to the third modification example of the third embodiment of the present disclosure.

FIG. 13A is a first schematic cross-sectional view of a cross section taken along a stack direction of two sensor pixels adjacent in a pixel array unit according to a fourth embodiment of the present disclosure.

FIG. 13B is a second schematic cross-sectional view of the cross section taken along the stack direction of the two sensor pixels adjacent in the pixel array unit according to the fourth embodiment of the present disclosure.

FIG. 14A is a first schematic plan view of a planar configuration of a portion of the sensor pixels in the solid-state imaging device illustrated in FIG. 13A.

FIG. 14B is a second schematic plan view of the planar configuration of the portion of the sensor pixels in the solid-state imaging device illustrated in FIG. 13B.

FIG. 15A is a first schematic cross-sectional view of a cross section taken along a stack direction of two sensor pixels adjacent in a pixel array unit according to a first modification example of the fourth embodiment of the present disclosure.

FIG. 15B is a second schematic cross-sectional view of the cross section taken along the stack direction of the two sensor pixels adjacent in the pixel array unit according to the first modification example of the fourth embodiment of the present disclosure.

FIG. 16A is a first schematic plan view of a planar configuration of a portion of the sensor pixels in the solid-state imaging device illustrated in FIG. 15A.

FIG. 16B is a second schematic plan view of the planar configuration of the portion of the sensor pixels in the solid-state imaging device illustrated in FIG. 15B.

FIG. 17A is a first schematic cross-sectional view of a cross section taken along a stack direction of two sensor pixels adjacent in a pixel array unit according to a second modification example of the fourth embodiment of the present disclosure.

FIG. 17B is a second schematic cross-sectional view of the cross section taken along the stack direction of the two sensor pixels adjacent in the pixel array unit according to the second modification example of the fourth embodiment of the present disclosure.

FIG. 18A is a first schematic plan view of a planar configuration of a portion of the sensor pixels in the solid-state imaging device illustrated in FIG. 17A.

FIG. 18B is a second schematic plan view of the planar configuration of the portion of the sensor pixels in the solid-state imaging device illustrated in FIG. 17B.

FIG. 19A is a first schematic cross-sectional view of a cross section taken along a stack direction of two sensor pixels adjacent in a pixel array unit according to a third modification example of the fourth embodiment of the present disclosure.

FIG. 19B is a second schematic cross-sectional view of the cross section taken along the stack direction of the two sensor pixels adjacent in the pixel array unit according to the third modification example of the fourth embodiment of the present disclosure.

FIG. 20A is a first schematic plan view of a planar configuration of a portion of the sensor pixels in the solid-state imaging device illustrated in FIG. 19A.

FIG. 20B is a second schematic plan view of the planar configuration of the portion of the sensor pixels in the solid-state imaging device illustrated in FIG. 19B.

FIG. 21A is a first schematic cross-sectional view of a cross section taken along a stack direction of two sensor pixels adjacent in a pixel array unit according to a fourth modification example of the fourth embodiment of the present disclosure.

FIG. 21B is a second schematic cross-sectional view of the cross section taken along the stack direction of the two sensor pixels adjacent in the pixel array unit according to the fourth modification example of the fourth embodiment of the present disclosure.

FIG. 22A is a first schematic plan view of a planar configuration of a portion of the sensor pixels in the solid-state imaging device illustrated in FIG. 21A.

FIG. 22B is a second schematic plan view of the planar configuration of the portion of the sensor pixels in the solid-state imaging device illustrated in FIG. 21B.

FIG. 23A is a first schematic cross-sectional view of a cross section taken along a stack direction of two sensor pixels adjacent in a pixel array unit according to a fifth modification example of the fourth embodiment of the present disclosure.

FIG. 23B is a second schematic cross-sectional view of the cross section taken along the stack direction of the two sensor pixels adjacent in the pixel array unit according to the fifth modification example of the fourth embodiment of the present disclosure.

FIG. 24A is a first schematic plan view of a planar configuration of a portion of the sensor pixels in the solid-state imaging device illustrated in FIG. 23A.

FIG. 24B is a second schematic plan view of the planar configuration of the portion of the sensor pixels in the solid-state imaging device illustrated in FIG. 23B.

FIG. 25 is a circuit diagram illustrating a circuit configuration of a sensor pixel in an imaging device according to a fifth embodiment of the present disclosure.

FIG. 26A is a first schematic plan view of a planar configuration of a portion of the sensor pixels in the solid-state imaging device illustrated in FIG. 25.

FIG. 26B is a second schematic plan view of the planar configuration of the portion of the sensor pixels in the solid-state imaging device illustrated in FIG. 1.

FIG. 26C is a third schematic plan view of the planar configuration of the portion of the sensor pixels in the solid-state imaging device illustrated in FIG. 1.

FIG. 26D is a fourth schematic plan view of the planar configuration of the portion of the sensor pixels in the solid-state imaging device illustrated in FIG. 1.

FIG. 26E is a fifth schematic plan view of the planar configuration of the portion of the sensor pixels in the solid-state imaging device illustrated in FIG. 1.

FIG. 26F is a sixth schematic plan view of the planar configuration of the portion of the sensor pixels in the solid-state imaging device illustrated in FIG. 1.

FIG. 26G is a seventh schematic plan view of the planar configuration of the portion of the sensor pixels in the solid-state imaging device illustrated in FIG. 1.

FIG. 27 is a schematic diagram illustrating an overall configuration example of an electronic apparatus.

FIG. 28 is a block diagram depicting an example of schematic configuration of a vehicle control system.

FIG. 29 is a diagram of assistance in explaining an example of installation positions of an outside-vehicle information detecting section and an imaging section.

FIG. 30A is a block diagram illustrating a configuration example of a solid-state imaging device according to another first modification example of the present disclosure.

FIG. 30B is a block diagram illustrating a configuration example of a solid-state imaging device according to another second modification example of the present disclosure.

FIG. 31 is a schematic diagram illustrating a lens arrangement pattern according to another third modification example of the present disclosure.

FIG. 32A is a first plan view illustrating a configuration example of a pixel array unit according to another fourth modification example of the present disclosure.

FIG. 32B is a second plan view illustrating the configuration example of the pixel array unit illustrated in FIG. 32A.

FIG. 33 is a schematic diagram describing an off angle on a front surface of a Si substrate according to the present disclosure.

MODES FOR CARRYING OUT THE INVENTION

An imaging pixel (that is referred to simply as global shutter pixel below) of a global shutter mode as described in PTL 1 described above has a configuration in which a photoelectric conversion unit and an electric charge holding unit are stacked in the thickness direction. The photoelectric conversion unit generates signal charge by receiving incident light and performing photoelectric conversion. The electric charge holding unit holds the signal charge. This causes unnecessary light to easily enter the electric charge holding unit. The entry of such unnecessary light to the electric charge holding unit may cause image signals to deteriorate as noise. Technology has been therefore developed so far that forms a horizontal light shielding film including metal or the like between the photoelectric conversion unit and the electric charge holding unit and suppresses the entry of light to the electric charge holding unit to reduce the PLS (Parasitic Light Sensitivity).

It is, however, necessary to provide an opening in a portion of the horizontal light shielding film to secure a path for transferring signal charge from the photoelectric conversion unit to the electric charge holding unit. Light leaking from the opening may therefore enter the electric charge holding unit, deteriorating the PLS.

The present disclosure has been devised in view of these issues and has an object to provide an imaging device that makes it possible to achieve a further increase in the imaging performance such as a reduction in the PLS and an electronic apparatus including such an imaging device.

The following describes embodiments of the present disclosure in detail with reference to the drawings. It is to be noted that description is given in the following order.

1. First Embodiment

An example of a solid-state imaging device provided with one photoelectric conversion unit and a plurality of condensing optical systems for one pixel.

2. Modification Examples of First Embodiment

A modification example of an arrangement pattern of a plurality of condensing optical systems.

3. Second Embodiment

A first example of a solid-state imaging device having higher oblique incidence sensitivity characteristics.

4. Third Embodiment

A second example of a solid-state imaging device having higher oblique incidence sensitivity characteristics.

5. Modification Examples of Third Embodiment

6. Fourth Embodiment

A first example of a solid-state imaging device including a normal pixel and an image plane phase difference detection pixel.

7. Modification Examples of Fourth Embodiment

8. Fifth Embodiment

An example of a solid-state imaging device provided with two photoelectric conversion units and a plurality of condensing optical systems for one pixel.

9. Example of Application to Electronic Apparatus
10. Example of Application to Mobile Body
11. Other Modification Examples

1. First Embodiment

[Configuration of Solid-State Imaging Device 101]

FIG. 1 is a block diagram illustrating a functional configuration example of a solid-state imaging device 101 according to a first embodiment of the present technology.

The solid-state imaging device 101 is, for example, a back-illuminated image sensor of a so-called global shutter mode such as a CMOS (Complementary Metal Oxide Semiconductor) image sensor. The solid-state imaging device 101 receives light from a subject and performs photoelectric conversion. The solid-state imaging device 101 generates an image signal to capture an image.

The global shutter mode is a mode for performing global exposure in which exposure is basically begun at the same time for all the pixels and is finished at the same time for all the pixels. Here, all the pixels refer to all the pixels in a portion appearing in an image and exclude dummy pixels or the like. In addition, in a case where a time difference or image distortion is small enough to raise no issue, the global shutter mode also includes a mode of changing regions for global exposure while performing global exposure not at the same time for all the pixels, but for a plurality of rows (e.g., several tens of rows). In addition, the global shutter mode also includes a mode of performing global exposure for the pixels in a predetermined region rather than all the pixels in the portion appearing in an image.

The back-illuminated image sensor refers to an image sensor having a configuration in which a photoelectric conversion unit such as a photodiode is provided between a light receiving surface and a wiring layer. The photoelectric conversion unit receives light from a subject and converts the light into an electric signal. Light from a subject enters the light receiving surface. The wiring layer is provided with a wiring line of a transistor or the like that drives each of pixels.

The solid-state imaging device 101 includes, for example, a pixel array unit 111, a vertical drive unit 112, a column signal processing unit 113, a data storage unit 119, a horizontal drive unit 114, a system control unit 115, and a signal processing unit 118.

In the solid-state imaging device 101, the pixel array unit 111 is formed on a semiconductor substrate 11 (that is described below). Peripheral circuits such as the vertical drive unit 112, the column signal processing unit 113, the data storage unit 119, the horizontal drive unit 114, the system control unit 115, and the signal processing unit 118 are provided, for example, on the semiconductor substrate 11 as with the pixel array unit 111.

The pixel array unit 111 includes a plurality of sensor pixels PX each including a photoelectric conversion unit PD (that is described below) that generates electric charge corresponding to the amount of light coming from a subject and accumulates the electric charge. As illustrated in FIG. 1, the sensor pixels PX are arranged in both the horizontal direction (row direction) and the vertical direction (column direction). In the pixel array unit 111, there is provided a pixel drive line 116 in the row direction for each of the pixel rows and there is provided a vertical signal line VSL in the column direction for each of the pixel columns. Each of the pixel rows includes the sensor pixels PX arranged in line in the row direction. Each of the pixel columns includes the sensor pixels PX arranged in line in the column direction.

The vertical drive unit 112 includes a shift register, an address decoder, and the like. The vertical drive unit 112 drives all of the plurality of sensor pixels PX in the pixel array unit 111 at the same time or drives the plurality of sensor pixels PX in the pixel array unit 111 for each of the pixel rows by supplying the plurality of sensor pixels PX with signals or the like through the plurality of pixel drive lines 116.

The signal to be outputted from each unit pixel in the pixel row selectively scanned by the vertical drive unit 112 is supplied to the column signal processing unit 113 through each of the vertical signal lines VSL. The column signal processing unit 113 performs predetermined signal processing on the signal outputted from each unit pixel in the selected row through the vertical signal line VSL for each of the pixel columns of the pixel array unit 111 and temporarily holds the pixel signal that has been subjected to the signal processing.

Specifically, the column signal processing unit 113 includes, for example, a shift register, an address decoder, and the like and performs a noise removal process, a correlation double sampling process, an A/D (Analog/Digital) conversion process on an analog pixel signal, and the like to generate a digital pixel signal. The column signal processing unit 113 supplies the generated pixel signal to the signal processing unit 118.

The horizontal drive unit 114 includes a shift register, an address decoder, and the like and selects, in order, unit circuits corresponding to pixel columns of the column signal processing unit 113. The selective scanning by this horizontal drive unit 114 causes the pixel signals that have been subjected to signal processing for each of the unit circuits in the column signal processing unit 113 to be outputted to the signal processing unit 118 in order.

The system control unit 115 includes a timing generator or the like that generates a variety of timing signals. The system control unit 115 performs drive control on the vertical drive unit 112, the column signal processing unit 113, and the horizontal drive unit 114 on the basis of the timing signals generated by the timing generator.

While temporarily storing data in the data storage unit 119 as necessary, the signal processing unit 118 performs signal processing such as an arithmetic process on the pixel signals supplied from the column signal processing unit 113 and outputs an image signal including each of the pixel signals.

The data storage unit 119 temporarily holds data necessary for the signal processing unit 118 to perform signal processing.

[Configuration of Sensor Pixel PX]
(Circuit Configuration Example)

Next, with reference to FIG. 2, a circuit configuration example of the sensor pixel PX provided in the pixel array unit 111 in FIG. 1 is described. FIG. 2 illustrates a circuit configuration example of two sensor pixels PX1 and PX4 of the plurality of sensor pixels PX included in the pixel array unit 111. Each of the plurality of sensor pixels PX other than the sensor pixels PX1 and PX4 also has a substantially similar configuration. It is to be noted that the sensor pixel PX1 and the sensor pixel PX4 are disposed to sandwich two other sensor pixels PX2 and PX3 as illustrated in FIGS. 4A, 4B, 4C, 4D, 4E, and 4F and the like described below.

In the example illustrated in FIG. 2, the sensor pixels PX (PX1 and PX4) in the pixel array unit 111 achieve a memory-holding global shutter.

The sensor pixel PX1 includes a photoelectric conversion unit PD1, first to third transfer transistors TG1A to TG1C, an electric charge holding unit MEM1, a discharge transistor OFG1, a discharge unit OFD1, and a buffer BUF1. The first transfer transistor TG1A includes a transfer gate TRZ1, the second transfer transistor TG1B includes a transfer gate TRY1 and a transfer gate TRX1, and the third transfer transistor TG1C includes a transfer gate TRG1.

Similarly, the sensor pixel PX4 includes a photoelectric conversion unit PD4, first to third transfer transistors TG4A to TG4C, an electric charge holding unit MEM4, a discharge transistor OFG4, a discharge unit OFD4, and a buffer BUF4. The first transfer transistor TG4A includes a transfer gate TRZ4, the second transfer transistor TG4B includes a transfer gate TRY4 and a transfer gate TRX4, and the third transfer transistor TG4C includes a transfer gate TRG4.

Further, the sensor pixel PX1 and the sensor pixel PX4 share power supplies VDD1 and VDD2, an electric charge voltage conversion unit FD14, a reset transistor RST14, an amplification transistor AMP14, a selection transistor SEL14, and the like.

In this example, all of the first to third transfer transistors TG1A to TG1C, the first to third transfer transistors TG4A to TG4C, the reset transistor RST14, the amplification transistor AMP14, and the selection transistor SEL14 are N-type MOS transistors. The respective gate electrodes of these first to third transfer transistors TG1A to TG1C, first to third transfer transistors TG4A to TG4C, reset transistor RST14, amplification transistor AMP14, and selection transistor SEL14 are each supplied with drive signals from the vertical drive unit 112 and the horizontal drive unit 114 on the basis of the drive control by the system control unit 115. Each of those drive signals is a pulse signal whose high level state corresponds to an active state (on state) and whose low level state corresponds to an inactive state (off state). It is to be noted that the following also refers to bringing a drive signal into the active state as turning on the drive signal and refers to bringing a drive signal into the inactive state as turning off the drive signal.

Each of the photoelectric conversion units PD1 and PD4 is, for example, a photoelectric conversion element including a PN-junction photodiode. Each of the photoelectric conversion units PD1 and PD4 is configured to receive light from a subject, generate electric charge corresponding to the amount of received light through photoelectric conversion, and accumulate the electric charge.

The electric charge holding units MEM1 and MEM4 are respectively provided between the photoelectric conversion units PD1 and PD4 and the electric charge voltage conversion unit FD14. The electric charge holding units MEM1 and MEM4 are regions that temporarily hold the electric charge generated and accumulated in the photoelectric conversion units PD1 and PD4 until the electric charge is transferred to the electric charge voltage conversion unit FD14 to achieve a global shutter function.

The first transfer transistor TG1A and the second transfer transistor TG1B are disposed in order between the photoelectric conversion unit PD1 and the electric charge holding unit MEM1. The third transfer transistor TG1C is disposed between the electric charge holding unit MEM1 and the electric charge voltage conversion unit FD14. The first transfer transistor TG1A and the second transfer transistor TG1B are each configured to transfer the electric charge accumulated in the photoelectric conversion unit PD1 to the electric charge holding unit MEM1 in accordance with a drive signal applied to the gate electrode thereof.

Similarly, the first transfer transistor TG4A and the second transfer transistor TG4B are disposed in order between the photoelectric conversion unit PD4 and the electric charge holding unit MEM4. The third transfer transistor TG4C is disposed between the electric charge holding unit MEM4 and the electric charge voltage conversion unit FD14. The first transfer transistor TG4A and the second transfer transistor TG4B are each configured to transfer the electric charge accumulated in the photoelectric conversion unit PD4 to the electric charge holding unit MEM4 in accordance with a drive signal applied to the gate electrode thereof.

The third transfer transistor TG1C and the third transfer transistor TG4C are respectively configured to transfer the electric charge temporarily held in the electric charge holding unit MEM1 and the electric charge holding unit MEM4 to the electric charge voltage conversion unit FD14 in accordance with drive signals applied to the gate electrodes thereof.

For example, in a case where the second transfer transistors TG1B and TG4B are turned off and the third transfer transistors TG1C and TG4C are turned on in the sensor pixels PX1 and PX4, the electric charge held in the respective electric charge holding units MEM1 and MEM4 is transferred to the electric charge voltage conversion unit FD14 through the third transfer transistors TG1C and TG4C.

Each of the buffers BUF1 and BUF4 is an electric charge accumulation region formed between the first transfer transistor TG1A and the second transfer transistor TG1B.

The reset transistor RST14 has the drain coupled to the power supply VDD1 and the source coupled to the electric charge voltage conversion unit FD14. The reset transistor RST14 initializes or resets the electric charge voltage conversion unit FD14 in accordance with the drive signal applied to the gate electrode thereof. For example, in a case where the reset transistor RST14 is turned on by the drive signal, the potential of the electric charge voltage conversion unit FD14 is reset to the voltage level of the power supply VDD1. In other words, the electric charge voltage conversion unit FD14 is initialized.

The electric charge voltage conversion unit FD14 is a floating diffusion region that converts, into electric signals (e.g., voltage signals), the electric charge transferred from the photoelectric conversion units PD1 and PD4 through the first to third transfer transistors TG1A to TG1C and TG4A to TG4C and the electric charge holding units MEM1 and MEM45 and outputs the converted electric signals. The reset transistor RST14 is coupled to the electric charge voltage conversion unit FD14 and the vertical signal line VSL is coupled through the amplification transistor AMP14 and the selection transistor SEL14.

The amplification transistor AMP14 outputs an electric signal corresponding to the potential of the electric charge voltage conversion unit FD14. The amplification transistor AMP14 is included, for example, in a source follower circuit along with a constant current source provided in the column signal processing unit 113. The selection transistor SEL14 is turned on in a case where the sensor pixel PX is selected. The selection transistor SEL14 outputs an electric signal supplied from the electric charge voltage conversion unit FD14 through the amplification transistor AMP14 to the column signal processing unit 113 through the vertical signal line VSL.

The sensor pixels PX1 and PX4 further include the discharge units OFD1 and OFD4, respectively, as transfer destinations of the electric charge of the photoelectric conversion units PD1 and PD4 in addition to the electric charge voltage conversion unit FD14. The discharge transistor OFG1 is disposed between the buffer BUF1 and the discharge unit OFD1 and the discharge transistor OFG4 is disposed between the buffer BUF4 and the discharge unit OFD4.

The discharge transistor OFG1 has the drain coupled to the discharge unit OFD1 and the source coupled to the buffer BUF1. Similarly, the discharge transistor OFG4 has the drain coupled to the discharge unit OFD4 and the source coupled to the buffer BUF4. The discharge transistors OFG1 and OFG4 initialize or reset the photoelectric conversion units PD1 and PD4 in accordance with the drive signals applied to the respective gate electrodes. Resetting the photoelectric conversion units PD1 and PD4 means depleting the photoelectric conversion units PD1 and PD4.

In addition, each of the discharge transistors OFG1 and OFG4 forms an overflow path. The discharge transistors OFG1 and OFG4 respectively discharge electric charge overflowing from the photoelectric conversion units PD1 and PD4 to the discharge units OFD1 and OFD4. It is, however, necessary to turn on the discharge transistors OFG1 and OFG4 and turn on the transfer gates TRZ1 and TRZ4 in a case where the photoelectric conversion units PD1 and PD4 are reset.

(Planar Configuration Example and Cross-Sectional Configuration Example)

Next, with reference to FIGS. 3A, 3B, 4A, 4B, 4C, 4D, 4E, 4F, 4G, and 4H, a planar configuration example and a cross-sectional configuration example of the sensor pixel PX provided in the pixel array unit 111 in FIG. 1 are described.

FIG. 3A illustrates a cross-sectional configuration example of the two sensor pixels PX1 and PX5 of the plurality of sensor pixels PX included in the pixel array unit 111. FIG. 3B illustrates a cross-sectional configuration example of the two sensor pixels PX1 and PX2 of the plurality of sensor pixels PX included in the pixel array unit 111. More specifically, FIG. 3A illustrates an arrow-direction cross section taken along the IIIA-IIIA cutting line that extends in the X axis direction and passes through the sensor pixel PX1 and the sensor pixel PX5 illustrated in each of FIGS. 4A, 4B, 4C, 4D, 4E, 4F, 4G, and 4H. In addition, FIG. 3B illustrates an arrow-direction cross section taken along the IIIB-IIIB cutting line that extends in the Y axis direction and passes through the sensor pixel PX1 and the sensor pixel PX2 illustrated in each of FIGS. 4A, 4B, 4C, 4D, 4E, 4F, 4G, and 4H.

Each of FIGS. 4A, 4B, 4C, 4D, 4E, 4F, 4G, and 4H illustrate a planar configuration example of the eight sensor pixels PX1 to PX8 disposed in a lattice of two rows and four columns. Specifically, FIGS. 4A, 4B, 4C, 4D, 4E, 4F, 4G, and 4H respectively illustrate planar configurations at height positions Lv1 to Lv8 illustrated in each of FIGS. 3A and 3B. In the pixel array unit 111 according to the present embodiment, the sensor pixels PX1 to PX8 illustrated in FIGS. 4A, 4B, 4C, 4D, 4E, 4F, 4G, and 4H are used as a minimum unit and repeatedly arranged along both the X axis direction and the Y axis direction. It is to be noted that the components of each of the sensor pixels PX1 to PX8 may have substantially the same structure. In addition, it is sufficient if the sensor pixels PX1 to PX4 arranged in the Y axis direction and the sensor pixels PX5 to PX8 also arranged in the Y axis direction have symmetrical structures with respect to the X axis direction.

Specifically, the sensor pixel PX2 and the sensor pixel PX3 include photoelectric conversion units PD2 and PD3, first to third transfer transistors TG2A to TG2C and TG3A to TG3C, electric charge holding units MEM2 and MEM3, discharge transistors OFG2 and OFG3, discharge units OFD2 and OFD3, buffers BUF2 and BUF3, and the like as with the sensor pixel PX1 and the sensor pixel PX4 illustrated in FIG. 2. In addition, the sensor pixel PX2 and the sensor pixel PX3 share a vertical signal line VSL23, an electric charge voltage conversion unit FD23, a reset transistor RST23, an amplification transistor AMP23, a selection transistor SEL23, and the like.

In addition, the sensor pixels PX5 to PX8 respectively have configurations corresponding to those of the sensor pixels PX1 to PX4. For example, the sensor pixel PX5 and the sensor pixel PX8 include photoelectric conversion units PD5 and PD8, first to third transfer transistors TG5A to TG5C and TG8A to TG8C, electric charge holding units MEM5 and MEM8, discharge transistors OFG5 and OFG8, discharge units OFD5 and OFD8, buffers BUF5 and BUF8, and the like as with the sensor pixel PX1 and the sensor pixel PX4 illustrated in FIG. 2. Further, the sensor pixel PX5 and the sensor pixel PX8 share a vertical signal line VSL58, an electric charge voltage conversion unit FD58, a reset transistor RST58, an amplification transistor AMP58, a selection transistor SEL58, and the like. In addition, the sensor pixel PX6 and the sensor pixel PX7 include photoelectric conversion units PD6 and PD7, first to third transfer transistors TG6A to TG6C and TG7A to TG7C, electric charge holding units MEM6 and MEM7, discharge transistors OFG6 and OFG7, discharge units OFD6 and OFD7, buffers BUF6 and BUF7, and the like as with the sensor pixel PX2 and the sensor pixel PX3. Further, the sensor pixel PX6 and the sensor pixel PX7 share a vertical signal line VSL67, an electric charge voltage conversion unit FD67, a reset transistor RST67, an amplification transistor AMP67, a selection transistor SEL67, and the like.

As illustrated in FIGS. 3A and 3B, the pixel array unit 111 has a structure in which a first substrate S1 including a first layer LY1 and a second layer LY2 and a second substrate S2 including a third layer LY3 are bonded together on a bonding interface K. The wiring layers are bonded to each other at the bonding interface K. So-called Cu—Cu junction is preferable to bond the wiring layers to each other. In the Cu—Cu junction, for example, the surfaces of metal layers such as Cu (copper) are irradiated with plasma to be activated and bonded to each other.

The photoelectric conversion units PD (PD1 to PD8) and the like are formed in the first layer LY1 of the pixel array unit 111 as illustrated in FIGS. 3A, 3B, 4C, 4D, and 4E. Each of the sensor pixels PX1 to PX8 includes the semiconductor substrate 11 and the photoelectric conversion unit PD (PD1 to PD8) in the first layer LY1. The semiconductor substrate 11 is formed by using a semiconductor material such as Si (silicon). The photoelectric conversion unit PD (PD1 to PD8) is embedded in the semiconductor substrate 11. In addition, the semiconductor substrate 11 includes a front surface 11S1 and a back surface 11S2 opposite to the front surface 11S1. The back surface 11S2 is a surface that receives light from the outside. The back surface 11S2 is provided with a color filter formation layer including color filters CF (CF1 to CF8) (see FIGS. 3A, 3B, and 4B). For example, the color filter CF1 transmits green light, the color filter CF2 transmits red light, the color filter CF3 transmits green light, the color filter CF4 transmits blue light, the color filter CF5 transmits red light, the color filter CF6 transmits green light, the color filter CF7 transmits blue light, and the color filter CF8 transmits green light. The color arrangement pattern is not, however, limited to this. The color filters CF (CF1 to CF8) are further provided, for example, with 32 lenses LS (LS11 to 14, LS21 to 24, LS31 to 34, LS41 to 44, LS51 to 54, LS61 to 64, LS71 to 74, and LS81 to 84) in total on the opposite side to the back surface 11S2 (see FIGS. 3A, 3B, and 4A). The lenses LS are described in detail below. In addition, the front portions of two vertical trench gates 51 and 52 are in contact with the photoelectric conversion unit PD (PD1 to PD8) (see FIGS. 3A, 3B, and 4E). The two vertical trench gates 51 and 52 extend from the lower portion of the transfer gate TRZ (TRZ1 to TRZ8) in the depth direction (+Z direction). The transfer gate TRZ (TRZ1 to TRZ8) is provided on the front surface 11S1.

An element separation unit 12 is further provided in the first layer LY1 of the semiconductor substrate 11 to surround each of the photoelectric conversion units PD (PD1 to PD8) (FIGS. 3A, 3B, and 4C). The element separation unit 12 is a wall-shaped member that extends in the Z axis direction at a boundary position between the sensor pixels PX adjacent to each other to penetrate the semiconductor substrate 11 and surrounds each of the photoelectric conversion units PD. The element separation unit 12 electrically separates the sensor pixels PX adjacent to each other. In addition, the element separation unit 12 prevents the generation of noise such as color mixing caused by the entry of leakage light from the adjacent sensor pixel PX into each of the photoelectric conversion units PD (PD1 to PD8). The element separation unit 12 includes, for example, an insulating material such as silicon oxide.

As described above, the photoelectric conversion units PD1 to PD8 are each formed in the first layer LY1. In the sensor pixels PX1 to PX8, effective pixel regions 1R (1R1 to 1R8) surrounded by the element separation unit 12 are rectangle-shaped regions each having a first aspect ratio AR1 (=X1/Y1) defined by using width X1 and length Y1 as illustrated in FIG. 4C. FIG. 4C illustrates an example in which the first aspect ratio AR1 is 1. In other words, the width X1 and the length Y1 are equal to each other. In the respective effective pixel regions 1R1 to 1R8, the photoelectric conversion units PD1 to PD8 are formed.

As illustrated in FIG. 4G, the electric charge holding unit formation regions 2R (2R1 to 2R8) including the electric charge holding units MEM1 to MEM8 are formed in the second layer LY2 of the first substrate S1 included in the pixel array unit 111. Each of the electric charge holding unit formation regions 2R1 to 2R4 is a rectangular region having a second aspect ratio AR2 (=X2/Y2) defined by a width X2 and a length Y2 in the XY plane. Here, the first aspect ratio AR1 and the second aspect ratio AR2 are different. FIG. 4G illustrates an example in which the second aspect ratio AR2 is 4. In other words, the length Y2 is four times as great dimensions as the width X2. It is to be noted that, in FIGS. 4C and 4G, the width X2 is half as great dimensions as the width X1 and the length Y2 is two times as great dimensions as the length Y1.

For example, the first to third transfer transistors TG1A to TG1C, TG2A to TG2C, TG3A to TG3C, and the TG4A to TG4C, the electric charge holding units MEM1 to MEM4, the discharge transistors OFG1 to OFG4, the discharge units OFD1 to OFD4, the buffers BUF1 to BUF4, the power supplies VDD, the electric charge voltage conversion units FD14 and FD23, and the like are formed in the electric charge holding unit formation regions 2R1 to 2R4 in the second layer LY2 corresponding to the sensor pixels PX1 to PX4 (see FIGS. 3A, 3B, and 4G). It is to be noted that the electric charge holding units MEM1 to MEM4 are positioned, for example, below the transfer gates TRY1 to TRY4, TRX1 to TRX4, and TRG1 to TRG4. Similarly, for example, the first to third transfer transistors TG5A to TG5C, TG6A to TG6C, TG7A to TG7C, and the TG8A to TG8C, the electric charge holding units MEM5 to MEM8, the discharge transistors OFG5 to OFG8, the discharge units OFD5 to OFD8, the buffers BUF5 to BUF8, the power supplies VDD, the electric charge voltage conversion units FD58 and FD67, and the like are formed in the electric charge holding unit formation regions 2R5 to 2R8 in the second layer LY2 corresponding to the sensor pixels PX5 to PX8 (see FIGS. 3A, 3B, and 4G). It is to be noted that the electric charge holding units MEM5 to MEM8 are positioned, for example, below the transfer gates TRY5 to TRY8, TRX5 to TRX8, and TRG5 to TRG8.

The electric charge holding unit formation regions 2R1 to 2R8 in the second layer LY2 are each provided with the two vertical trench gates 51 and 52 arranged in the X axis direction for the sensor pixels PX1 to PX8 (see FIGS. 3A, 3B, 4E and 4F). The vertical trench gates 51 and 52 are included in a portion of the electric charge transfer unit. The vertical trench gates 51 and 52 connect the photoelectric conversion units PD1 to PD8 and the transfer gates TRZ1 to TRZ8, respectively. The vertical trench gates 51 and 52 serve as paths for transferring electric charge from the photoelectric conversion units PD1 to PD8 to the electric charge holding units MEM1 to MEM8 through the buffers BUF1 to BUF8. The electric charge holding units MEM1 to MEM8 are transfer destinations. It is to be noted that one vertical trench gate alone may be disposed or three or more vertical trench gates may be disposed.

There is provided a horizontal light shielding film 13 between the vertical trench gates 51 and 52 and the back surface 11S2 (see FIGS. 3A, 3B, and 4D). The horizontal light shielding film 13 extends along the XY plane to overlap with the vertical trench gates 51 and 52 in the Z axis direction. The horizontal light shielding film 13 is a light shielding member that prevents incident light from propagating to each of the electric charge holding units MEM1 to MEM8. The horizontal light shielding film 13 is provided to overlap with a horizontal light shielding film 14 described below in the Z axis direction. The horizontal light shielding film 13 is coupled, for example, to the end of the element separation unit 12 opposite to the back surface 11S2. As illustrated in FIG. 4D, there are provided openings 13K1 to 13K8 in portions of the horizontal light shielding film 13 to partially partition the photoelectric conversion units PD1 to PD8 in the Z axis direction. The electric charge generated in the photoelectric conversion units PD1 to PD8 moves to the vertical trench gates 51 and 52 through the respective openings 13K1 to 13K8. It is to be noted that the positions of the openings 13K1 to 13K8 in the XY plane are different from the positions of openings 14K1 to 14K8 (described below) in the XY plane in the horizontal light shielding film 14.

In this way, in the present embodiment, the electric charge holding unit formation region 2R1 is not provided only immediately above the effective pixel region 1R1, for example, included in the sensor pixel PX1, but the electric charge holding unit MEM1 is formed over both the effective pixel region 1R1 and the effective pixel region 1R2. Similarly, the electric charge holding unit formation region 2R2 is not provided only immediately above the effective pixel region 1R2 included in the sensor pixel PX2, but the electric charge holding unit MEM2 is formed over both the effective pixel region 1R1 and the effective pixel region 1R2. In other words, the effective pixel region 1R1 overlaps with a portion of the electric charge holding unit formation region 2R1 and a portion of the electric charge holding unit formation region 2R2. The effective pixel region 1R2 overlaps with the remaining portion of the electric charge holding unit formation region 2R1 and the remaining portion of the electric charge holding unit formation region 2R2.

It is sufficient if each of the electric charge holding unit formation regions 2R1 to 2R8 further includes a light shielding wall 17 extending in the Z axis direction and extending along the Y axis direction. Each of the electric charge holding units MEM1 to MEM4 is disposed to be sandwiched between the two light shielding walls 17 adjacent in the X axis direction. The light shielding wall 17 is a member that prevents light from entering each of the electric charge holding units MEM1 to MEM8.

The horizontal light shielding film 14 extending along the XY plane is provided between the photoelectric conversion units PD1 to PD4 and the electric charge holding units MEM1 to MEM4 to overlap with the horizontal light shielding film 13 in the thickness direction (Z axis direction) (see FIGS. 3A, 3B, and 4F). The horizontal light shielding film 14 is a member that prevents incident light from entering the electric charge holding units MEM1 to MEM8 as with the horizontal light shielding film 13 and the light shielding wall 17. The horizontal light shielding film 14 suppresses the entry of light passing through the photoelectric conversion units PD1 to PD8 into the electric charge holding units MEM1 to MEM8 and the generation of noise. It is to be noted that the light which comes from the back surface 11S2 and passes through the photoelectric conversion units PD1 to PD8 without being absorbed by the photoelectric conversion units PD1 to PD8 is reflected on the horizontal light shielding film 14 and enters the photoelectric conversion units PD1 to PD8 again. In other words, the horizontal light shielding film 14 is also a reflector. The horizontal light shielding film 14 increases the photoelectric conversion efficiency by causing the light passing through the photoelectric conversion units PD1 to PD8 to enter the photoelectric conversion units PD1 to PD8 again. The horizontal light shielding film 14 is, however, provided with openings 14K (14K1 to 14K8) that allow the electric charge generated by the photoelectric conversion units PD1 to PD8 to pass therethrough. The vertical trench gates 51 and 52 are provided to extend through the respective openings 14K1 to 14K8. It is sufficient if the openings 14K1 to 14K8 are provided at positions different from those of the openings 13K1 to 13K8 in the effective pixel regions 1R, respectively. The horizontal light shielding film 14 may be provided over the whole of the XY plane of the pixel array unit 111 except for the openings 14K1 to 14K8. In addition, the horizontal light shielding film 14 may be linked to the light shielding wall 17. The horizontal light shielding films 13 and 14 and the light shielding wall 17 each have, for example, a two-layer structure including an inner layer portion and an outer layer portion surrounding the periphery thereof. The inner layer portion includes, for example, a material including at least one of a single metal, a metal alloy, a metal nitride, or a metal silicide having a light shielding property. More specific examples of a material included in the inner layer portion include Al (aluminum), Cu (copper), Co (cobalt), W (tungsten), Ti (titanium), Ta (tantalum), Ni (nickel), Mo (molybdenum), Cr (chromium), Jr (iridium), platinum iridium, TiN (titanium nitride), a tungsten silicon compound, or the like. Among them, Al (aluminum) is the most optically preferable material. It is to be noted that the inner layer portion may include graphite, an organic material, or the like. The outer layer portion includes, for example, an insulating material such as SiOx (silicon oxide). The outer layer portion secures an electrical insulation property between the inner layer portion and the semiconductor substrate 11.

It is to be noted that it is possible to form the horizontal light shielding film 14 extending in the XY plane, for example, by removing a portion of the semiconductor substrate 11 to form a space inside the semiconductor substrate 11 through a wet etching process and then filling the space with the material described above. In the wet etching process, for example, in a case where the semiconductor substrate 11 includes Si {111}, crystal anisotropic etching using a property that the etching rate is different in accordance with the plane orientation of the Si {111} is performed by using a predetermined alkaline aqueous solution. More specifically, the property is used that the etching rate in a <110> direction is sufficiently high with respect to the etching rate in a <111> direction in a Si {111} substrate. Here, the <111> direction is a direction with three Si backbonds. In addition, the <110> direction is a direction with one or two Si backbonds. In the present embodiment, the X axis direction corresponds to the <110> direction. As the predetermined alkaline aqueous solution, an inorganic solution is applicable such as KOH, NaOH, or CsOH. An organic solution is applicable such as EDP (ethylenediamine pyrocatechol aqueous solution), $N_2H_4$ (hydrazine), $NH_4OH$ (ammonium hydroxide), or TMAH (tetramethyl ammonium hydroxide).

In a case where the space for forming the horizontal light shielding film 14 is formed through a wet etching process, the horizontal light shielding film 14 has a greater thickness (dimensions in the Z axis direction) as the wet etching proceeds more in the XY plane. It is thus desirable that the wet etching proceed as little as possible in the XY plane to prevent the horizontal light shielding film 14 from having a thickness greater than necessary. Accordingly, it is sufficient if the horizontal light shielding film 14 has shorter dimensions in the X axis direction as illustrated in FIG. 3A according to the present embodiment. In the present embodiment, the use of a trench made to form the light shielding wall 17 extending in the Y axis direction allows a space in which the horizontal light shielding film 14 is formed to be formed through the wet etching process that proceeds in the X axis direction. This makes it possible to suppress an increase in the thickness of the horizontal light shielding film 14 that is finally obtained.

In addition, in the present embodiment, the semiconductor substrate 11 is, for example, of a P-type (first electrical conductivity type) and the photoelectric conversion unit PD and the electric charge holding units MEM1 to MEM4 are of an N-type (second electrical conductivity type).

As illustrated in FIGS. 3A, 3B, and 4H, a vertical signal line VSL14, the electric charge voltage conversion unit FD14, the reset transistor RST14, the amplification transistor AMP14, the selection transistor SEL14, and the like are formed in the respective regions corresponding, for example, to the effective pixel regions 1R1 and 1R2 and the electric charge holding unit formation regions 2R1 and 2R2 in the third layer LY3. In addition, a vertical signal line VSL23, the electric charge voltage conversion unit FD23, the reset transistor RST23, the amplification transistor AMP23, the selection transistor SEL23, and the like are formed in the respective regions corresponding to the effective pixel regions 1R3 and 1R4 and the electric charge holding unit formation regions 2R3 and 2R4. In addition, the vertical signal line VSL58, the electric charge voltage conversion unit FD58, the reset transistor RST58, the amplification transistor AMP58, the selection transistor SEL58, and the like are formed in the respective regions corresponding to the effective pixel regions 1R5 and 1R6 and the electric charge holding unit formation regions 2R5 and 2R6. Further, the vertical signal line VSL67, the electric charge voltage conversion unit FD67, the reset transistor RST67, the amplification transistor AMP67, the selection transistor SEL67, and the like are formed in the respective regions corresponding to the effective pixel regions 1R7 and 1R8 and the electric charge holding unit formation regions 2R7 and 2R8.
(Lens LS)

As illustrated in FIG. 4A, the sensor pixels PX (PX1 to PX8) according to the present embodiment are provided with the plurality of lenses LS in the effective pixel regions 1R (1R1 to 1R8) that are each surrounded by the element separation unit 12 and each extend along the XY plane. Specifically, the lenses LS11 to LS14 are arranged in the effective pixel region 1R1 of the sensor pixel PX1 along the XY plane in a matrix of two rows and two columns. The lenses LS11 to LS14 have substantially the same dimensions and have substantially the same refractive power. The dimensions of the lenses LS11 to LS14 in the X axis direction and the dimensions of the lenses LS11 to LS14 in the Y axis direction are substantially equal to each other. The same applies to the sensor pixels PX2 to PX8. The plurality of lenses LS is a condensing optical system that condenses the incident light from an imaging target. Each of the plurality of lenses LS condenses the incident light described above at a position in the effective pixel region 1R that overlaps with the horizontal light shielding film 14 in the thickness direction (Z axis direction). Here, each of the lenses LS condenses light at a position in the corresponding effective pixel region 1R other than the central position. In the present embodiment, the respective lenses LS11 to LS14 (FIG. 4A) condense pieces of incident light toward light condensing points FP11 to FP14 (FIG. 4F) in the effective pixel region 1R1, for example, in the sensor pixel PX1. The same applies to the other sensor pixels PX2 to PX8. In addition, it is sufficient if the horizontal light shielding film 14 includes the openings 14K (14K1 to 14K8) at positions in the effective pixel regions 1R other than the central positions. This is because the incident light usually has relatively high intensity at the central position of the effective pixel region 1R. It is sufficient if the respective light condensing points FP11 to FP14 have positions in the effective pixel region 1R1 other than the central position that are different from even the position of the opening 14K1.
(Operation of Sensor Pixel PX)

Next, with reference to FIGS. 2, 3A, 3B, 4A, 4B, 4C, 4D, 4E, 4F, 4G, and 4H and the like, an operation of the sensor pixel PX is described. In the sensor pixel PX, first, a high-level drive signal is supplied to each of the discharge transistor OFG and the transfer gate TRZ before exposure is performed on the basis of the drive control by the system control unit 115. This turns on the discharge transistor OFG and the transfer gate TRZ. This causes the electric charge accumulated in the photoelectric conversion unit PD to be discharged to the discharge unit OFD and the photoelectric conversion unit PD is reset.

After the photoelectric conversion unit PD is reset, a low-level drive signal is supplied to each of the discharge transistor OFG and the transfer gate TRZ on the basis of the drive control by the system control unit 115. This turns off the discharge transistor OFG and the transfer gate TRZ. This begins exposure for all of the sensor pixels PX in the pixel array unit 111 and generates and accumulates electric charge in each of the photoelectric conversion units PD that have received light from a subject.

After a scheduled exposure time elapses, in all of the sensor pixels PX in the pixel array unit 111, the drive signals to the transfer gate TRZ and a transfer gate TRY are turned on on the basis of the drive control by the system control unit 115. This transfers the electric charge accumulated in the photoelectric conversion unit PD from the photoelectric conversion unit PD to an electric charge holding unit MEM through the transfer gate TRZ and the transfer gate TRY in each of the sensor pixels PX. The electric charge is temporarily held in the electric charge holding unit MEM.

Subsequently, the drive signals to the transfer gate TRZ and the transfer gate TRY are turned off on the basis of the drive control by the system control unit 115. After that, a readout operation is performed of sequentially reading out the electric charge held in the electric charge holding units MEM of the respective sensor pixels PX. The readout operation for the electric charge is performed, for example, for each of the rows of the pixel array unit 111. Specifically, the transfer gates TRX and the transfer gates TRG are turned on by the drive signals for each of the rows to be read out. This transfers the electric charge held in the electric charge holding units MEM of the respective sensor pixels PX to the respective electric charge voltage conversion units FD row by row.

In a case where a selection transistor SEL is turned on by a drive signal after that, an electric signal indicating the level corresponding to the electric charge held in an electric charge voltage conversion unit FD sequentially passes through an amplification transistor AMP and the selection transistor SEL and is outputted to the column signal processing unit 113 through the vertical signal line VSL.
[Effects of Solid-State Imaging Device 101]

The solid-state imaging device 101 according to the present embodiment has the plurality of lenses LS disposed for the effective pixel region 1R of the one sensor pixel PX as described above. This allows the solid-state imaging device 101 to reduce the PLS and exhibit more favorable imaging performance.

The following describes a sensor pixel PX1X according to the reference example illustrated in FIG. 5A and the sensor pixel PX1 according to the present embodiment illustrated in FIG. 5B in comparison. FIG. 5A is a schematic cross-sectional view of a path of light L1 entering the sensor pixel PX1X according to the reference example. FIG. 5B is a schematic cross-sectional view of paths of pieces of light L11 and L14 entering the sensor pixel PX1 according to the present embodiment.

The sensor pixel PX1X according to the reference example of FIG. 5A is provided with one lens LS1 for the one effective pixel region 1R1. The light L1 entering the sensor pixel PX1X is therefore condensed around the center of the effective pixel region 1R1 by the refractive power of the lens LS1 while propagating in the —Z direction through the lens LS1. The propagation of a portion of the incident light L1 is thus prevented by the horizontal light shielding film 13, but the remaining portion of the incident light L1 is diffracted at the end of the opening of the horizontal light shielding film 13 as illustrated by the arrows and further propagates to the inside of the sensor pixel PX1X. The incident light L1 propagating deeper than the horizontal light shielding film 13 is diffracted at the end of the opening of the horizontal light shielding film 14 as illustrated by the arrows and further propagates to the inside of the sensor pixel PX1X. As a result, a portion of the incident light L1 reaches the electric charge holding unit MEM2. This may deteriorate the PLS.

In contrast, the sensor pixel PX1 according to the present embodiment illustrated in FIG. 5B is provided with the plurality of lenses LS11 to LS14 for the one effective pixel region 1R1. Here, the plurality of respective lenses LS11 to LS14 condenses pieces of incident light at the light condensing points FP11 to FP14 having positions different from the central position of the effective pixel region 1R1. As illustrated in FIG. 5B, the incident light L11 entering, for example, the lens LS11 of the sensor pixel PX1 therefore bumps into the horizontal light shielding film 13, for example, and is blocked by the horizontal light shielding film 13. In addition, even in a case where the incident light L14 entering, for example, the lens LS14 of the sensor pixel PX1 passes through an opening 13K as illustrated in FIG. 5B, the incident light L14 bumps into the horizontal light shielding film 14 and is blocked by the horizontal light shielding film 14. This makes it possible to prevent the pieces of incident light L11 and L14 from reaching the electric charge holding unit MEM2.

In this way, in the present embodiment, incident light is condensed while avoiding the central position at which a portion of the horizontal light shielding film 13 near the opening 13K and a portion of the horizontal light shielding film 14 near the opening 14K overlap with each other. As a result, it is possible to prevent unnecessary light from entering the electric charge holding unit MEM and improve the PLS.

In addition, in the present embodiment, a lens array is used in which the four lenses LS are arranged in a matrix of two rows and two columns for the one sensor pixel PX. The four lenses LS have substantially the same dimensions and have substantially the same refractive power. This makes it possible to more evenly distribute the amount of incident light over the whole of the effective pixel region 1R1 having a substantially square shape.

<2. Modification Examples of First Embodiment>

In the first embodiment described above, a lens array in which the four lenses LS are arranged in a matrix of two rows and two columns for the one sensor pixel PX is exemplified as a condensing optical system as illustrated in FIG. 4A. The four lenses LS have substantially the same dimensions and have substantially the same refractive power. The present disclosure is not, however, limited to this. The present disclosure also encompasses even other modes described, for example, in the following modification examples 1-1 to 1-9.

(Modification Example 1-1)

FIG. 6A is a plan view of the lens arrangement pattern of a pixel array unit 111A according to a first modification example of the first embodiment. As illustrated in FIG. 6A, in the lens arrangement pattern of the pixel array unit 111A, the one sensor pixel PX is provided with the two lenses LS that are evenly divided in only the Y axis direction instead of being divided in the X axis direction. For example, the sensor pixel PX1 is provided with the two horizontally long lenses LS11 and LS12 adjacent in the Y axis direction. The lenses LS11 and LS12 having the lens arrangement pattern of the pixel array unit 111A have two times larger dimensions in the X axis direction than those of the lenses LS11 and LS12 having the lens arrangement pattern (FIG. 4A) of the pixel array unit 111 and have equal dimensions in the Y axis direction. The same applies to the other sensor pixels PX2 to PX8. As described below, the lens arrangement pattern of the pixel array unit 111A has high affinity with a mode in which a portion of the sensor pixels PX is provided with an image plane phase difference detection pixel.

(Modification Example 1-2)

FIG. 6B is a plan view of the lens arrangement pattern of a pixel array unit 111B according to a second modification example of the first embodiment. As illustrated in FIG. 6B, in the lens arrangement pattern of the pixel array unit 111B, the one sensor pixel PX is provided with the two lenses LS that are evenly divided in only the X axis direction instead of being divided in the Y axis direction. For example, the sensor pixel PX1 is provided with the two vertically long lenses LS11 and LS12 adjacent in the X axis direction. The lenses LS11 and LS12 having the lens arrangement pattern of the pixel array unit 111B have equal dimensions in the X axis direction to those of the lenses LS11 and LS12 having the lens arrangement pattern (FIG. 4A) according to the first embodiment and have two times larger dimensions in the Y axis direction. The same applies to the other sensor pixels PX2 to PX8. As described below, the lens arrangement pattern of the pixel array unit 111B also has high affinity with a mode in which a portion of the sensor pixels PX is provided with an image plane phase difference detection pixel.

(Modification Example 1-3)

FIG. 6C is a plan view of the lens arrangement pattern of a pixel array unit 111C according to a third modification example of the first embodiment. As illustrated in FIG. 6C, in the lens arrangement pattern of the pixel array unit 111C, the nine lenses LS are arranged in a matrix for the one sensor pixel PX. The nine lenses LS result from even division into three in both the X axis direction and the Y axis direction. In this way, the one sensor pixel PX may include a different number of lenses LS in accordance with the position of the opening 13K of the horizontal light shielding film 13 and the position of the opening 14K of the horizontal light shielding film 14.

(Modification Example 1-4)

FIG. 6D is a plan view of the lens arrangement pattern of a pixel array unit 111D according to a fourth modification example of the first embodiment. As illustrated in FIG. 6D, in the lens arrangement pattern of the pixel array unit 111D, the sixteen lenses LS are arranged in a matrix for the one sensor pixel PX. The sixteen lenses LS result from even division into four in both the X axis direction and the Y axis direction. In this way, the one sensor pixel PX may include a different number of lenses LS in accordance with the position of the opening 13K of the horizontal light shielding film 13 and the position of the opening 14K of the horizontal light shielding film 14.

(Modification Example 1-5)

FIG. 6E is a plan view of the lens arrangement pattern of a pixel array unit 111E according to a fifth modification example of the first embodiment. As illustrated in FIG. 6E, the lens arrangement pattern of the pixel array unit 111E is a mode in which the lens LS in the middle is removed from the nine lenses LS corresponding to the one sensor pixel PX in the pixel array unit 111C illustrated in FIG. 6C. According to the lens arrangement pattern of the pixel array unit 111E, reduced components of incident light are condensed at the center of the effective pixel region 1R1. This makes it possible to further reduce the entry of incident light to the electric charge holding unit MEM as compared with the pixel array unit 111C in FIG. 6C.

(Modification Examples 1-6 to 1-8)

FIGS. 6F, 6G, and 6H are plan views of the lens arrangement patterns of pixel array units 111F to 111H according to sixth to eighth modification examples of the first embodiment, respectively. The lens arrangement patterns of the pixel array units 111F to 111H include two or more types of lenses LS having different dimensions as respectively illustrated in FIGS. 6F, 6G, and 6H.

(Modification Example 1-9)

FIG. 6I is a plan view of the lens arrangement pattern of a pixel array unit 111I according to a ninth modification example of the first embodiment. As illustrated in FIG. 6I, all of the lenses LS have the same shape and the same size in the lens arrangement pattern of the pixel array unit 111I. The lenses LS, however, include the lens LS that uses the X axis direction as the longitudinal direction and the lens LS that uses the Y axis direction as the longitudinal direction.

3. Second Embodiment

[Configuration of Pixel Array Unit 211]

FIG. 7A illustrates a cross-sectional configuration example of the two sensor pixels PX1 and PX5 of the plurality of sensor pixels PX included in a pixel array unit 211 according to a second embodiment of the present disclosure. FIG. 7B illustrates a cross-sectional configuration example of the two sensor pixels PX1 and PX2 of the plurality of sensor pixels PX included in the pixel array unit 211. In addition, FIG. 8A illustrates a planar configuration at the height position Lv1 illustrated in FIGS. 7A, 7B, and 8B illustrate a planar configuration at a height position Lv3 illustrated in FIGS. 7A and 7B. It is to be noted that FIGS. 9A and 9B respectively correspond to FIGS. 3A and 3B in the first embodiment described above. In addition, FIGS. 8A and 8B respectively correspond to FIGS. 4A and 4C in the first embodiment described above. More specifically, FIG. 7A illustrates an arrow-direction cross section taken along the VIIA-VIIA cutting line that extends in the X axis direction and passes through the sensor pixel PX1 and the sensor pixel PX5 illustrated in each of FIGS. 8A and 8B. In addition, FIG. 7B illustrates an arrow-direction cross section taken along the VIIB-VIIB cutting line that extends in the Y axis direction and passes through the sensor pixel PX1 and the sensor pixel PX2 illustrated in each of FIGS. 8A and 8B.

In the first embodiment described above, the one sensor pixel PX is provided with the four lenses LS arranged in two rows and two columns. Such a configuration makes it possible to shift a light condensing point FP by the lens LS from the central position of the effective pixel region 1R1. As a result, the effect is brought about of reducing the PLS. However, shifting the light condensing point FP by the lens LS from the central position of the effective pixel region 1R1 also means that incident light comes closer to the element separation unit 12 provided between the sensor pixels PX. Therefore, in a case where incident light enters the back surface 11S2 from the oblique direction, the incident light may enter the semiconductor substrate 11 through the lens LS and the color filter CF and then cause vignetting in the element separation unit 12. In that case, the incidence sensitivity to the oblique incident light is reduced.

Accordingly, each of the plurality of lenses LS has a horizontally long planar shape that uses the X axis direction as the longitudinal direction in the pixel array unit 211 according to the present embodiment as illustrated in FIGS. 7A and 8A. This improves the oblique incidence characteristics for the X axis direction (horizontal direction).

Further, as illustrated in FIGS. 7B and 8B, the pixel array unit 211 according to the present embodiment is provided with only a portion of the element separation unit 12 that partitions the sensor pixels PX adjacent in the X axis direction. In other words, the pixel array unit 211 according to the present embodiment is provided with only a portion of the element separation unit 12 that extends in the Y axis direction and the Z axis direction. Further, in other words, a portion of the element separation unit 12 provided in the first embodiment described above to have a lattice shape that extends in the X axis direction is not provided in the present embodiment. This alleviates the vignetting of incident light inclined in the Y axis direction (vertical direction) and improves the oblique incidence characteristics for the Y axis direction (vertical direction).

[Effects of Pixel Array Unit 211]

The configuration described above makes it possible to exhibit more favorable sensitivity characteristics even for incident light including components inclined in both the X axis direction and the Y axis direction in the pixel array unit 211 according to the present embodiment than in the pixel array unit 111 according to the first embodiment described above.

It is to be noted that the plurality of lenses LS each has a horizontally long planar shape that uses the X axis direction as the longitudinal direction and only a portion of the element separation unit 12 that extends in the Y axis direction and the Z axis direction is provided in the present embodiment, but the present disclosure may adopt only any one of them. Even in that case, it is possible to improve the oblique incidence characteristics for the X axis direction (horizontal direction) or the oblique incidence characteristics for the Y axis direction (vertical direction).

4. Third Embodiment

[Configuration of Pixel Array Unit 311]

FIG. 9A illustrates a cross-sectional configuration example of the two sensor pixels PX1 and PX5 of the plurality of sensor pixels PX included in a pixel array unit 311 according to a third embodiment of the present disclosure. FIG. 9B illustrates a cross-sectional configuration example of the two sensor pixels PX1 and PX2 of the plurality of sensor pixels PX included in the pixel array unit 311. It is to be noted that FIGS. 9A and 9B respectively correspond to FIGS. 3A and 3B in the first embodiment described above.

In the pixel array unit 311 according to the present embodiment, each of the sensor pixels PX further includes inner lenses INL (INL1, INL2, and INL5) serving as the second lens layer. The inner lenses INL (INL1, INL2, and INL5) are each inserted between the lens LS serving as the first lens layer and the photoelectric conversion unit PD in the thickness direction (Z axis direction). In the pixel array unit 311 according to the present embodiment, the one lens LS is provided for the one sensor pixel PX. Meanwhile, the four inner lenses INL arranged in two rows and two columns are provided for the one sensor pixel PX.

[Effects of Pixel Array Unit 311]

It is possible to condense incident light by the lens LS to some extent and then condense the incident light at a light condensing point other than the central position of the effective pixel region 1R1 by the plurality of provided inner lenses INL in the pixel array unit 311 in such a mode. This makes it possible to improve the PLS characteristics. Moreover, it is also possible to avoid vignetting in the element separation unit 12 even in a case of incident light inclined with respect to the back surface 11S2 and improve even the oblique incidence characteristics.

<5. Modification Examples of Third Embodiment>

The structure has been exemplified in the third embodiment described above in which the one lens LS and the plurality of inner lenses INL are stacked for the one sensor pixel PX as illustrated in FIGS. 9A and 9B, but the present disclosure is not limited to this. The present disclosure also encompasses even other modes described, for example, in the following modification examples 3-1 to 3-3.

(Modification Example 3-1)

FIG. 10A illustrates a cross-sectional configuration example of the two sensor pixels PX1 and PX5 of the plurality of sensor pixels PX included in a pixel array unit 311A according to a first modification example of the third embodiment. FIG. 10B illustrates a cross-sectional configuration example of the two sensor pixels PX1 and PX2 of the plurality of sensor pixels PX included in the pixel array unit 311A. It is to be noted that FIGS. 10A and 10B respectively correspond to FIGS. 9A and 9B in the third embodiment described above.

As illustrated in FIGS. 10A and 10B, the pixel array unit 311A is also provided with the plurality of lenses LS for the one sensor pixel PX. The lenses LS are each positioned closer to the incidence side than the inner lenses INL. Specifically, the one sensor pixel PX is provided with the four lenses LS arranged, for example, in two rows and two columns. According to the present modification example, it is possible to further increase the refractive power of the lens LS. It is thus possible to avoid vignetting in the element separation unit 12 even in a case of incident light having a larger angle of incidence and improve the oblique incidence characteristics.

(Modification Example 3-2)

FIG. 11A illustrates a cross-sectional configuration example of the two sensor pixels PX1 and PX5 of the plurality of sensor pixels PX included in a pixel array unit 311B according to a second modification example of the third embodiment. FIG. 11B illustrates a cross-sectional configuration example of the two sensor pixels PX1 and PX2 of the plurality of sensor pixels PX included in the pixel array unit 311B. It is to be noted that FIGS. 11A and 11B respectively correspond to FIGS. 9A and 9B in the third embodiment described above.

As illustrated in FIGS. 11A and 11B, the pixel array unit 311B is provided with the four lenses LS arranged, for example, in two rows and two columns for the one sensor pixel PX. Meanwhile, the pixel array unit 311B is provided with only the one inner lens INL for the one sensor pixel PX. It is also possible to expect effects similar to those of the third embodiment described above from the present modification example.

(Modification Example 3-3)

FIG. 12A illustrates a cross-sectional configuration example of the two sensor pixels PX1 and PX5 of the plurality of sensor pixels PX included in a pixel array unit 311C according to the second modification example of the third embodiment. FIG. 12B illustrates a cross-sectional configuration example of the two sensor pixels PX1 and PX2 of the plurality of sensor pixels PX included in the pixel array unit 311C. It is to be noted that FIGS. 12A and 12B respectively correspond to FIGS. 9A and 9B in the third embodiment described above.

As illustrated in FIGS. 12A and 12B, the pixel array unit 311C is provided with the four lenses LS arranged, for example, in two rows and two columns for the one sensor pixel PX. Meanwhile, the pixel array unit 311C is provided with optical waveguides WG (WG1, WG2, and WG5) in place of the inner lenses INL. It is also possible to expect effects similar to those of the third embodiment described above from the present modification example.

6. Fourth Embodiment

[Configuration of Pixel Array Unit 411]

FIG. 13A illustrates a cross-sectional configuration example of the two sensor pixels PX1 and PX5 of the plurality of sensor pixels PX included in a pixel array unit 411 according to a fourth embodiment of the present disclosure. FIG. 13B illustrates a cross-sectional configuration example of the two sensor pixels PX1 and PX2 of the plurality of sensor pixels PX included in the pixel array unit 411. In addition, FIG. 14A illustrates a planar configuration at the height position Lv1 illustrated in FIGS. 13A, 13B, and 14B illustrate a planar configuration at the height position Lv3 illustrated in FIGS. 13A and 13B. It is to be noted that FIGS. 13A and 13B respectively correspond to FIGS. 3A and 3B in the first embodiment described above. In addition, FIGS. 14A and 14B respectively correspond to FIGS. 4A and 4C in the first embodiment described above. More specifically, FIG. 13A illustrates an arrow-direction cross section taken along the XIIIA-XIIIA cutting line that extends in the X axis direction and passes through the sensor pixel PX1 and the sensor pixel PX5 illustrated in each of FIGS. 14A and 14B. In addition, FIG. 13B illustrates an arrow-direction cross section taken along the XIIIB-XIIIB cutting line that extends in the Y axis direction and passes through the sensor pixel PX1 and the sensor pixel PX2 illustrated in each of FIGS. 14A and 14B.

In the first embodiment described above, the one sensor pixel PX is provided with the four lenses LS arranged in two rows and two columns. Such a configuration makes it possible to shift the light condensing point FP by the lens LS from the central position of the effective pixel region 1R1. As a result, the effect is brought about of reducing the PLS. It is not, however, possible to cause the sensor pixel PX adopting the lenses LS divided in that way to function as an image plane phase difference detection pixel (ZAF pixel) as it is. For example, to detect an image plane phase difference in the left/right direction, it is assumed, for example, that a ZAF light shielding film is provided to cover the left half of the photoelectric conversion unit PD. In that case, pieces of incident light passing through the two lenses LS that occupy the left halves of the four lenses LS are all blocked by the ZAF light shielding film. In contrast, pieces of incident light passing through the two lenses LS that occupy the right halves all enter the photoelectric conversion unit PD. It is therefore possible to hardly detect a change in the intensity of the incident light by using the difference in the angle of incidence. As a result, it is not possible to obtain the phase difference information.

Accordingly, the pixel array unit 411 according to the present embodiment is provided with the ZAF light shielding film 16 at the position corresponding to positions at which the plurality of lenses LS is disposed in a direction in which it is desired to detect an image plane phase difference as illustrated in FIGS. 13A, 13B, 14A, and 14B. The ZAF light shielding film 16 is formed by using, for example, a material such as metal that blocks visible light. In the examples of FIGS. 13A, 13B, 14A, and 14B, to obtain image plane phase difference information for the X axis direction (left/right direction) in the sensor pixel PX5, the ZAF light shielding film 16 (16A and 16B) divided in two to selectively cover portions of the effective pixel region 1R5 is provided. The ZAF light shielding film 16A is provided at a position overlapping with the right halves of the lenses LS51 and LS54 and the ZAF light shielding film 16B is provided at a position overlapping with the right halves of lenses LS52 and LS53. The arrangement pitch of the ZAF light shielding films 16 in the X axis direction thus substantially matches the arrangement pitch of the lenses LS.

[Effects of Pixel Array Unit 411]

Even in a case where the pixel array unit 411 according to the present embodiment includes the plurality of divided lenses LS, the ZAF light shielding film 16 is disposed as described above to achieve a ZAF pixel that is able to detect image plane phase difference information. It is to be noted that a configuration of a ZAF pixel in the pixel array unit 411 according to the present embodiment is the same as a configuration of a normal pixel except that the ZAF light shielding film 16 is included, which is superior in manufacturability. In addition, the normal pixel has the same configuration as that of the first embodiment described above and it is possible to obtain the effect of improving the PLS.

<7. Modification Examples of Fourth Embodiment>

As illustrated in FIGS. 13A and 14B, the one sensor pixel PX is provided with the plurality of ZAF light shielding films 16 divided in accordance with the arrangement pitch of the plurality of lenses LS in the fourth embodiment described above, but the present disclosure is not limited to this. The present disclosure also encompasses even other modes described, for example, in the following modification examples 4-1 to 4-5.

(Modification Example 4-1)

FIG. 15A illustrates a cross-sectional configuration example of the two sensor pixels PX1 and PX5 of the plurality of sensor pixels PX included in a pixel array unit 411A according to a first modification example of the fourth embodiment. FIG. 15B illustrates a cross-sectional configuration example of the two sensor pixels PX5 and PX6 of the plurality of sensor pixels PX included in the pixel array unit 411A. It is to be noted that FIGS. 15A and 15B respectively correspond to FIGS. 13A and 13B in the fourth embodiment described above. In addition, FIG. 16A illustrates a planar configuration at the height position Lv1 illustrated in FIGS. 15A, 15B, and 16B illustrate a planar configuration at the height position Lv3 illustrated in FIGS. 15A and 15B. It is to be noted that FIGS. 16A and 16B respectively correspond to FIGS. 14A and 14B in the fourth embodiment described above.

The pixel array unit 411A according to the present modification example is provided with the two lenses LS for the one sensor pixel PX. The two lenses LS are evenly divided in only the Y axis direction instead of being divided in the X axis direction in which it is desired to acquire image plane phase difference information. For example, the sensor pixel PX1 is provided with the two horizontally long lenses LS11 and LS12 adjacent in the Y axis direction. This makes it possible to shift the light condensing points of the respective lenses LS11 and LS12 in the Y axis direction from the central position of the effective pixel region 1R1 and it is possible to reduce the PLS.

The ZAF light shielding film 16 is provided to the sensor pixel PX5 that is a ZAF pixel to cover a half of the region of the effective pixel region 1R5. The two lenses LS51 and LS52 both extend over the whole of the effective pixel region 1R5 in the X axis direction. This makes it possible to obtain image plane phase difference information for the left/right direction.

(Modification Example 4-2)

FIG. 17A illustrates a cross-sectional configuration example of the two sensor pixels PX1 and PX5 of the plurality of sensor pixels PX included in a pixel array unit 411B according to a second modification example of the fourth embodiment. FIG. 17B illustrates a cross-sectional configuration example of the two sensor pixels PX1 and PX2 of the plurality of sensor pixels PX included in the pixel array unit 411B. It is to be noted that FIGS. 17A and 17B respectively correspond to FIGS. 13A and 13B in the fourth embodiment described above. In addition, FIG. 18A illustrates a planar configuration at the height position Lv1 illustrated in FIGS. 17A, 17B, and 18B illustrate a planar configuration at the height position Lv3 illustrated in FIGS. 17A and 17B. It is to be noted that FIGS. 18A and 18B respectively correspond to FIGS. 14A and 14B in the fourth embodiment described above.

The pixel array unit 411B according to the present modification example is not provided with a portion of the element separation unit 12 that extends in the X axis direction, but only a portion extending in the Y axis direction remains. The other components of the pixel array unit 411B are substantially the same as the components of the pixel array unit 411A according to the first modification example of the fourth embodiment described above.

It is also possible to obtain effects similar to those of the pixel array unit 411A according to the first modification example of the fourth embodiment described above from the pixel array unit 411B. Further, it is possible to improve the oblique incidence characteristics for incident light coming at an angle of incidence inclined in the up/down direction.

(Modification Example 4-3)

FIG. 19A illustrates a cross-sectional configuration example of the two sensor pixels PX1 and PX5 of the plurality of sensor pixels PX included in a pixel array unit 411C according to a third modification example of the fourth embodiment. FIG. 19B illustrates a cross-sectional configuration example of the two sensor pixels PX1 and PX2 of the plurality of sensor pixels PX included in the pixel array unit 411C. It is to be noted that FIGS. 19A and 19B respectively correspond to FIGS. 13A and 13B in the fourth embodiment described above. In addition, FIG. 20A illustrates a planar configuration at the height position Lv1 illustrated in FIGS. 19A, 19B, and 20B illustrate a planar configuration at the height position Lv3 illustrated in FIGS. 19A and 19B. It is to be noted that FIGS. 20A and 20B respectively correspond to FIGS. 14A and 14B in the fourth embodiment described above.

The pixel array unit 411C according to the present modification example is provided with the two lenses LS for only the sensor pixel PX5. The two lenses LS are evenly divided in only the X axis direction instead of being divided in the Y axis direction. Specifically, the sensor pixel PX5 is provided with the two vertically long lenses LS51 and LS52 adjacent in the X axis direction as illustrated in FIG. 20A. Further, in the pixel array unit 411C, the ZAF light shielding film 16 is provided to the sensor pixel PX5 that is a ZAF pixel to cover the half of the region of the effective pixel region 1R5 in the Y axis direction in which it is desired to acquire image plane phase difference information. The other components of the pixel array unit 411C are substantially the same as the components of the pixel array unit 411B according to the second modification example of the fourth embodiment described above.

In the pixel array unit 411C, the two lenses LS51 and LS52 both extend over the whole of the effective pixel region 1R5 in the Y axis direction. The ZAF light shielding film 16 covering the half of the region of the effective pixel region 1R5 in the Y axis direction thus offers image plane phase difference information for the up/down direction. In addition, it is also possible to obtain effects similar to those of the pixel array unit 411B according to the second modification example of the fourth embodiment described above from the pixel array unit 411C.

(Modification Example 4-4)

FIG. 21A illustrates a cross-sectional configuration example of the two sensor pixels PX1 and PX5 of the plurality of sensor pixels PX included in a pixel array unit 411D according to a fourth modification example of the fourth embodiment. FIG. 21B illustrates a cross-sectional configuration example of the two sensor pixels PX1 and PX2 of the plurality of sensor pixels PX included in the pixel array unit 411D. It is to be noted that FIGS. 21A and 21B respectively correspond to FIGS. 13A and 13B in the fourth embodiment described above. In addition, FIG. 22A illustrates a planar configuration at the height position Lv1 illustrated in FIGS. 21A, 21B, and 22B illustrate a planar configuration at the height position Lv3 illustrated in FIGS. 21A and 21B. It is to be noted that FIGS. 22A and 22B respectively correspond to FIGS. 14A and 14B in the fourth embodiment described above.

The pixel array unit 411D according to the present modification example is provided with one lens LS5 in the effective pixel region 1R5 in only the sensor pixel PX5 that is a ZAF pixel. The components of the pixel array unit 411D are substantially the same as the components of the pixel array unit 411B according to the second modification example of the fourth embodiment described above except for that point.

It is also possible to obtain effects similar to those of the pixel array unit 411B according to the second modification example of the fourth embodiment described above from the pixel array unit 411D. The sensor pixel PX5 serving as a ZAF pixel is not, however, provided with the plurality of lenses LS. It is not thus possible to expect the effect of reducing the PLS.

(Modification Example 4-5)

FIG. 23A illustrates a cross-sectional configuration example of the two sensor pixels PX1 and PX5 of the plurality of sensor pixels PX included in a pixel array unit 411E according to a fifth modification example of the fourth embodiment. FIG. 23B illustrates a cross-sectional configuration example of the two sensor pixels PX1 and PX2 of the plurality of sensor pixels PX included in the pixel array unit 411E. It is to be noted that FIGS. 23A and 23B respectively correspond to FIGS. 13A and 13B in the fourth embodiment described above. In addition, FIG. 24A illustrates a planar configuration at the height position Lv1 illustrated in FIGS. 23A, 23B, and 24B illustrate a planar configuration at the height position Lv3 illustrated in FIGS. 23A and 23B. It is to be noted that FIGS. 24A and 24B respectively correspond to FIGS. 14A and 14B in the fourth embodiment described above.

The pixel array unit 411E according to the present modification example is provided with one lens LS5 in the effective pixel region 1R5 in only the sensor pixel PX5 that is a ZAF pixel. The components of the pixel array unit 411E are substantially the same as the components of the pixel array unit 411C according to the third modification example of the fourth embodiment described above except for that point.

It is also possible to obtain effects similar to those of the pixel array unit 411C according to the third modification example of the fourth embodiment described above from the pixel array unit 411E. The sensor pixel PX5 serving as a ZAF pixel is not, however, provided with the plurality of lenses LS. It is not thus possible to expect the effect of reducing the PLS.

8. Fifth Embodiment

[Configuration of Pixel Array Unit 511]

FIG. 25 illustrates a circuit configuration example of the two adjacent sensor pixels PX1 and PX2 of the plurality of sensor pixels PX included in a pixel array unit 511 according to a fifth embodiment of the present disclosure. In addition, FIGS. 26A, 26B, 26C, 26D, 26E, 26F, and 26G illustrate planar configuration examples of the sensor pixels PX1 and PX2 and respectively correspond to the height positions Lv1 and Lv3 to Lv8 illustrated in FIGS. 3A and 3B.

In the pixel array unit 511, the photoelectric conversion unit PD in each of the sensor pixels PX is divided in two. In other words, the sensor pixel PX1 includes the two of a sub-pixel PX1A and a sub-pixel PX1B. The sub-pixel PX1A and the sub-pixel PX1B respectively include a photoelectric conversion unit PD1A and a photoelectric conversion unit PD1B. Here, as illustrated in FIGS. 26B, 26C, and 26D, the photoelectric conversion unit PD1A and the photoelectric conversion unit PD1B are disposed side by side in the X axis direction (left/right direction). In addition, as illustrated in FIG. 26A, the two horizontally long lenses LS11 and 12 evenly divided in the Y axis direction are arranged in the sensor pixel PX1. The sensor pixel PX2 also has a similar configuration. In other words, the sensor pixel PX2 includes the two of a sub-pixel PX2A and a sub-pixel PX2B. The sub-pixel PX2A and the sub-pixel PX2B respectively include a photoelectric conversion unit PD2A and a photoelectric conversion unit PD2B. In addition, as illustrated in FIG. 26A, the two horizontally long lenses LS21 and 22 evenly divided in the Y axis direction are arranged in the sensor pixel PX2.

Each of the sub-pixels PX1A, PX1B, PX2A, and PX2B has substantially the same circuit configuration as that of the sensor pixel PX1 described in the first embodiment described above. However, the power supply VDD, the electric charge voltage conversion unit FD, the reset transistor RST, the amplification transistor AMP, the selection transistor SEL, the vertical signal line VSL, and the like are each shared between the sub-pixels PX1A, PX1B, PX2A, and PX2B.

In the pixel array unit 511 according to the present embodiment, the photoelectric conversion unit PD is divided in two in the one sensor pixel PX and it is possible to obtain independent signals from the respective photoelectric conversion units PD. This makes it possible to obtain the image plane phase difference information. In addition, the one sensor pixel PX is provided with the plurality of lenses LS. This makes it possible to expect a reduction in the PLS as in the first embodiment described above.

<9. Example of Application to Electronic Apparatus>

FIG. 27 is a block diagram illustrating a configuration example of a camera 2000 serving as an electronic apparatus to which the present technology is applied.

The camera 2000 includes an optical unit 2001 including a lens group and the like, an imaging device (imaging device) 2002 to which the solid-state imaging device 101 or the like (referred to as solid-state imaging device 101 or the like below) described above is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to each other through a bus line 2009.

The optical unit 2001 takes in incident light (image light) from a subject to form an image on an imaging surface of the imaging device 2002. The imaging device 2002 converts the amount of incident light formed as an image on the imaging surface by the optical unit 2001 into an electric signal on a pixel unit basis and outputs the converted electric signal as a pixel signal.

The display unit 2005 includes, for example, a panel display such as a liquid crystal panel or an organic EL panel and displays a moving image or a still image captured by the imaging device 2002. The recording unit 2006 records a moving image or a still image captured by the imaging device 2002 in a recording medium such as a hard disk or a semiconductor memory.

The operation unit 2007 issues an operation instruction about a variety of functions of the camera 2000 under an operation of a user. The power supply unit 2008 appropriately supplies the DSP circuit 2003, the frame memory 2004, the display unit 2005, the recording unit 2006, and the operation unit 2007 with various kinds of power for operations of these supply targets.

As described above, the use of the solid-state imaging device 101 or the like described above as the imaging device 2002 makes it possible to expect the acquirement of a favorable image.

<10. Example of Practical Application to Mobile Body>

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 28 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. Specifically, for example, the solid-state imaging device 101 illustrated in FIG. 1A or the like is applicable to the imaging section 12031. It is possible to expect an excellent operation of the vehicle control system by applying the technology according to the present disclosure to the imaging section 12031.

<11. Other Modification Examples>

Although the present disclosure has been described above with reference to several embodiments and modification examples, the present disclosure is not limited to the embodiments and the like described above. It is possible to make a variety of modifications. For example, the present disclosure is not limited to the back-illuminated image sensor, but is applicable to even a front-illuminated image sensor.

In addition, the imaging device according to the present disclosure is not limited to an imaging device that detects the light amount distribution of visible light and acquires it as an image, but may be an imaging device that acquires the amount distribution of incident infrared rays, X-rays, particles, or the like as an image.

In addition, the imaging device according to the present disclosure may also be in the form of a module in which an imaging unit and a signal processing unit or an optical system are packaged together.

In addition, in the embodiments and the like described above, the back-illuminated image sensor of the memory holding global shutter mode has been described, but the present disclosure is not limited to this. For example, a back-illuminated image sensor of an FD holding global shutter mode may also be adopted that holds electric charge in the electric charge voltage conversion unit instead of the electric charge holding unit.

Further, the solid-state imaging device according to the technology of the present disclosure may have a configuration, for example, like those of the solid-state imaging device 101A illustrated in FIG. 30A and the solid-state imaging device 101B illustrated in FIG. 30B. FIG. 30A is a block diagram illustrating a configuration example of a solid-state imaging device 101A according to a first modification example of the present disclosure. FIG. 30B is a block diagram illustrating a configuration example of a solid-state imaging device 101B according to a second modification example of the present disclosure In the solid-state imaging device 101A illustrated in FIG. 30A, the data storage unit 119 is provided between the column signal processing unit 113 and the horizontal drive unit 114 and a pixel signal outputted from the column signal processing unit 113 is supplied to the signal processing unit 118 through the data storage unit 119.

In addition, the solid-state imaging device 101B in FIG. 30B is provided with the data storage unit 119 and the signal processing unit 118 in parallel between the column signal processing unit 113 and the horizontal drive unit 114. In the solid-state imaging device 101B, the column signal processing unit 113 performs A/D conversion for each of the columns of the pixel array unit 111 or for a plurality of columns of the pixel array unit 111. The A/D conversion converts an analog pixel signal into a digital pixel signal.

In addition, the case has been described in the embodiments or the like described above where the sensor pixels PX1 to PX8 are uniformly disposed repeatedly over the whole of the pixel array unit 111, but the present disclosure is not limited to this. For example, as illustrated in FIG. 31, it is possible to set any arrangement pattern for the lenses LS in accordance with positions in the pixel array unit 111 such as disposing the plurality of lenses LS for the one sensor pixel PX, for example, in a middle region CR of the pixel array unit 111 and disposing the one lens LS for the one sensor pixel PX in a peripheral region PR. It is to be noted that the sensitivity to oblique incident light is more likely to decrease in the peripheral region PR than in the middle region CR. To increase the oblique incidence characteristics, it is thus advantageous to dispose the one lens LS for the one sensor pixel PX in the peripheral region PR as illustrated in FIG. 31. However, FIG. 31 merely illustrates an example of the arrangement pattern of the lenses LS. The present disclosure is not limited to this. For example, the lenses LS may have dimensions that gradually or continuously increase from the outer edge of the middle region CR to the outer edge of the peripheral region PR.

In addition, in the present disclosure, it is also possible to randomly combine the variety of modes described in the respective embodiments and some of the modification examples in some cases. For example, it is also possible to achieve a pixel array unit 611 illustrated in FIGS. 32A and 32B that is a combination of the configuration of the pixel array unit 411B according to the second modification example of the fourth embodiment and the configuration the pixel array unit 411C according to the third modification example of the fourth embodiment. In the pixel array unit 611, the sensor pixel PX5 is a ZAF pixel for obtaining image plane phase difference information for the left/right direction and the sensor pixel PX7 is a ZAF pixel for obtaining image plane phase difference information for the up/down direction. The sensor pixel PX5 includes the lens LS51 and the lens LS52 that are divided in the effective pixel region 1R5 in the up/down direction. The sensor pixel PX7 includes the lens LS71 and the lens LS72 that are divided in the effective pixel region 1R7 in the left/right direction.

In the imaging device and the electronic apparatus according to an embodiment of the present disclosure, the condensing optical system condenses the incident light at a position in the effective pixel region. The position overlaps with the first light shielding film in the thickness direction. This makes it possible to improve the PLS characteristics and achieve a further increase in the imaging performance.

In addition, the Si {111} substrate according to the present disclosure refers to a substrate or a wafer including a silicon single crystal and having a crystal plane represented by {111} in the Miller index notation. The Si {111} substrate according to the present disclosure also includes a substrate or a wafer having a crystal orientation shifted by several degrees. For example, the crystal orientation is shifted by several degrees from the {111} plane in the nearest [110] direction. Further, the Si {111} substrate also includes a silicon single crystal grown on a portion or the whole of a surface of this substrate or this wafer in an epitaxial method or the like.

In addition, in the notation of the present disclosure, the {111} plane is a generic term of the (111) plane, the (–111) plane, the (1–11) plane, the (11–1) plane, the (–1–11) plane, the (–11–1) plane, the (1–1–1) plane, and the (–1–1–1) plane, which are crystal planes equivalent to each other in terms of symmetry. Accordingly, the description of the Si {111} substrate in the specification or the like of the present disclosure may also be read, for example, as an Si(1–11) substrate. Here, a bar sign of the Miller index for expressing an index in the negative direction is substituted with a minus sign.

In addition, the <110> direction in the description of the present invention is a generic term of the [110] direction, the [101] direction, the [011] direction, the [–110] direction, the [1–10] direction, the [–101] direction, the [10–1] direction, the [0–11] direction, the [01–1] direction, the [–1–10] direction, the [–10–1] direction, and the [0–1–1] direction, which are crystal plane directions equivalent to each other in terms of symmetry. The <110> direction may also be read as any of the above. In the present disclosure, however, etching is performed in the direction orthogonal to an element formation surface and the direction further orthogonal to this direction orthogonal to the element formation surface (i.e., the direction parallel with the element formation surface).

Table 1 exhibits specific combinations of planes and orientations in which etching in the <110> direction is established in the {111} plane that is the crystal plane of the Si {111} substrate in the present invention.

TABLE 1

| etching orientation | element formation surface | | | | | | | |
|---|---|---|---|---|---|---|---|---|
| | (111) | (-111) | (1-11) | (11-1) | (-1-11) | (-11-1) | (1-1-1) | (-1-1-1) |
| [110] | | ○ | ○ | | | ○ | ○ | |
| [101] | | ○ | | ○ | ○ | | ○ | |
| [011] | | | ○ | ○ | ○ | ○ | | |
| [-110] | ○ | | | ○ | ○ | | | ○ |
| [1-10] | ○ | | | ○ | ○ | | | ○ |
| [-101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [-1-10] | | ○ | ○ | | | ○ | ○ | |
| [-10-1] | | ○ | | ○ | ○ | | ○ | |
| [0-1-1] | | | ○ | ○ | ○ | ○ | | |

As illustrated in Table 1, there are 96 (=8×12) combinations of the {111} planes and the <110> directions. However, the <110> direction according to the present disclosure is limited to the direction orthogonal to the {111} plane that is an element formation surface and the direction parallel with the element formation surface. In other words, a combination of the element formation surfaces of the Si {111} substrate according to the present disclosure and the orientations in which the etching is performed on the Si {111} substrate is selected from any of the combinations indicated by ○ in Table 1.

In addition, in the first embodiment described above, the case has been exemplified where the Si {111} substrate is used to cause the etching to progress in the X axis direction, but the etching does not progress in the Y axis direction or the Z axis direction. The present disclosure is not, however, limited to this. It is sufficient if the etching progress orientation includes both the X axis direction and the Y axis direction or any one of the X axis direction or the Y axis direction. In addition, the Si {111} substrate also includes a substrate whose front surface is processed to have an off angle in the <112> direction, for example, as illustrated in FIG. 33. In a case where the off angle is 19.47° or less, even a substrate having an off angle maintains a relationship in which the etching rate in the <110> direction or the direction with one Si backbond is sufficiently higher than the etching rate in the <111> direction or the direction with three Si backbonds. A larger off angle causes the number of steps to increase. This increases the density of micro step differences. It is thus preferable that the off angle be 5° or less. It is to be noted that the case where the substrate front surface has an off angle in the <112> direction has been described in the example of FIG. 33, but the substrate front surface may have an off angle in the <110> direction. It does not matter which direction the off angle is in. In addition, the Si plane orientation is analyzable by using an X-ray diffraction method, an electron beam diffraction method, an electron beam backscatter diffraction method, or the like. The number of Si backbonds is determined by the Si crystal structure and the number of backbonds is thus also analyzable by analyzing the Si plane orientation.

It is to be noted that the effects described in this specification are merely illustrative, but not limited to the description. There may be other effects. In addition, the present technology may have configurations as follows.

(1)

An imaging device including, in an effective pixel region extending along a first surface:

a condensing optical system that condenses incident light;

a photoelectric conversion unit configured to generate electric charge through photoelectric conversion, the electric charge corresponding to an amount of the incident light passing through the condensing optical system;

an electric charge holding unit configured to hold the electric charge transferred from the photoelectric conversion unit; and a first light shielding film that is provided between the photoelectric conversion unit and the electric charge holding unit in a thickness direction orthogonal to the first surface, the first light shielding film blocking the incident light, in which the condensing optical system condenses the incident light at a position in the effective pixel region, the position overlapping with the first light shielding film in the thickness direction.

(2)

The imaging device according to (1), in which the condensing optical system condenses light at a position in the effective pixel region other than a central position.

(3)

The imaging device according to (1) or (2), in which the first light shielding film includes a first opening at a position in the effective pixel region other than a central position.

(4)

The imaging device according to (3), further including a second light shielding film that is provided to overlap with the first light shielding film in the thickness direction, the second light shielding film including a second opening at a position different from the position of the first opening in the effective pixel region and preventing the incident light from entering the electric charge holding unit.

(5)

The imaging device according to any one of (1) to (4), in which the condensing optical system includes a first optical system and a second optical system that are arranged along the first surface, the first optical system condenses the incident light toward a first light condensing point in the effective pixel region, and the second optical system condenses the incident light toward a second light condensing point in the effective pixel region.

(6)

The imaging device according to (5), in which the first optical system includes a first lens, and the second optical system includes a second lens smaller than the first lens.

37

(7)

The imaging device according to any one of (1) to (6), in which the condensing optical system includes first to fourth optical systems that are arranged in a matrix along the first surface, and the first to fourth optical systems respectively condense the pieces of incident light toward first to fourth light condensing points in the effective pixel region.

(8)

The imaging device according to any one of (1) to (7), in which the condensing optical system includes a first lens layer and a second lens layer that are stacked in the thickness direction.

(9)

The imaging device according to any one of (1) to (8), in which the photoelectric conversion unit includes a first photoelectric conversion element and a second first photoelectric conversion element that are arranged in a first direction along the first surface, the condensing optical system includes a first optical system and a second optical system that are arranged in a second direction orthogonal to the first direction and along the first surface, the first optical system condenses the incident light toward a first light condensing point in the effective pixel region, and the second optical system condenses the incident light toward a second light condensing point in the effective pixel region.

(10)

An imaging device including:

a first pixel; and a second pixel, in which the first pixel includes, in an effective pixel region extending along a first surface, a condensing optical system that condenses incident light, a photoelectric conversion unit configured to generate electric charge through photoelectric conversion, the electric charge corresponding to an amount of the incident light passing through the condensing optical system, an electric charge holding unit configured to hold the electric charge transferred from the photoelectric conversion unit, and a first light shielding film that is provided between the photoelectric conversion unit and the electric charge holding unit in a thickness direction orthogonal to the first surface, the first light shielding film blocking the incident light, the condensing optical system condensing the incident light at a position in the effective pixel region, the position overlapping with the first light shielding film in the thickness direction, and the second pixel includes an image plane phase difference detection pixel.

(11)

The imaging device according to (10), further including a third pixel, in which the second pixel includes a first image plane phase difference detection pixel including a first lens and a second lens divided in a first direction in the effective pixel region, and the third pixel includes a second image plane phase difference detection pixel including a third lens and a fourth lens divided in a second direction in the effective pixel region, the second direction being orthogonal to the first direction.

(12)

The imaging device according to (10) or (11), in which the first pixel includes a global shutter pixel.

(13)

An electronic apparatus including an imaging device, in which the imaging device includes, in an effective pixel region extending along a first surface, a condensing optical system that condenses incident light, a photoelectric conversion unit configured to generate electric charge through photoelectric conversion, the electric charge corresponding to an amount of the incident light passing through the condensing optical system, an electric charge holding unit configured to hold the electric charge transferred from the photoelectric conversion unit, and a light shielding film that is provided between the photoelectric conversion unit and the electric charge holding unit in a thickness direction orthogonal to the first surface, the light shielding film blocking the incident light, the condensing optical system condensing the incident light at a position in the effective pixel region, the position overlapping with the light shielding film in the thickness direction.

The present application claims the priority on the basis of Japanese Patent Application No. 2019-225188 filed on Dec. 13, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:

in an effective pixel region of the imaging device:

a condensing optical system configured to condense incident light at a plurality of light condensing points in the effective pixel region;

a photoelectric conversion unit configured to generate an electric charge through photoelectric conversion, wherein the electric charge corresponds to an amount of the incident light that passes through the condensing optical system;

an electric charge holding unit configured to hold the electric charge transferred from the photoelectric conversion unit;

a first light shielding film between the photoelectric conversion unit and the electric charge holding unit in a first direction, wherein the first light shielding film includes an opening, the first light shielding film is configured to block the incident light, the plurality of light condensing points overlaps with the first light shielding film in the first direction, and a position of each of the plurality of light condensing points is different from a position of the opening of the first light shielding film;

a second light shielding film that overlaps with the first light shielding film in the first direction; and a light shielding wall that extends in the first direction, wherein the light shielding wall is adjacent to the electric charge holding unit in a second direction orthogonal to the first direction, and the first light shielding film is between the light shielding wall and the second light shielding film in the first direction.

2. The imaging device according to claim 1, wherein the position of the each of the plurality of light condensing points is different from a central position of the effective pixel region.

3. The imaging device according to claim 1, wherein the position of the opening of the first light shielding film in the effective pixel region is different from a central position of the effective pixel region.

4. The imaging device according to claim 3, wherein the second light shielding film includes an opening, a position of the opening of the second light shielding film is different from the position of the opening of the first light shielding film in the effective pixel region, and the second light shielding film is configured to block the incident light to enter the electric charge holding unit.

5. The imaging device according to claim 1, wherein the condensing optical system includes a first optical system and a second optical system, the first optical system is configured to condense the incident light at a first light condensing point of the plurality of light condensing points in the effective pixel region, and the second optical system is configured to condense the incident light at a second light condensing point of the plurality of light condensing points in the effective pixel region.

6. The imaging device according to claim 5, wherein the first optical system includes a first lens, and the second optical system includes a second lens that is smaller than the first lens.

7. The imaging device according to claim 1, wherein the condensing optical system includes four optical systems in a matrix, each of the four optical systems is configured to condense respective pieces of the incident light at a corresponding light condensing point of the plurality of light condensing points in the effective pixel region, and the respective pieces of the incident light.

8. The imaging device according to claim 1, wherein the condensing optical system includes a first lens layer and a second lens layer that are stacked in the first direction.

9. The imaging device according to claim 1, wherein the photoelectric conversion unit includes a first photoelectric conversion element and a second photoelectric conversion element that are arranged in the second direction, and the condensing optical system includes a first optical system and a second optical system that are arranged in a third direction orthogonal to the second direction.

10. The imaging device according to claim 1, further comprising a trench gate that extends in the first direction and is in contact with the photoelectric conversion unit, wherein the light shielding wall is between the trench gate and the electric charge holding unit in the second direction.

11. An imaging device, comprising:

a first pixel; and a second pixel, wherein the first pixel includes:

in an effective pixel region of the imaging device:

a condensing optical system configured to condense incident light at a plurality of light condensing points in the effective pixel region, a photoelectric conversion unit configured to generate an electric charge through photoelectric conversion, wherein the electric charge corresponds to an amount of the incident light that passes through the condensing optical system, an electric charge holding unit configured to hold the electric charge transferred from the photoelectric conversion unit, a first light shielding film between the photoelectric conversion unit and the electric charge holding unit in a first direction, wherein the first light shielding film includes an opening, the first light shielding film is configured to block the incident light, the plurality of light condensing points overlaps with the first light shielding film in the first direction, a position of each of the plurality of light condensing points is different from a position of the opening of the first light shielding film, and the second pixel includes a first image plane phase difference detection pixel, a second light shielding film that overlaps with the first light shielding film in the first direction, and a light shielding wall that extends in the first direction, wherein the light shielding wall is adjacent to the electric charge holding unit in a second direction orthogonal to the first direction, and the first light shielding film is between the light shielding wall and the second light shielding film in the first direction.

12. The imaging device according to claim 11, further comprising a third pixel, wherein the first image plane phase difference detection pixel includes a first lens and a second lens divided in the second first direction in the effective pixel region, the third pixel includes a second image plane phase difference detection pixel, the second image plane phase difference detection pixel includes a third lens and a fourth lens divided in a third direction in the effective pixel region, and the third direction is orthogonal to the second direction.

13. The imaging device according to claim 11, wherein the first pixel includes a global shutter pixel.

14. An electronic apparatus, comprising:

an imaging device that includes:

in an effective pixel region of the imaging device:

a condensing optical system configured to condense incident light at a plurality of light condensing points in the effective pixel region, a photoelectric conversion unit configured to generate an electric charge through photoelectric conversion, wherein the electric charge corresponds to an amount of the incident light that passes through the condensing optical system, an electric charge holding unit configured to hold the electric charge transferred from the photoelectric conversion unit, a first light shielding film between the photoelectric conversion unit and the electric charge holding unit in a first direction, wherein the first light shielding film includes an opening, the first light shielding film is configured to block the incident light, the plurality of light condensing points overlaps with the first light shielding film in the first direction, and a position of each of the plurality of light condensing points is different from a position the opening of the first light shielding film, a second light shielding film that overlaps with the first light shielding film in the first direction, and a light shielding wall that extends in the first direction, wherein the light shielding wall is adjacent to the electric charge holding unit in a second direction orthogonal to the first direction, and the first light shielding film is between the light shielding wall and the second light shielding film in the first direction.

* * * * *